(12) United States Patent
Yamazaki

(10) Patent No.: US 8,974,918 B2
(45) Date of Patent: Mar. 10, 2015

(54) DISPLAY DEVICE AND ELECTRONIC DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1184 days.

(21) Appl. No.: 11/812,843

(22) Filed: Jun. 22, 2007

(65) Prior Publication Data
US 2008/0008905 A1    Jan. 10, 2008

(30) Foreign Application Priority Data

Jul. 4, 2006  (JP) ................................. 2006-184495

(51) Int. Cl.
| | | |
|---|---|---|
| *B32B 9/04* | (2006.01) | |
| *G02F 1/1343* | (2006.01) | |
| *H01L 27/12* | (2006.01) | |

(Continued)

(52) U.S. Cl.
CPC ............ *G02F 1/13439* (2013.01); *H01L 27/12* (2013.01); *H01L 27/1214* (2013.01); *H01L 51/5206* (2013.01); *H01L 51/5221* (2013.01); *H01L 27/3248* (2013.01);

(Continued)

(58) Field of Classification Search
USPC .......................................................... 428/690
See application file for complete search history.

(56) References Cited

U.S. PATENT DOCUMENTS

| 5,953,084 A | 9/1999 | Shimada et al. |
| 5,989,737 A | 11/1999 | Xie et al. |

(Continued)

FOREIGN PATENT DOCUMENTS

| CN | 1172962 | 2/1998 |
| CN | 1277626 | 12/2000 |

(Continued)

OTHER PUBLICATIONS

Machine English translation of JP 2006-128099 A. Mar. 18, 2010.*

(Continued)

*Primary Examiner* — J. L. Yang
(74) *Attorney, Agent, or Firm* — Eric J. Robinson; Robinson Intellectual Property Law Office, P.C.

(57) ABSTRACT

It is an object of the present invention to provide a display device without using an oxide light-transmitting conductive film which is necessary in a conventional method. In addition, it is another object of the present invention to provide an electronic device having a display device using a new electrode material. It is a summary of the present invention to form an electrode of a pixel or a pixel portion with a light-transmitting conductive film containing a hole-transporting organic compound and a metal oxide which shows an electron accepting property with respect to the hole-transporting organic compound. The hole-transporting organic compound and the metal oxide which shows an electron accepting property with respect to the hole-transporting organic compound are composed to have resistivity of less than or equal to $1 \times 10^6$ $\Omega \cdot cm$, thereby being able to serve as an electrode of a pixel. It is not necessary to form a transparent electrode using a particular premium grade material; therefore, the manufacture cost of an electronic device typified by a flat panel display can be reduced.

29 Claims, 44 Drawing Sheets

(51) Int. Cl.
*H01L 51/52* (2006.01)
*H01L 27/32* (2006.01)
*H01L 51/50* (2006.01)

(52) U.S. Cl.
CPC ........ *H01L 51/5052* (2013.01); *H01L 51/5228* (2013.01); *Y10S 428/917* (2013.01)
USPC ......... 428/690; 428/917; 428/411.1; 428/336

(56) References Cited

U.S. PATENT DOCUMENTS

| | | | |
|---|---|---|---|
| 6,052,162 A | 4/2000 | Shimada et al. | |
| 6,097,452 A | 8/2000 | Shimada et al. | |
| 6,195,138 B1 | 2/2001 | Shimada et al. | |
| 6,423,429 B2 | 7/2002 | Kido et al. | |
| 6,433,851 B2 | 8/2002 | Shimada et al. | |
| 6,486,601 B1 | 11/2002 | Sakai et al. | |
| 6,541,129 B1 | 4/2003 | Kawamura et al. | |
| 6,589,673 B1 | 7/2003 | Kido et al. | |
| 7,399,537 B2 | 7/2008 | Kawamura et al. | |
| 7,566,971 B2 | 7/2009 | Matsuzaki | |
| 7,683,532 B2 | 3/2010 | Abe et al. | |
| 7,710,018 B2 | 5/2010 | Uhlig et al. | |
| 7,919,861 B2 | 4/2011 | Matsuzaki | |
| 8,174,178 B2 | 5/2012 | Abe et al. | |
| 2002/0057050 A1* | 5/2002 | Shi | 313/504 |
| 2003/0143430 A1 | 7/2003 | Kawamura et al. | |
| 2003/0169242 A1* | 9/2003 | Nakanishi | 345/204 |
| 2003/0189401 A1 | 10/2003 | Kido et al. | |
| 2004/0113547 A1* | 6/2004 | Son et al. | 313/504 |
| 2005/0084712 A1 | 4/2005 | Kido et al. | |
| 2005/0084713 A1 | 4/2005 | Kido et al. | |
| 2005/0098207 A1 | 5/2005 | Matsumoto et al. | |
| 2005/0106419 A1* | 5/2005 | Endoh et al. | 428/690 |
| 2005/0170208 A1 | 8/2005 | Yatsunami et al. | |
| 2005/0191776 A1* | 9/2005 | Lamansky et al. | 438/22 |
| 2005/0248267 A1 | 11/2005 | Gyoutoku et al. | |
| 2006/0102910 A1 | 5/2006 | Yamazaki et al. | |
| 2006/0267202 A1* | 11/2006 | Matsuzaki | 257/758 |
| 2007/0170434 A1 | 7/2007 | Inoue et al. | |
| 2007/0182317 A1 | 8/2007 | Kido et al. | |
| 2008/0241591 A1 | 10/2008 | Kawamura et al. | |
| 2011/0014730 A1 | 1/2011 | Yamazaki et al. | |
| 2012/0273776 A1 | 11/2012 | Abe et al. | |

FOREIGN PATENT DOCUMENTS

| | | | |
|---|---|---|---|
| CN | 2421793 | | 2/2001 |
| CN | 1391424 | | 1/2003 |
| CN | 001870261 | | 11/2006 |
| EP | 0762184 | | 3/1997 |
| EP | 1029909 | | 8/2000 |
| EP | 1321797 | | 6/2003 |
| EP | 1351558 | A | 10/2003 |
| EP | 1524706 | A | 4/2005 |
| EP | 1724790 | | 11/2006 |
| EP | 2090926 | | 8/2009 |
| EP | 2149815 | | 2/2010 |
| JP | 03-274695 | | 12/1991 |
| JP | 09-063771 | | 3/1997 |
| JP | 11-307259 | | 11/1999 |
| JP | 11-307264 | | 11/1999 |
| JP | 2000-315580 | | 11/2000 |
| JP | 2003-059343 | | 2/2003 |
| JP | 2003-272860 | A | 9/2003 |
| JP | 2003-332070 | A | 11/2003 |
| JP | 2005-026121 | | 1/2005 |
| JP | 2005-032618 | | 2/2005 |
| JP | 2005-123095 | A | 5/2005 |
| JP | 2005-197027 | A | 7/2005 |
| JP | 2006-093123 | A | 4/2006 |
| JP | 2006128099 | A * | 5/2006 |
| JP | 2006-154793 | A | 6/2006 |
| JP | 2006-156961 | A | 6/2006 |
| JP | 2006-160535 | A | 6/2006 |
| WO | WO-2005/086180 | | 9/2005 |

OTHER PUBLICATIONS

Chinese Office Action (Application No. 200710127140.5) dated Jun. 9, 2010.

Chinese Office Action (Application No. 201210145477.X) Dated Feb. 8, 2014.

* cited by examiner

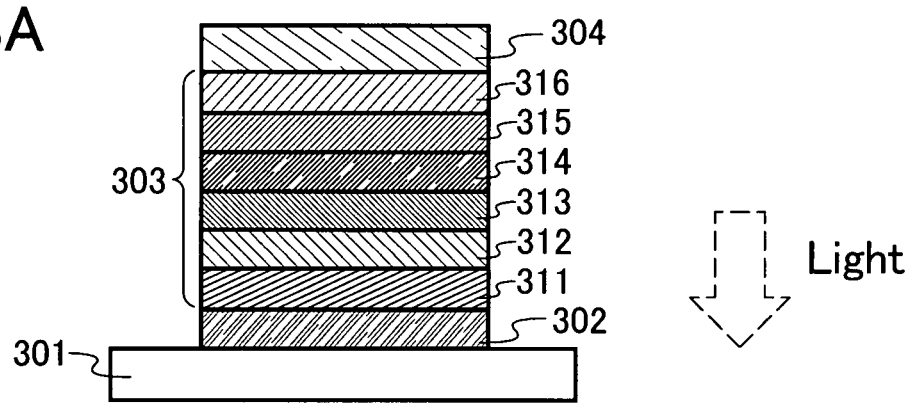
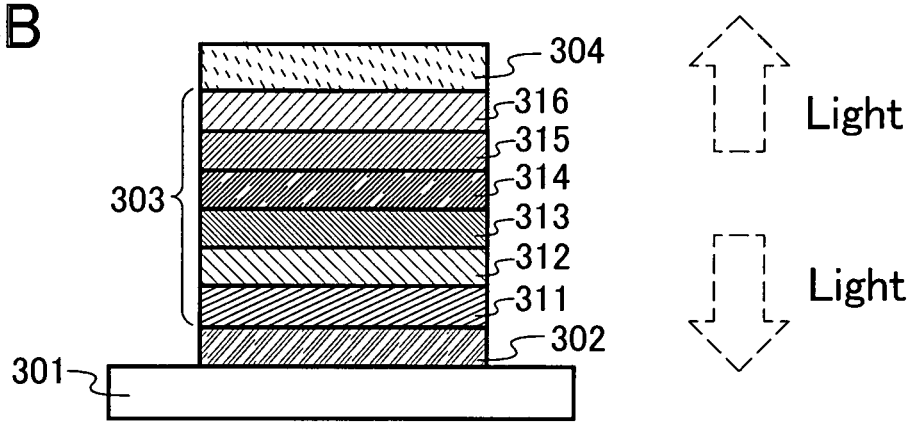

DISPLAY DEVICE AND ELECTRONIC DEVICE

BACKGROUND OF THE INVENTION

1. Field of the Invention

The present invention relates to a structure of a pixel portion in a display device.

2. Description of the Related Art

In recent years, a display device which is thin and lightweight as compared to conventional cathode-ray tube display devices, a so-called flat panel display, has been developed. As a typical example of the flat panel display, a liquid crystal display device is known. In addition, as a new flat panel display, a display device with the utilization of an electroluminescence element (EL element) has been developed.

In a liquid crystal display device, liquid crystals are sealed between two sheets of transparent substrates, orientation of liquid crystal molecules is controlled by application of voltage to change light transmittance, and a predetermined image or the like is optically displayed. Since liquid crystals do not emit light by itself, a backlight unit serving as a light source is provided on the back of a liquid crystal display panel in a liquid crystal display device.

In addition, an EL element has a structure in which an electroluminescence material is sandwiched between a pair of electrodes. The EL element emits light by application of voltage between the pair of electrodes. A pixel is formed with this EL element, whereby a display device can be formed.

In either case, an electrode is necessary in order to form a pixel of a flat panel display. A pixel electrode needs to transmit light; therefore, a light-transmitting conductive film is used. Indium tin oxide (ITO) is known as a typical light-transmitting conductive film.

Indium, which is to be a main material of the light-transmitting conductive film, is a by-product generated in a slight amount in a process of refining zinc, and the production amount is slight worldwide. Therefore, as the production amount of the flat panel display increases, the scarcity value increases; thus, the cost rises. High cost of indium not only constitutes a factor of the high production cost but also limits the production amount of the flat panel display if the demand of the market cannot be filled. Specifically, the supply shortage of indium constitutes a factor in disturbing industry development. Therefore, a light-transmitting conductive film using hafnium is known as a substitution, for example (see Patent Document 1: Japanese Published Patent Application No. 2003-59343). However, hafnium, which is a rare metal, has a few reserves; thus, instability of the supply is undeniable.

SUMMARY OF THE INVENTION

It is an object of the present invention to provide a display device without using an oxide light-transmitting conductive film which is necessary in a conventional method in order to solve such a social destabilizing factor. In addition, it is another object of the present invention to provide an electronic device having a display device using a new electrode material.

It is a summary of the present invention to form an electrode of a pixel or a pixel portion with a light-transmitting conductive film containing a hole-transporting organic compound and a metal oxide which shows an electron accepting property with respect to the hole-transporting organic compound. The hole-transporting organic compound and the metal oxide which shows an electron accepting property with respect to the hole-transporting organic compound are composed to have resistivity of less than or equal to $1 \times 10^6$ Ω·cm, thereby being able to serve as an electrode of a pixel.

In accordance with the present invention, it is not necessary to form a transparent electrode using a particular premium grade material; therefore, the manufacture cost of an electronic device typified by a flat panel display can be reduced. In addition, since a light-transmitting film containing a hole-transporting organic compound and a metal oxide which shows an electron accepting property with respect to the hole-transporting organic compound is chemically stable, improvement in quality of the electronic device can be achieved.

BRIEF DESCRIPTION OF DRAWINGS

In the accompanying drawings:

FIGS. 8A and 8B each illustrate a light-emitting element included in a display device of the present invention;

DETAILED DESCRIPTION OF THE INVENTION

Figure 1:
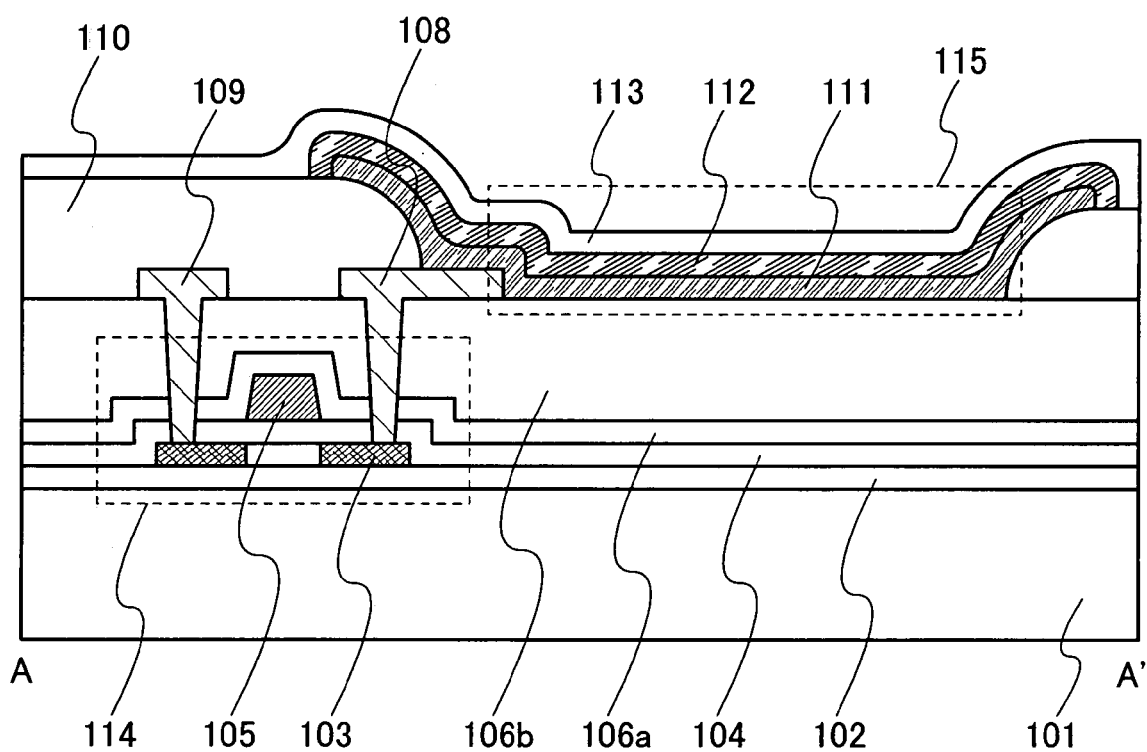
FIG. 1 illustrates a display device of the present invention.

Embodiment modes of the present invention will be explained hereinafter with reference to the accompanying drawings. However, the present invention is not limited to the following explanation, and it is to be easily understood that various changes and modifications in modes and details thereof will be apparent to those skilled in the art without departing from the purpose and the scope of the present invention. Therefore, the present invention should not be interpreted as being limited to the description of the embodiment modes below.

Embodiment Mode 1

In this embodiment mode, a composite material used for a display device of the present invention will be explained. Note that, in this specification, being composite refers not only to a state in which two materials are simply mixed but also a state in which two materials are mixed and charges are transferred between the materials.

The composite material used in the present invention is a composite material of an organic compound and an inorganic compound. As the organic compound used for the composite material, various compounds such as an aromatic amine compound, a carbazole derivative, aromatic hydrocarbon, and a high molecular compound (oligomer, dendrimer, polymer, or the like) can be used. The organic compound used for the composite material is preferably an organic compound having a high hole transporting property. Specifically, a substance having hole mobility of greater than or equal to $1 \times 10^{-6}$ cm$^2$/Vs is preferably used. However, other substances than those may also be used as long as the hole transporting properties thereof are higher than the electron transporting properties thereof. The organic compounds that can be used for the composite material are specifically shown below.

For example, the following can be given as the aromatic amine compound: 4,4'-bis[N-(1-naphthyl)-N-phenylamino] biphenyl (abbreviation: NPB); 4,4'-bis[N-(3-methylphenyl)-N-phenylamino]biphenyl (abbreviation: TPD); 4,4',4"-tris (N,N-diphenylamino)triphenylamine (abbreviation: TDATA); 4,4',4"-tris[N-(3-methylphenyl)-N-phenylamino] triphenylamine (abbreviation: MTDATA); and the like.

When the following organic compounds are used, a composite material that does not have an absorption peak in a wavelength region of 450 to 800 nm can be obtained. In addition, at the same time, the resistivity can be less than or equal to $1 \times 10^6$ Ω·cm, typically, $5 \times 10^4$ to $1 \times 10^6$ Ω·cm.

As aromatic amine contained in a composite material that does not have an absorption peak in a wavelength region of 450 to 800 nm, the following can be given: N,N'-di(p-tolyl)-N,N'-diphenyl-p-phenylenediamine (abbreviation: DTDPPA); 4,4'-bis[N-(4-diphenylaminophenyl)-N-phenylamino] biphenyl (abbreviation: DPAB); 4,4'-bis(N-{4-[N-(3-methylphenyl)-N-phenylamino]phenyl}-N-phenylamino) biphenyl (abbreviation: DNTPD); 1,3,5-tris[N-(4-diphenylaminophenyl)-N-phenylamino]benzene (abbreviation: DPA3B); and the like.

As the carbazole derivative that can be used for the composite material that does not have an absorption peak in a wavelength region of 450 to 800 nm, the following can be given: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphtyl)-N-(9-phenylcarbazol-3-yl)amino]-9-phenylcarbazole (abbreviation: PCzPCN1); and the like.

Moreover, 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); 2,3,5,6-triphenyl-1,4-bis[4-(N-carbazolyl)phenyl]benzene; and the like can also be used.

As the aromatic hydrocarbon that can be used for the composite material that does not have an absorption peak in a wavelength region of 450 to 800 nm, the following is given, for example: 9,10-di(naphthalen-2-yl)-2-tert-butylanthracene (abbreviation: t-BuDNA); 9,10-di(naphthalen-1-yl)-2-tert-butylanthracene; 9,10-bis(3,5-diphenylphenyl)anthracene (abbreviation: DPPA); 9,10-di(4-phenylphenyl)-2-tert-butylanthracene (abbreviation: t-BuDBA); 9,10-di (naphthalen-2-yl)anthracene (abbreviation: DNA); 9,10-diphenylanthracene (abbreviation: DPAnth); 2-tert-butylanthracene (abbreviation: t-BuAnth); 9,10-di(4-methylnaphthalen-1-yl)anthracene (abbreviation: DMNA); 2-tert-butyl-9,10-bis[2-(naphthalen-1-yl)phenyl]anthracene; 9,10-bis[2-(naphthalen-1-yl)phenyl]anthracene; 2,3,6,7-tetramethyl-9,10-di(naphthalen-1-yl)anthracene; 2,3,6,7-tetramethyl-9,10-di(naphthalen-2-yl)anthracene; 9,9'-bianthryl; 10,10'-diphenyl-9,9'-bianthryl; 10,10'-di(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides, pentacene, coronene, or the like can also be used. It is much preferable to use such aromatic hydrocarbon that has hole mobility of greater than or equal to $1 \times 10^{-6}$ cm$^2$/Vs and that has 14 to 42 carbon atoms, in such a manner.

The aromatic hydrocarbon that can be used for the composite material that does not have an absorption peak in a wavelength region of 450 to 800 nm may have a vinyl skeleton. As aromatic hydrocarbon having a vinyl group, the following is given, for example: 4,4'-bis(2,2-diphenylvinyl) biphenyl (abbreviation: DPVBi); 9,10-bis[4-(2,2-diphenylvinyl)phenyl]anthracene (abbreviation: DPVPA); and the like.

Moreover, a high molecular compound such as poly{4-[N-(4-diphenylaminophenyl)-N-phenyl]aminostyrene} (abbreviation: PStDPA); poly{4-[N-(9-carbazol-3-yl)-N-phenylamino]styrene} (abbreviation: PStPCA); poly(N-vinylcarbazole) (abbreviation: PVK); or poly(4-vinyltriphenylamine) (abbreviation: PVTPA) can also be used.

As the inorganic compound used for the composite material, transition metal oxide is preferably used. Moreover, an oxide of a metal belonging to Groups 4 to 8 in the periodic table is preferably used. Specifically, it is preferable to use vanadium oxide, niobium oxide, tantalum oxide, chromium oxide, molybdenum oxide, tungsten oxide, manganese oxide, or rhenium oxide because of their high electron accepting properties. Above all, molybdenum oxide is particularly preferable because of stability in the air, a low moisture absorption property, and easiness to be treated.

A method for manufacturing a layer containing the composite material may be any method, regardless of a wet method or a dry method. For example, the layer containing the composite material can be manufactured by co-evaporation of the above organic compound and inorganic compound. Since molybdenum oxide is easily vaporized in vacuum, it is also preferable from the aspect of a manufacturing process when the layer containing the composite material is manufactured by a co-evaporation method. Further, the layer containing the composite material can also be obtained in such a way that a solution including the above organic compound and metal alkoxide is coated and baked. As a coating method, an ink-jet method, a spin-coating method, or the like can be used.

The composite material shown in this embodiment mode has high conductivity. Thus, the composite material can be used as a pixel electrode.

A material for forming a wiring or the like can be selected without consideration of the work function because the composite material described in this embodiment mode can form ohmic contact with a metal material for forming a wiring or the like.

By selection of the kind of the organic compound contained in the composite material, a composite material that does not have an absorption peak in a wavelength region of 450 to 800 nm can be obtained. Therefore, light emitted from a light-emitting region is efficiently transmitted through the composite material without being absorbed when the composite material is used in a self-luminous light-emitting device. Thus, external light extraction efficiency can be improved. Similarly, light from a backlight can efficiently be transmitted through the composite material without being absorbed; therefore, external light extraction efficiency can be improved.

In addition, the layer containing the composite material has high resistance to bending. In other words, the layer containing the composite material can preferably be used when a display device is manufactured using a flexible substrate.

Moreover, since the layer containing the composite material of an organic compound and an inorganic compound contains an organic compound, the layer containing the composite material is excellent in adhesiveness to an EL layer. Thus, a highly reliable light-emitting device can be obtained.

Further, the layer containing the composite material can efficiently inject holes into an EL layer. Thus, when the layer containing the composite material is used as a pixel electrode of the light-emitting device, a light-emitting device having high luminous efficiency can be obtained. In addition, since the layer containing the composite material can efficiently inject holes into an EL layer, the layer containing the composite material is preferably used as an anode. Alternatively, the layer containing the composite material is preferably used as a cathode to provide a layer including an electron-transporting material and a substance which shows an electron accepting property with respect to the electron-transporting material for a layer in contact with the layer containing the composite material.

Since the layer containing the composite material of an organic compound and an inorganic compound has high conductivity, increase in drive voltage can be suppressed even when the layer containing the composite material is thickly formed. Thus, it becomes possible to optimize the film thickness of the layer containing the composite material so that external light extraction efficiency increases while suppressing increase in drive voltage. In addition, improvement in color purity by optical design can be achieved without increase in drive voltage.

Note that this embodiment mode can appropriately be combined with other embodiment modes.

Embodiment Mode 2

In this embodiment mode, a case will be explained where the composite material shown in Embodiment Mode 1 is used as an electrode of a light-emitting element of a light-emitting device.

One mode of a light-emitting device to which the present invention is applied will be explained with reference to FIGS. 1 and 2. FIG. 2 is a top view of a light-emitting device, and FIG. 1 is a cross-sectional view taken along a line A-A' in FIG. 2.

Figure 2:
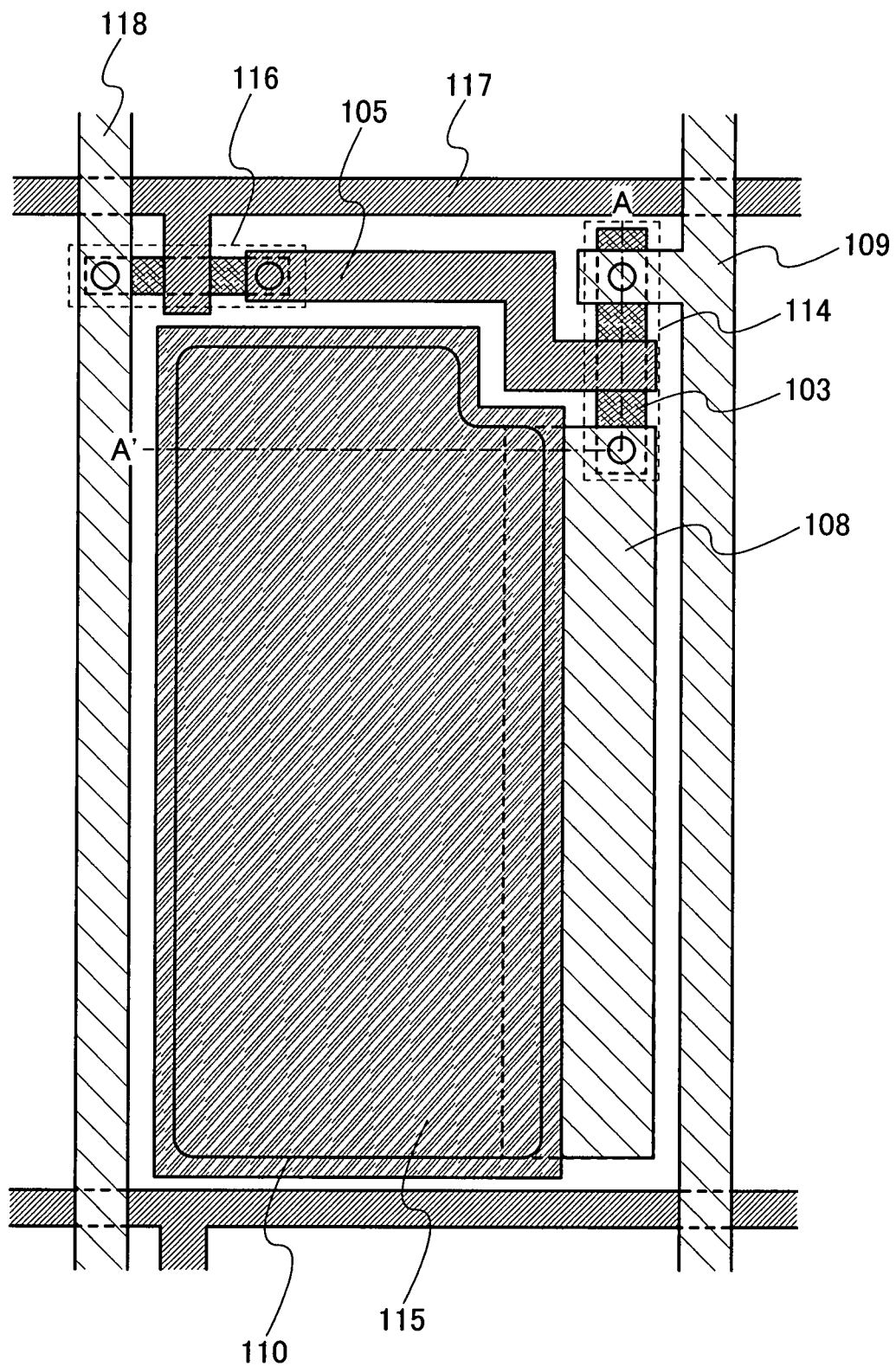
FIG. 2 illustrates a display device of the present invention.

In FIG. 1, a portion surrounded by a dotted line is a transistor 114 which is provided to drive a light-emitting element 115. The light-emitting element 115 has an EL layer 112 between a first electrode 111 and a second electrode 113. One of source or drain electrodes of the transistor 114 is electrically connected to the first electrode 111 by wirings 108 and 109 that penetrate a first interlayer insulating film 106 (106a and 106b). In addition, the light-emitting element 115 is separated from another adjacently-provided light emitting element by a partition layer 110. The light-emitting device of the present invention having such a structure is provided over a base film 102, which is formed over a substrate 101, in this embodiment mode. Note that the base film is not necessarily provided when impurities from the substrate are not diffused.

Note that the transistor 114 shown in FIG. 1 is a top gate type in which a gate electrode is provided opposite to a substrate, with a semiconductor layer in the center. However, the structure of the transistor 114 is not particularly limited, and for example, a bottom gate type may also be used. In the case of a bottom gate type, the transistor 114 may have a structure in which a protective film is formed over the semiconductor layer which forms a channel (a channel protective type) or a structure in which part of the semiconductor layer which forms a channel is concave (a channel etched type). Note that the transistor 114 has a gate electrode 105, a gate insulating film 104, and a semiconductor layer 103.

Alternatively, the semiconductor layer included in the transistor 114 may be either crystalline or amorphous. Further, the semiconductor layer may be semi-amorphous or the like.

Note that characteristics of the semi-amorphous semiconductor are as follows. It has an intermediate structure between an amorphous structure and a crystalline structure (including a single crystal and a polycrystal) and a third state which is stable in terms of free energy, and it includes a crystalline region having short-range order and lattice distortion. At least part of a region in the film contains a crystal grain having a diameter of 0.5 to 20 nm. A Raman spectrum is shifted to a lower wavenumber side than 520 cm$^{-1}$. The diffraction peaks of (111) and (220) to be caused by a Si crystal lattice are observed in X-ray diffraction. At least hydrogen or halogen of 1 atomic % or more is contained to terminate a dangling bond. The semi-amorphous semiconductor is also referred to as a so-called microcrystalline semiconductor and is formed by performance of glow discharge decomposition (plasma CVD) to gas containing silicide. $SiH_4$ is given as the gas containing silicide. In addition, $Si_2H_6$, $SiH_2Cl_2$, $SiHCl_3$, $SiCl_4$, $SiF_4$, or the like can also be used as the gas containing silicide. The gas containing silicide may be diluted with $H_2$, or $H_2$ and one or more rare gas elements of He, Ar, Kr, and Ne. A dilution ratio thereof may range from 2 to 1000 times; pressure, approximately 0.1 to 133 Pa; and a power supply frequency, 1 to 120 MHz, preferably, 13 to 60 MHz. A substrate heating temperature may be less than or equal to 300° C., preferably, 100 to 250° C. The concentration of an atmospheric constituent impurity such as oxygen, nitrogen, or carbon, as an impurity element in the film, is preferably less than or equal to $1\times10^{20}$ atoms/cm$^3$; particularly, the concentration of oxygen is less than or equal to $5\times10^{19}$ atoms/cm$^3$, preferably less than or equal to $1\times10^{19}$ atoms/cm$^3$. Note that mobility of a TFT (thin film transistor) using the semi-amorphous semiconductor is approximately 1 to 10 cm$^2$/Vsec.

As a specific example of the crystalline semiconductor layer, a layer formed of single-crystal or polycrystalline silicon, silicon germanium, or the like can be given. These materials may be formed by laser crystallization or may be formed by crystallization through a solid phase growth method using nickel or the like, for example.

In a case where the semiconductor layer is formed using an amorphous substance, for example, amorphous silicon, a light-emitting device preferably has a circuit in which the transistor 114 and other transistors (transistors included in a circuit for driving a light-emitting element) are all n-channel transistors. Other than the case, the light-emitting device may have a circuit including either n-channel transistors or p-channel transistors, or the light-emitting device may have a circuit including both types of transistors.

Further, the first interlayer insulating film 106 may be a multilayer as shown in FIG. 1, or a single layer. For example, as shown in FIG. 1, a layer formed of silicon oxide or silicon nitride as the first interlayer insulating film 106a and a layer formed of acrylic or a siloxane resin as the first interlayer insulating film 106b may be stacked. Note that the siloxane resin corresponds to a resin including a Si—O—Si bond. Siloxane is composed of a skeleton structure formed by the bond of silicon (Si) and oxygen (O). As a substituent, an organic group containing at least hydrogen (such as an alkyl group or aromatic hydrocarbon) is used. Alternatively, a fluoro group may also be used as the substituent. Further alternatively, a fluoro group and an organic group containing at least hydrogen may be used as the substituent. Besides, the first interlayer insulating film can be formed from a material selected from a silicon nitride oxide film (SiNO) containing a larger amount of nitrogen than oxygen, a silicon oxynitride film (SiON) containing a larger amount of oxygen than nitrogen, aluminum nitride (AlN), aluminum oxynitride (AlON), aluminum nitride oxide (AlNO) containing a larger amount of nitrogen than oxygen, aluminum oxide, diamond-like-carbon (DLC), a carbon film containing nitrogen (CN), a silicon nitride film containing argon (Ar), or a substance containing another inorganic insulating material. Alternatively, an organic insulating material may also be used, and polyimide, acrylic, polyamide, polyimide amide, resist, benzocyclobutene, or polysilazane can be used as the organic material. A coating film having favorable planarity, which is formed by a coating method, may also be used. As for the substance that forms each layer is not particularly limited, and a substance other than the above substances may also be used. Alternatively, a layer formed using a substance other than the above substances may be further combined. As described above, the first interlayer insulating film 106 may be formed using either an inorganic film or an organic film, or both of them.

The partition layer 110 preferably has a shape in which, in the edge portion, a curvature radius changes continuously. In addition, the partition layer 110 is formed using acrylic, siloxane, resist, silicon oxide, or the like. Note that the partition layer 110 may be formed using either an inorganic film or an organic film, or both of them.

In FIG. 1, only the first interlayer insulating film 106 is provided between the transistor 114 and the light-emitting element 115. However, a second interlayer insulating film may also be provided in addition to the first interlayer insulating film 106. Similar to the first interlayer insulating film 106, the second interlayer insulating film may be a multilayer or a single layer. As the second interlayer insulating film, a material similar to that of the first interlayer insulating film can be used. In addition, the second interlayer insulating film may be formed using either an inorganic film or an organic film, or both of them.

When both the first electrode 111 and the second electrode 113 are light-transmitting electrodes in the light-emitting element 115, light, which is emitted, can be extracted from both sides of the first electrode 111 and the second electrode 113. In a case where only the second electrode 113 is a light-transmitting electrode, the light can be extracted only from the side of the second electrode 113. In this case, it is preferable that the first electrode 111 be formed with a highly reflective material or a film formed of a highly reflective material (reflective film) be provided below the first electrode 111. In addition, in a case where only the first electrode 111 is a light-transmitting electrode, the light can be extracted from the side of the first electrode 111. In this case, it is preferable that the second electrode 113 is formed with a highly reflective material or a reflective film is provided above the second electrode 113.

In the light-emitting element 115, the EL layer 112 may be stacked so that the light-emitting element 115 operates when voltage is applied between the first electrode 111 and the second electrode 113 so that the potential of the second electrode 113 becomes higher than that of the first electrode 111, or the EL layer 112 may be stacked so that the light-emitting element 115 operates when voltage is applied between the first electrode 111 and the second electrode 113 so that the potential of the second electrode 113 becomes lower than that of the first electrode 111. In the former case, the transistor 114 is an n-channel transistor, and in the latter case, the transistor 114 is a p-channel transistor.

As described above, the active type light-emitting device which controls driving of the light-emitting element by the transistor is explained in this embodiment mode. Alternatively, a passive type light-emitting device, which drives a light-emitting element without particularly providing an element for driving such as a transistor, may also be employed.

Embodiment Mode 3

In this embodiment mode, a case will be explained where the composite material shown in Embodiment Mode 1 is used as an electrode of a light-emitting element of a light-emitting device.

In this embodiment mode, one mode of a light-emitting device different from that in Embodiment Mode 2 will be explained with reference to FIG. 3, FIGS. 4A and 4B, and FIGS. 5A and 5B. FIG. 3, FIGS. 4A and 4B, and FIGS. 5A and 5B are schematic structural views each showing a main portion of a display device.

Figure 3:
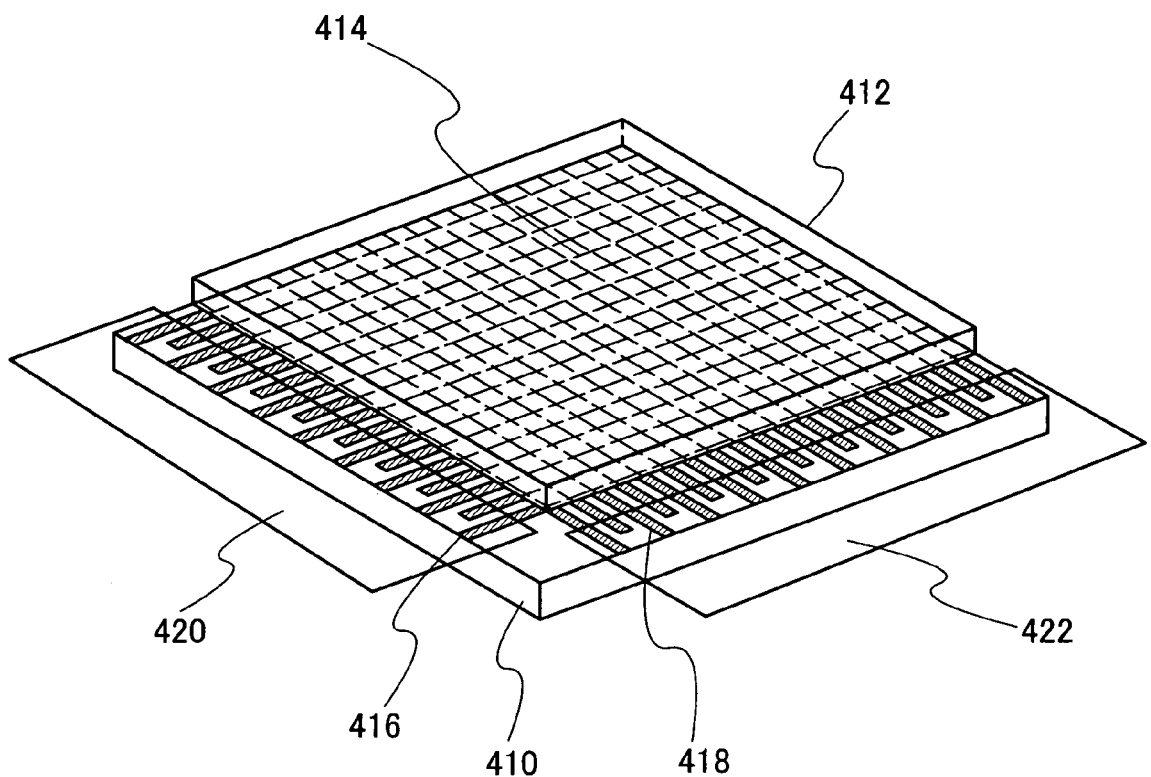
FIG. 3 illustrates a display device of the present invention.

FIG. 3 is a schematic structural view showing a main portion of a display device. A substrate 410 is provided with a first electrode 416 and a second electrode 418 which is extended in a direction intersecting with the first electrode 416. At least an intersecting portion of the first electrode 416 and the second electrode 418 is provided with a light-emitting layer similar to that explained in Embodiment Mode 2, which forms a light-emitting element. In the display device of FIG. 3, a plurality of first electrodes 416 and a plurality of second electrodes 418 are disposed, and light-emitting elements to be pixels are arranged in matrix, thereby forming a display portion 414. In this display portion 414, an external circuit controls the potential of the first electrode 416 and the second electrode 418 to control light emission/non-light emission of each light-emitting element, whereby a moving image and a still image can be displayed.

In this display device, a signal for displaying an image is applied to each of the first electrode 416, which is provided to be extended in one direction of the substrate 410, and the second electrode 418, which intersects therewith so as to select light emission/non-light emission of the light-emitting element. Specifically, the display device is a simple matrix display device in which a pixel is mainly driven with a signal given from the external circuit. Such a display device has a simple structure; therefore, the display device can easily be manufactured though the display device is formed to have a large area.

An opposing substrate 412 may be provided if necessary, and the opposing substrate 412 can serve as a protective member by being provided in accordance with a position of the display portion 414. It is not necessary that the opposing substrate 412 is formed using a hard plate member, and a resin film or a resin material to be applied can be substituted for the opposing substrate 412. The first electrode 416 and the second electrode 418 are led to an edge portion of the substrate 410, whereby a terminal to be connected to the external circuit is formed. Specifically, the first electrode 416 and the second electrode 418 are in contact with flexible wiring boards 420 and 422, respectively, in the edge portion of the substrate 410. As the external circuit, there are a power supply circuit, a tuner circuit, and the like, in addition to a controller circuit for controlling an image signal.

Figure 4A:
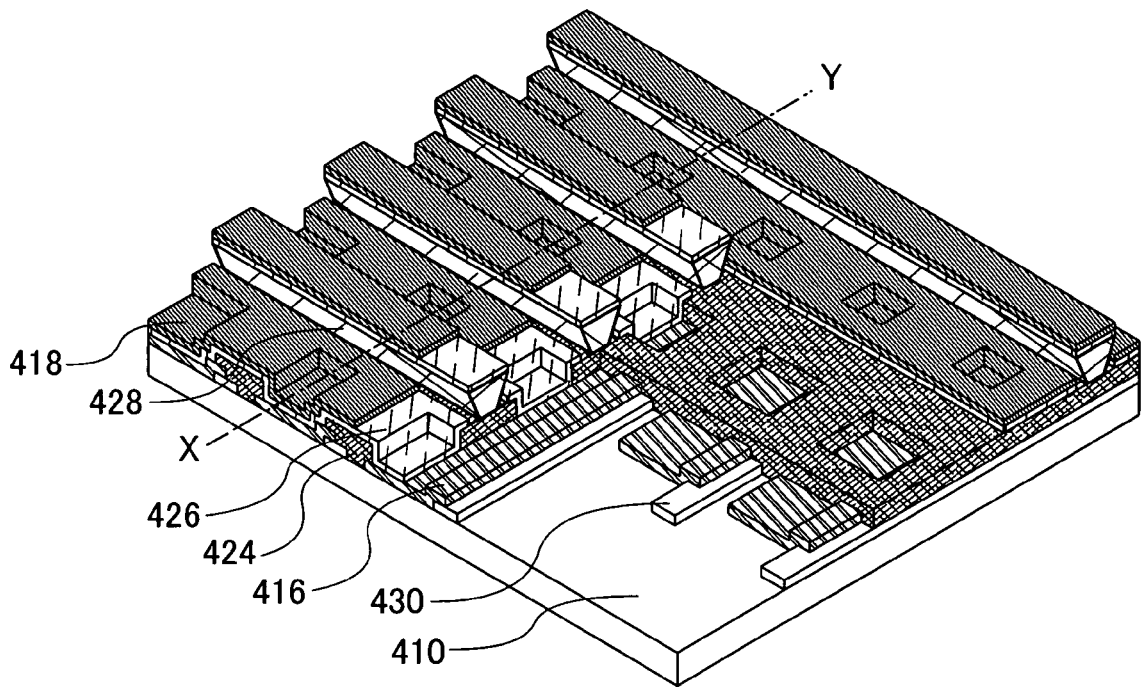
FIGS. 4A and 4B illustrate a display device of the present invention.
Figure 4B:
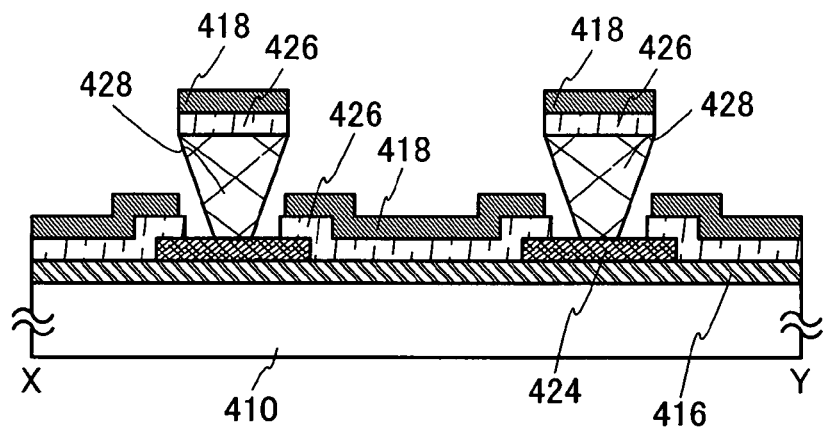

FIGS. 4A and 4B are partially enlarged views showing a structure of the display portion 414. In the structure shown in FIGS. 4A and 4B, the layer containing the composite material shown in Embodiment Mode 1 is used for the first electrode. In FIG. 4A, an edge portion of the first electrode 416 is covered with an insulating layer 424. A partition layer 428 is provided over the insulating layer 424. A side wall of the partition layer 428 slopes so that a distance between one side wall and the other side wall becomes narrow toward the substrate surface. In other words, a cross section of the partition layer 428 in the direction of a narrow side is trapezoidal, and a base (a side in the same direction as a plane direction of the insulating layer 424 and in contact with the insulating layer 424) is shorter than an upper side (a side in the same direction as the plane direction of the insulating layer 424 and not in contact with the insulating layer 424). The partition layer 428 is provided in this manner, whereby an EL layer 426 and the second electrode 418 can be formed in a self-aligned manner using the partition layer 428.

When the layer containing the composite material shown in Embodiment Mode 1 is used to form the first electrode 416, an auxiliary electrode 430 is preferably provided in order to reduce resistance loss. In this case, the auxiliary electrode 430 is preferably formed with a substance having high conductivity, that is, a refractory metal such as titanium, tungsten, chromium, or tantalum, or the combination of the refractory metal and low resistance metal such as aluminum or silver.

Figure 5A:
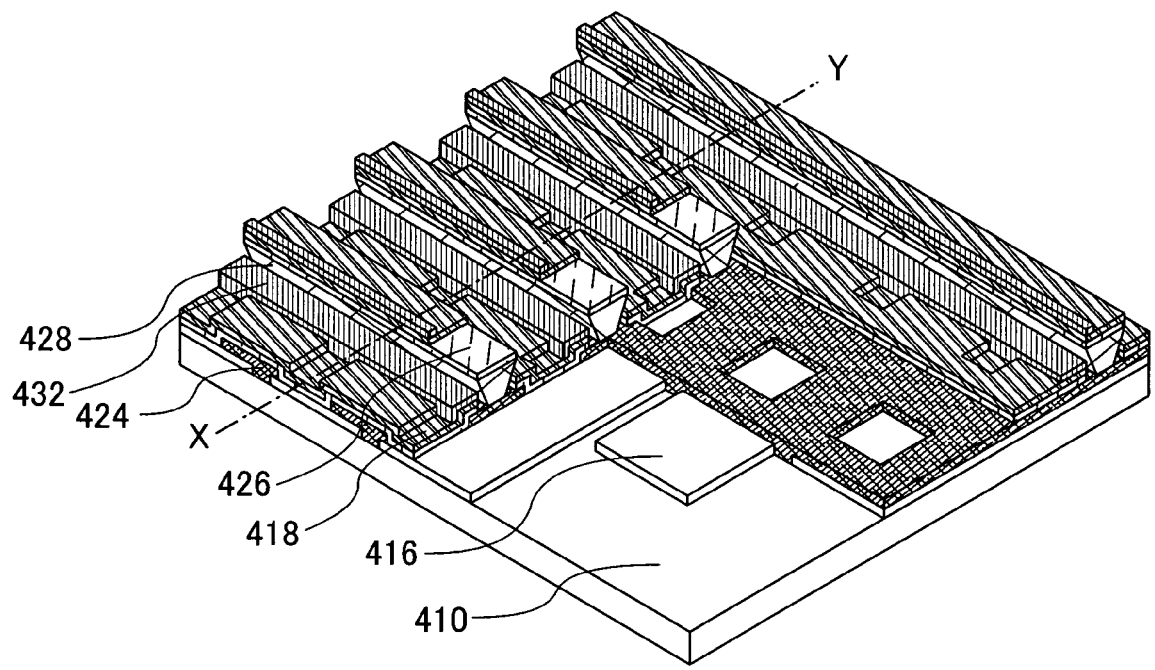
FIGS. 5A and 5B illustrate a display device of the present invention.
Figure 5B:
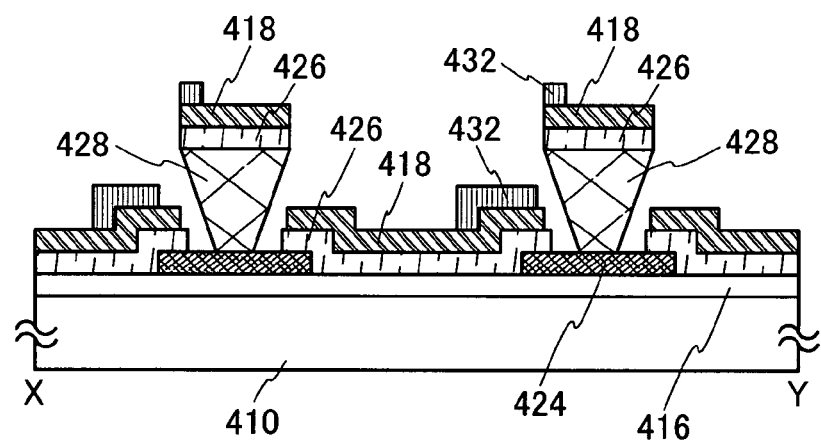

In a structure shown in FIGS. 5A and 5B, the layer containing the composite material shown in Embodiment Mode 1 is used for the second electrode. In FIGS. 5A and 5B, an auxiliary electrode 432 is preferably provided above the second electrode 418 in order to reduce resistance loss of the second electrode. In this case, the auxiliary electrode 432 is preferably formed with a substance having high conductivity, that is, a refractory metal such as titanium, tungsten, chromium, or tantalum, or the combination of the refractory metal and low resistance metal such as aluminum or silver.

In the above description, when aluminum, titanium, tantalum, or the like is used as the first electrode 416 and the layer containing the composite material shown in Embodiment Mode 1 is used as the second electrode 418, a display device in which the display portion 414 is formed on the side of the opposing substrate 412 can be obtained. In addition, when the layer containing the composite material shown in Embodiment Mode 1 is used as the first electrode 416 and aluminum, titanium, tantalum, or the like is used as the second electrode 418, a display device in which the display portion 414 is formed on the side of the substrate 410 can be obtained. Moreover, when the layer containing the composite material shown in Embodiment Mode 1 is used as both the first electrode 416 and the second electrode 418, a double-sided display device can be obtained.

Note that this embodiment mode can appropriately be combined with other embodiment modes.

Embodiment Mode 4

Figure 6A:
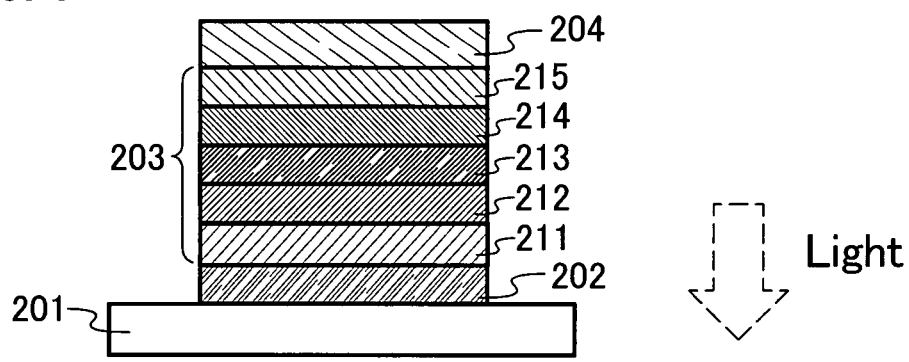
FIGS. 6A and 6B each illustrate a light-emitting element included in a light emitting device of the present invention.
Figure 6B:
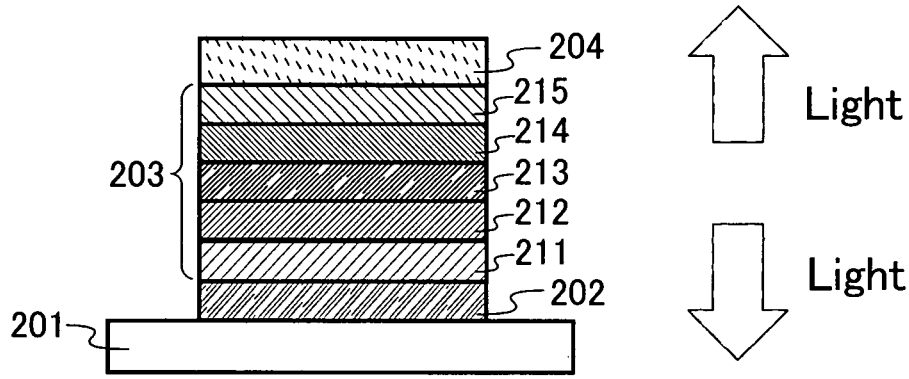

One mode of the light-emitting element of the light-emitting device to which the present invention is applied will be explained below with reference to FIGS. 6A and 6B.

A light-emitting element of the light-emitting device to which the present invention is applied has a plurality of layers between a pair of electrodes. The plurality of layers are a combination of layers formed of a substance with a high carrier-injecting property and a substance with a high carrier-transporting property which are stacked so that a light-emitting region is formed in a region away from the electrodes, that is, recombination of carriers is performed in an area away from the electrodes.

In this embodiment mode, a light-emitting element includes a first electrode 202, a second electrode 204, and an EL layer 203 (also described as a light-emitting unit) provided between the first electrode 202 and the second electrode 204. Note that the description will be made below regarding the first electrode 202 as an anode and the second electrode 204 as a cathode. In other words, the following explanation will be made providing light emission is obtained when voltage is applied to the first electrode 202 and the second electrode 204 so that the potential of the first electrode 202 becomes higher than that of the second electrode 204.

A substrate 201 is used as a base of the light-emitting element. As the substrate 201, glass, plastic, or the like may be used, for example. Other materials than those may be used, as long as the materials function as a base in the process of manufacturing the light-emitting element.

As the first electrode 202, the layer containing the composite material shown in Embodiment Mode 1 can be used. A material for forming a wiring or the like can be selected without consideration of the work function because the layer containing the composite material described in Embodiment Mode 1 can form ohmic contact with a metal material for forming a wiring or the like.

By selection of the kind of the organic compound contained in the composite material, a composite material that does not have an absorption peak in a wavelength region of 450 to 800 nm can be obtained. Therefore, light emitted from a light-emitting region is efficiently transmitted through the composite material without being absorbed when a self-luminous light-emitting device is used. Thus, external light extraction efficiency can be improved.

In addition, the layer containing the composite material has high resistance to bending. In other words, the layer containing the composite material can preferably be used when a display device is manufactured using a flexible substrate.

Moreover, since the layer containing the composite material of an organic compound and an inorganic compound contains an organic compound, the layer containing the composite material is excellent in adhesiveness to an EL layer. Thus, a highly reliable light-emitting device can be obtained.

Further, the layer containing the composite material can efficiently inject holes into the EL layer. Thus, when the layer containing the composite material is used as a pixel electrode of the light-emitting device, a light-emitting device having high luminous efficiency can be obtained. In this embodiment mode, since the layer containing the composite material is used as an anode, holes can efficiently be injected into the EL layer.

Since the layer containing the composite material of an organic compound and an inorganic compound has high conductivity, increase in drive voltage can be suppressed even when the layer containing the composite material is thickly formed. Thus, it becomes possible to optimize the film thickness of the layer containing the composite material so that external light extraction efficiency increases while suppressing increase in drive voltage. In addition, improvement in color purity by optical design can be achieved without increase in drive voltage.

The EL layer 203 may be structured as a single layer, or a plurality of layers may be stacked. In other words, the layer structure is not particularly limited, and a layer formed of a substance with a high electron-transporting property, a substance with a high hole-transporting property, a substance with a high electron-injecting property, a substance with a high hole-injecting property, a bipolar substance (a substance with high electron-transporting and hole-transporting properties), or the like may be appropriately combined with a light-emitting layer. For example, a hole-injecting layer, a hole-transporting layer, a hole-blocking layer, a light-emitting layer, an electron-transporting layer, an electron-injecting layer, or the like may appropriately be combined to structure the EL layer 203. Specific materials to form each of the layers will be given below. Note that, as one mode, the EL layer where a first layer 211, a second layer 212, a third layer 213, a fourth layer 214, and a fifth layer 215 are stacked is explained with reference to FIGS. 6A and 6B.

A first layer 211 is a layer that contains a substance with a high hole-injecting property. As the substance with a high hole-injecting property, molybdenum oxide ($MoO_x$), vanadium oxide ($VO_x$), ruthenium oxide ($RuO_x$), tungsten oxide ($WO_x$), manganese oxide ($MnO_x$), or the like can be used. In addition, it is also possible to use a phthalocyanine-based compound such as phthalocyanine ($H_2Pc$) or copper phthalocyanine (CuPc), a high molecule such as poly(3,4-ethylenedioxythiophene)/poly(styrenesufonate) (PEDOT/PSS), or the like to form the hole-injecting layer.

Alternatively, as the first layer 211, a composite material of a substance with a high hole-transporting property containing an acceptor material can be used. Note that, using the substance with a high hole-transporting property containing an acceptor material, a material used to form an electrode may be selected regardless of its work function. In other words, besides a material with a high work function, a material with a low work function may also be used as the first electrode 102. As the acceptor material, 7,7,8,8-tetracyano-2,3,5,6-tetrafluoroquinodimethane (abbreviation: $F_4$-TCNQ), chloranil, or the like can be given. In addition, a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because their electron-accepting property is high. Among these, molybdenum oxide is especially preferable because it is stable in the air and its hygroscopic property is low so that it can be easily treated.

Note that, since the layer containing the composite material shown in Embodiment Mode 1 is excellent in a hole-injecting property, the first layer 211 is not necessarily provided.

The second layer 212 is a layer that contains a substance with a high hole-transporting property. As the substance with a high hole-transporting property, for example, an aromatic amine compound such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), or 4,4'-bis[N-(spiro-9,9'-bifluoren-2-yl)-N-phenylamino]biphenyl (abbreviation: BSPB) can be used. These materials mainly are materials each having a hole mobility greater than or equal to $1\times10^{-6}$ $cm^2/Vs$. However, other materials than these may also be used as long as the hole-transporting properties thereof are higher than the electron-transporting properties. The layer containing a substance with a high hole-transporting property is not limited to a single layer, and two or more layers containing the above materials may also be stacked.

The third layer 213 is a layer that contains a substance with a high light-emitting property, and can be made of various kinds of materials. For example, a substance with a high light-emitting property is freely combined with a substance with a high carrier-transporting property and favorable film quality (that is, a material difficult to be crystallized), such as tris(8-quinolinolato)aluminum (abbreviation: Alq), 2-tert-butyl-9,10-di(2-naphthyl)anthracene (abbreviation: t-BuDNA), or 4,4'-bis[N-(1-naphthyl)-N-phenylamino]biphenyl (abbreviation: NPB). Specifically, the substance with a high light-emitting property may be a singlet light emitting material (fluorescent material) such as N,N'-dimethylquinacridone (abbreviation: DMQd), N,N'-diphenylquinacridone (abbreviation: DPQd), coumarin 6,4-(dicyanomethylene)-2-methyl-6-(p-dimethylaminostyryl)-4H-pyran (abbreviation: DCM1), 4-(dicyanomethylene)-2-methyl-6-[2-(julolidine-9-yl)vinyl]-4H-pyran (abbreviation: DCM2), 9,10-diphenylanthracene,5,12-diphenyltetracene (abbreviation: DPT), perylene, or rubrene, or a triplet light emitting material (phosphorescent material) such as bis[2-(2'-benzo[4,5-a]thienyl) pyridinato-N,$C^3$']iridium(acetylacetonate) (abbreviation: Ir(btp)$_2$(acac)). However, since Alq and DNA are materials with high light emitting properties, the third layer 213 may be formed of only one of these materials.

The fourth layer 214 is a layer that contains a substance with a high electron-transporting property. For example, a layer containing a metal complex having a quinoline skeleton or a benzoquinoline skeleton, such as tris(8-quinolinolato) aluminum(III) (abbreviation: Alq), tris(4-methyl-8-quinolinolato)aluminum(III) (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq) can be used. Alternatively, a metal complex having an oxazole-based or thiazole-based ligand, such as bis[2-(2-benzoxazolyl)phenolate]zinc (II) (abbreviation: ZnPBO) or bis[2-(2-benzothiazolyl) phenoate]zinc(II) (abbreviation: ZnBTZ) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances described here each mainly have an electron mobility greater than equal to $1 \times 10^{-6} cm^2$/Vs. The electron-transporting layer may be formed of other substances than those described above as long as the substances have higher electron-transporting properties than hole-transporting properties. Moreover, the electron-transporting layer is not limited to a single layer, and two or more layers formed of the substances described above may be stacked.

The fifth layer 215 is a layer that contains a substance with a high electron-injecting property. As the fifth layer 215, an alkali metal, an alkaline earth metal, or a compound thereof such as lithium fluoride (LiF), cesium fluoride (CsF), or calcium fluoride (CaF$_2$) can be used. For example, a layer formed of a substance having an electron-transporting property containing an alkali metal, an alkaline earth metal, or a compound thereof, such as a layer formed of Alq containing magnesium (Mg), can be used. With the use of a layer formed of a substance having an electron-transporting property containing an alkali metal or an alkaline earth metal as the electron-injecting layer, electron injection from the second electrode 204 is performed efficiently, which is preferable.

As a substance for forming the second electrode 204, a metal, an alloy, a conductive compound, a mixture thereof, each of which has a low work function (specifically, less than or equal to 3.8 eV), or the like can be used. As a specific example of such a cathode material, an element that belongs to Group 1 or Group 2 of the periodic table, that is, an alkali metal such as lithium (Li) or cesium (Cs), an alkaline earth metal such as magnesium (Mg), calcium (Ca), or strontium (Sr), an alloy containing these (such as an MgAg alloy or an AlLi alloy), a rare-earth metal such as europium (Eu) or ytterbium (Yb), an alloy containing these, and the like can be given. However, the fifth layer 215 is provided between the second electrode 204 and the fourth layer 214, whereby, regardless of the degree of the work function, various conductive materials such as Al, Ag, indium tin oxide (ITO), indium tin oxide containing silicon or silicon oxide, indium zinc oxide (IZO), or indium oxide containing tungsten oxide and zinc oxide (IWZO) can be used as the second electrode 204.

As the method for forming the EL layer 203, various methods can be employed regardless of a wet method or a dry method. For example, a vacuum vapor deposition method, an ink-jet method, a spin coat method, or the like may also be used. In addition, each electrode or each layer may also be formed by a different film formation method.

The light-emitting element of the present invention which has the structure as the above emits light when a current flows due to the potential difference generated between the first electrode 202 and the second electrode 204, and holes and electrons are recombined in the third layer 213 that contains a substance with a high light-emitting property. In other words, the light-emitting element of the present invention has a structure in which a light-emitting region is formed in the third layer 213.

The light, which is emitted, is extracted outside through one or both the first electrode 202 and the second electrode 204. Note that, since the first electrode 202 is formed using a composite material having a high light-transmitting property, it is preferable to have a structure in which the light is extracted outside through the first electrode. In a case where only the first electrode 202 has a light-transmitting property, the light is extracted from a substrate side through the first electrode 202 as shown in FIG. 6A. Alternatively, in a case where each of the first electrode 202 and the second electrode 204 has a light-transmitting property, the light is extracted from both the substrate side and the side opposite to the substrate through the first electrode 202 and the second electrode 204 as shown in FIG. 6B.

A structure of layers provided between the first electrode 202 and the second electrode 204 is not limited to the above structure. A structure other than the above may also be employed as long as the light-emitting region, in which holes and electrons are recombined, is provided apart from the first electrode 202 and the second electrode 204 so as to prevent quenching caused by the light-emitting region and metal coming close to each other.

In other words, a stacked structure of the layer is not particularly limited, and a layer formed of a substance having a high electron-transporting property, a substance having a high hole-transporting property, a substance having a high electron-injecting property, a substance having a high hole-injecting property, a bipolar substance (a substance having a high electron-transporting property and a high hole-transporting property), a hole blocking material, or the like may freely be combined with a light-emitting layer.

Figure 7A:
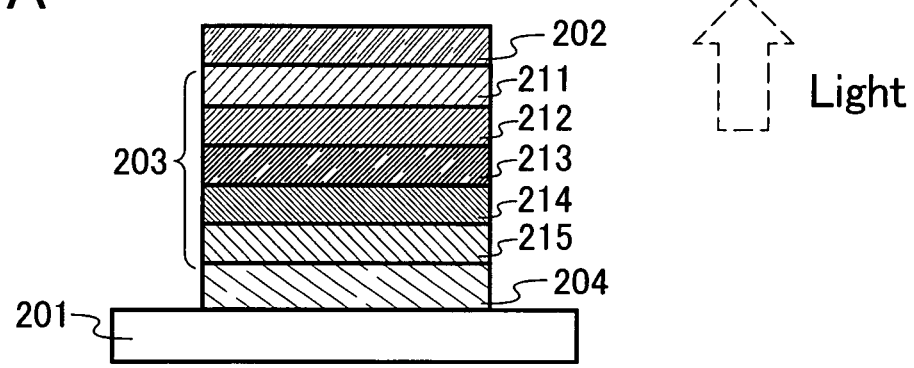
FIGS. 7A and 7B each illustrate a light-emitting element included in a display device of the present invention.
Figure 7B:
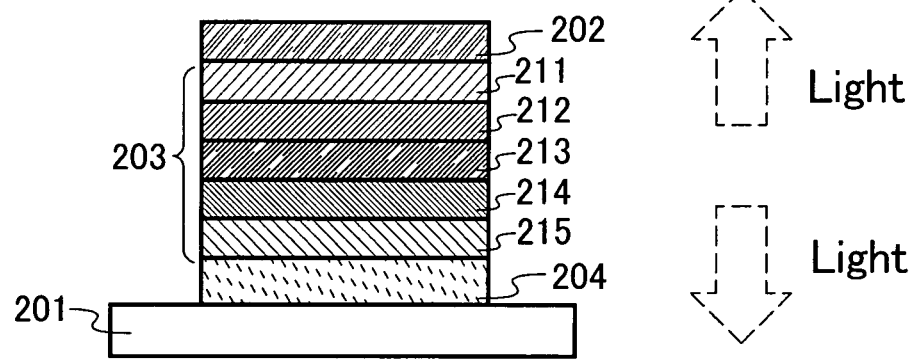

A light-emitting element shown in each of FIGS. 7A and 7B has a structure in which the second electrode 204 serving as a cathode, the fifth layer 215 containing a substance having a high electron-injecting property, the fourth layer 214 containing a substance having a high electron-transporting property, the third layer 213 containing a substance having a high light-emitting property, the second layer 212 containing a substance having a high hole-transporting property, the first layer 211 containing a substance having a high hole-injecting property, and the first electrode 202 serving as an anode are sequentially stacked over the substrate 201.

Light, which is emitted, is extracted outside through one or both the first electrode 202 and the second electrode 204. Note that, since the first electrode 202 is formed using a composite material having a high light-transmitting property, it is preferable to have a structure in which the light is extracted outside through the first electrode. In a case where only the first electrode 202 has a light-transmitting property, the light is extracted from a side opposite to the substrate through the first electrode 202 as shown in FIG. 7A. Alternatively, in a case where each of the first electrode 202 and the second electrode 204 has a light-transmitting property, the light is extracted from both the substrate side and the side opposite to the substrate through the first electrode 202 and the second electrode 204 as shown in FIG. 7B.

Note that this embodiment mode can appropriately be combined with other embodiment modes.

Embodiment Mode 5

In this embodiment mode, one mode of the light-emitting element, which is different from that of Embodiment Mode 4, will be explained below with reference to FIGS. 8A and 8B.

In this embodiment mode, a light-emitting element includes a first electrode 302, a second electrode 304, and an EL layer 303 provided between the first electrode 302 and the second electrode 304. Note that the description will be made below regarding the first electrode 302 as a cathode and the second electrode 304 as an anode. In other words, the following explanation will be made providing light emission is obtained when voltage is applied to the first electrode 302 and the second electrode 304 so that the potential of the first electrode 302 becomes lower than that of the second electrode 304.

As the first electrode 302, the layer containing the composite material shown in Embodiment Mode 1 can be used. A material for forming a wiring or the like can be selected without consideration of the work function because the layer containing the composite material described in Embodiment Mode 1 can form ohmic contact with a metal material for forming a wiring or the like.

By selection of the kind of the organic compound contained in the composite material, a composite material that does not have an absorption peak in a wavelength region of 450 to 800 nm can be obtained. Therefore, light emitted from a light-emitting region is efficiently transmitted through the composite material without being absorbed when a self-luminous light-emitting device is used. Thus, external light extraction efficiency can be improved.

In addition, the layer containing the composite material has high resistance to bending. In other words, the layer containing the composite material can preferably be used when a display device is manufactured using a flexible substrate.

Moreover, since the layer containing the composite material of an organic compound and an inorganic compound contains an organic compound, the layer containing the composite material is excellent in adhesiveness to the EL layer. Thus, a highly reliable light-emitting device can be obtained.

Since the layer containing the composite material of an organic compound and an inorganic compound has high conductivity, increase in drive voltage can be suppressed even when the layer containing the composite material is thickly formed. Thus, it becomes possible to optimize the film thickness of the layer containing the composite material so that external light extraction efficiency increases while suppressing increase in drive voltage. In addition, improvement in color purity by optical design can be achieved without increase in drive voltage.

In the EL layer 303, a layer formed of a substance with a high electron-transporting property, a substance with a high hole-transporting property, a substance with a high electron-injecting property, a substance with a high hole-injecting property, a bipolar substance (a substance with high electron-transporting and hole-transporting properties), or the like may be appropriately combined with a light-emitting layer. FIGS. 8A and 8B each show a structure in which a second layer 312 containing a substance having a high electron-injecting property, a third layer 313 containing a substance having a high electron-transporting property, a fourth layer 314 containing a substance having a high light-emitting property, a fifth layer 315 containing a substance having a high hole-transporting property, and a sixth layer 316 containing a substance having a high hole-injecting property are stacked. When a first layer 311, which will be subsequently described, containing a substance having a high electron-transporting property and a substance which shows an electron-donating property with respect to the substance having a high electron-transporting property is provided, the second layer 312 containing a substance having a high electron-injecting property is not necessarily provided.

Note that, as a layer in contact with the first electrode 302 of the EL layer 303, the first layer 311 containing a substance having a high electron-transporting property and a substance which shows an electron-donating property with respect to the substance having a high electron-transporting property is preferably provided. The substance having a high electron-transporting property shown in Embodiment Mode 4 can be used as the substance having a high electron-transporting property. In addition, as the substance which shows an electron-donating property with respect to the substance having a high electron-transporting property, an alkaline metal, an alkaline earth metal, or an oxide or salt thereof can be used. Specifically, lithium, cesium, calcium, lithium oxide, calcium oxide, barium oxide, cesium carbonate, and the like are given.

The layer containing the composite material is stacked with the first layer 311 containing a substance having a high electron-transporting property and a substance which shows an electron-donating property with respect to the substance having a high electron-transporting property, whereby both the layers can serve as carrier generation layers. Thus, electrons are injected into the fourth layer containing a substance having a high light-emitting property from the first layer 311 containing a substance having a high electron-transporting property and a substance which shows an electron-donating property with respect to the substance having a high electron-transporting property, and the electrons are recombined with holes injected from the second electrode 304 serving as an anode. Accordingly, light can be emitted.

In a similar manner to Embodiment Mode 4, the light, which is emitted, is extracted outside through one or both the first electrode 302 and the second electrode 304. Note that, since the first electrode 302 is formed using a composite material having a high light-transmitting property, it is preferable to have a structure in which the light is extracted outside through the first electrode. In a case where only the first electrode 302 has a light-transmitting property, the light is extracted from a substrate side through the first electrode 302 as shown in FIG. 8A. Alternatively, in a case where each of the first electrode 302 and the second electrode 304 has a light-transmitting property, the light is extracted from both the substrate side and the side opposite to the substrate through the first electrode 302 and the second electrode 304 as shown in FIG. 8B.

As the method for forming the EL layer 203, various methods can be employed regardless of a wet method or a dry method. For example, a vacuum vapor deposition method, an ink-jet method, a spin coat method, or the like may also be used. In addition, each electrode or each layer may also be formed by a different film formation method.

A structure of layers provided between the first electrode 302 and the second electrode 304 is not limited to the above structure. A structure other than the above structure may be used as long as the light-emitting region, in which holes and electrons are recombined, is provided apart from the first electrode 302 and the second electrode 304 so as to prevent quenching caused by the light-emitting region and metal coming close to each other.

In other words, a stacked structure of the layer is not particularly limited, and a layer formed of a substance having a high electron-transporting property, a substance having a high hole-transporting property, a substance having a high electron-injecting property, a substance having a high hole-injecting property, a bipolar substance (a substance having a high electron-transporting property and a high hole-transporting property), a hole blocking material, or the like may freely be combined.

Figure 9A:
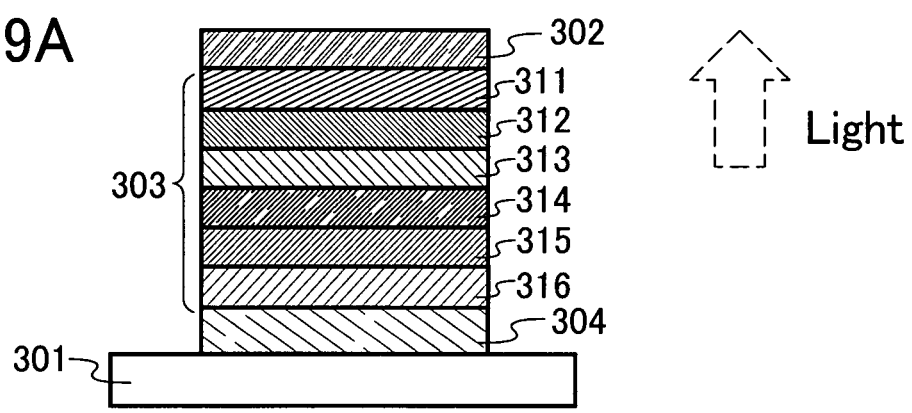
FIGS. 9A and 9B each illustrate a light-emitting element included in a display device of the present invention.
Figure 9B:
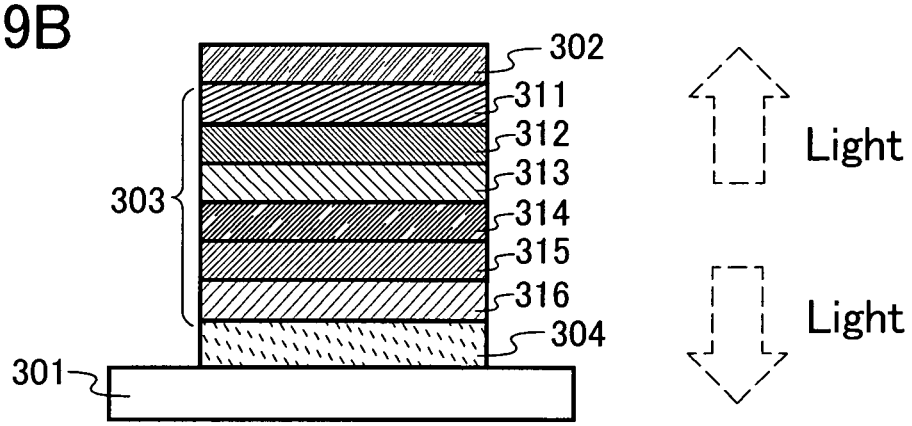

A light-emitting element shown in each of FIGS. 9A and 9B has a structure in which the second electrode 304 serving as an anode, the sixth layer 316 containing a substance having a high hole-injecting property, the fifth layer 315 containing a substance having a high hole-transporting property, the fourth layer 314 containing a substance having a high light-emitting property, the third layer 313 containing a substance having a high electron-transporting property, the second layer 312 containing a substance having a high electron-injecting property, the first layer 311 containing a substance having a high electron-transporting property and a substance which shows an electron-donating property with respect to the substance having a high electron-transporting property, and the first electrode 302 serving as a cathode over the substrate 301.

In a similar manner to the light-emitting elements shown in FIGS. 8A and 8B, light, which is emitted, is extracted outside through one or both the first electrode 302 and the second electrode 304. Note that, since the first electrode 302 is formed using a composite material having a high light-transmitting property, it is preferable to have a structure in which the light is extracted outside through the first electrode. In a case where only the first electrode 302 has a light-transmitting property, the light is extracted from a side opposite to the substrate through the first electrode 302 as shown in FIG. 9A. Alternatively, in a case where each of the first electrode 302 and the second electrode 304 has a light-transmitting property, the light is extracted from both the substrate side and the side opposite to the substrate through the first electrode 302 and the second electrode 304 as shown in FIG. 9B.

Note that this embodiment mode can appropriately be combined with other embodiment modes.

For example, the layer containing the composite material shown in Embodiment Mode 4 is provided to be in contact with the second electrode serving as an anode, whereby a hole-injecting property from the second electrode can be enhanced.

In addition, the layer containing the composite material shown in Embodiment Mode 4 can also be used as the second electrode serving as an anode. When the layer containing the composite material is used as the second electrode, a hole-injecting layer is not necessarily provided because the layer containing the composite material is excellent in a hole-injecting property. Moreover, the layer containing the composite material is excellent in a light-transmitting property; thus, light emission can efficiently be extracted outside through the first electrode and the second electrode.

Embodiment Mode 6

In this embodiment mode, one mode of the light-emitting element, which is different from that of Embodiment Mode 4, will be explained below with reference to FIG. 10.

In this embodiment mode, a mode of a light-emitting element having a structure in which a plurality of light-emitting units (also described as an EL layer) is stacked (hereinafter, referred to as a stack type element) will be explained with reference to FIG. 10. This light-emitting element is a light emitting element having a plurality of light-emitting units between a first electrode and a second electrode.

Figure 10:
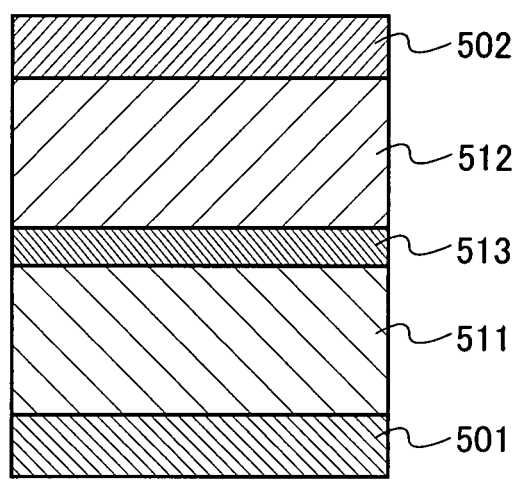
FIG. 10 illustrates a light-emitting element included in a display device of the present invention.

In FIG. 10, a first light-emitting unit 511 and a second light-emitting unit 512 are stacked between a first electrode 501 and a second electrode 502. As the first electrode 501 and the second electrode 502, an electrode similar to that described in Embodiment Modes 4 and 5 can be applied. The structure of the first light-emitting unit 511 and the second light-emitting unit 512 may be the same or different, and as the structure, a structure similar to that described in Embodiment Modes 4 and 5 can be applied.

A charge generation layer 513 includes a composite material of an organic compound and an inorganic compound. The composite material of an organic compound and an inorganic compound is the composite material shown in Embodiment Mode 1, which contains an organic compound and an inorganic compound such as $V_2O_5$, $MoO_3$, or $WO_3$. As the organic compound, various compounds such as an aromatic amine compound, a carbazole derivative, aromatic hydrocarbon, and a high molecular compound (oligomer, dendrimer, polymer, or the like) can be used. An object having a hole mobility of greater than or equal to $1 \times 10^{-6}$ cm$^2$/Vs as a hole-transporting organic compound is preferably applied to the organic compound. However, other substances than those may also be used as long as hole-transporting properties thereof are higher than electron transporting properties thereof. The composite material of an organic compound and an inorganic compound is excellent in a carrier-injecting property and carrier transporting property; therefore, low-voltage driving and low-current driving can be realized.

Note that the charge generation layer 513 may be formed with a combination of the composite material of an organic compound and an inorganic compound, and other materials. For example, the charge generation layer 513 may be formed with a combination of a layer containing the composite material of an organic compound and an inorganic compound, and a layer including one compound selected from electron-donating substances and a compound having a high electron-transporting property. Moreover, the charge generation layer 513 may also be formed with a combination of a layer containing the composite material of an organic compound and an inorganic compound and a light-transmitting conductive film.

In any case, the charge generation layer 513 interposed between the first light-emitting unit 511 and the second light-emitting unit 512 is acceptable as long as electrons are injected into a light-emitting unit on one side and holes are injected into a light-emitting unit on the other side when a voltage is applied to the first electrode 501 and the second electrode 502.

In this embodiment mode, the light-emitting element having two light-emitting units is explained; however, similarly, the present invention can be applied to a light-emitting element in which three or more light-emitting units are stacked. Like the light-emitting element in accordance with this embodiment mode, a plurality of light-emitting units is disposed between a pair of electrodes so as to be partitioned with a charge generation layer, whereby an element with long lifetime in a high luminance region can be realized while current density is kept to be low.

Note that this embodiment mode can appropriately be combined with other embodiment modes.

Embodiment Mode 7

In this embodiment mode, an example of a liquid crystal display device in which a pixel electrode is formed with the composite material explained in Embodiment Mode 1 will be explained with reference to drawings. In this embodiment mode, VA (Vertical Alignment)-type liquid crystal is shown. The VA-type liquid crystal employs a kind of methods for controlling alignment of liquid crystal molecules of a liquid crystal panel. The VA-type liquid crystal is a method whereby liquid crystal molecules are aligned in a vertical direction with respect to a panel surface when no voltage is applied. In this embodiment mode, it is devised to particularly separate pixels into some regions (sub-pixels) so that molecules are aligned in different directions in the respective regions. This is referred to as multi-domain or multi-domain design. In the following explanation, pixels of a liquid crystal panel in which the multi-domain design is taken into consideration will be explained in accordance with a manufacturing process thereof.

Figure 11:
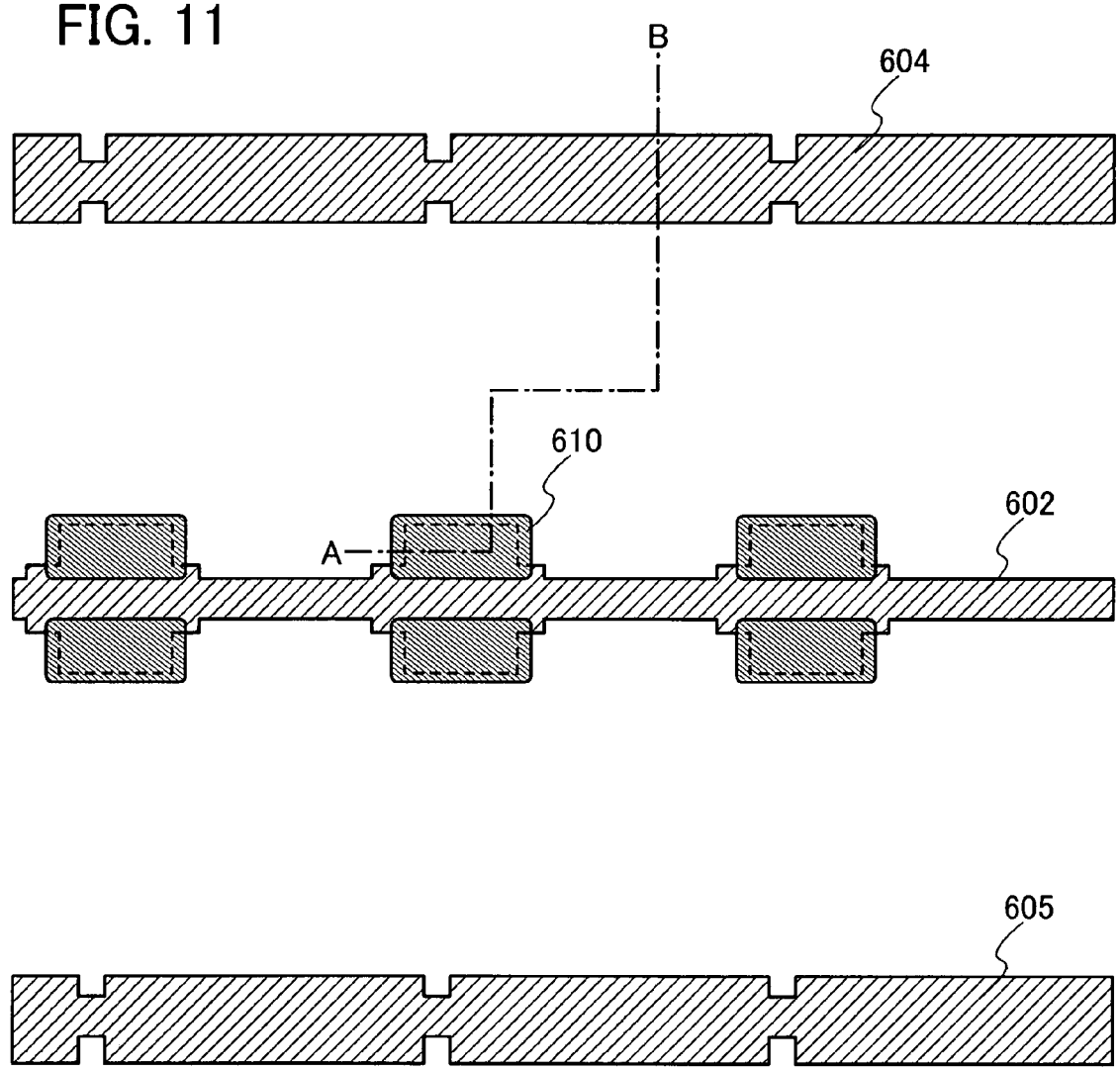
FIG. 11 illustrates a liquid crystal display device in accordance with Embodiment Mode 7.
Figure 12:
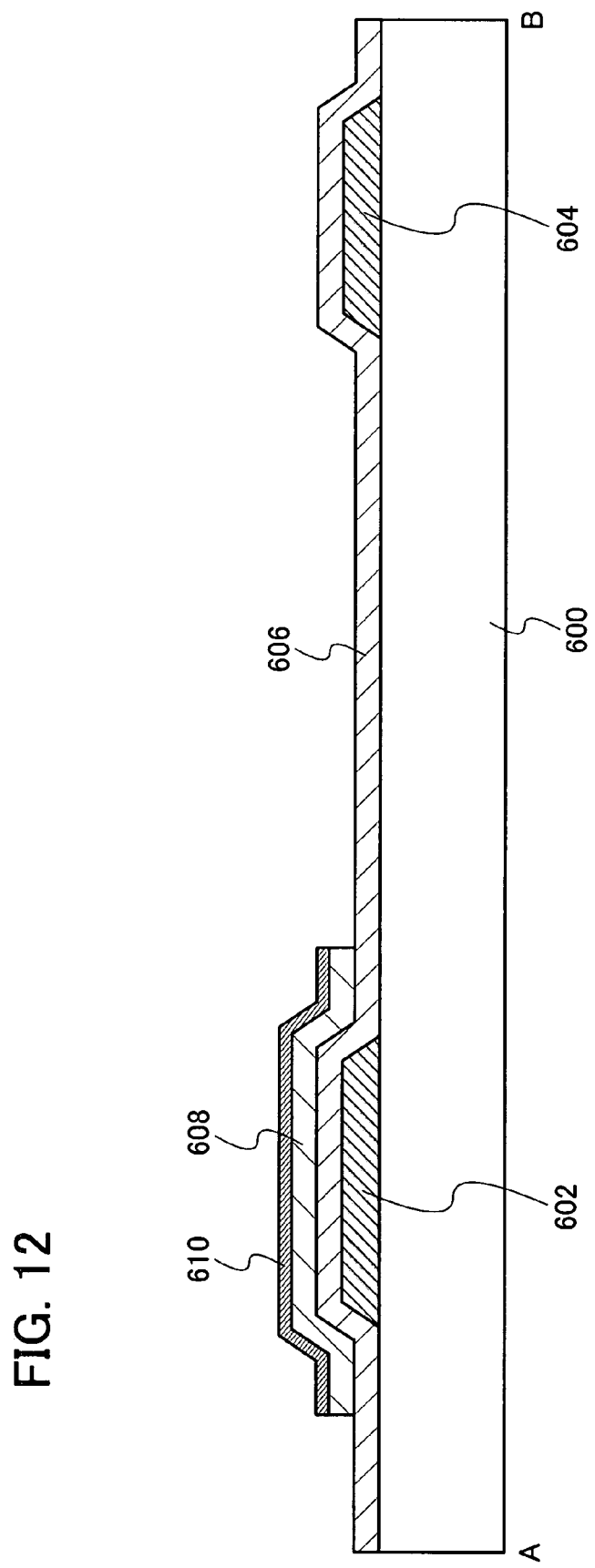
FIG. 12 illustrates a liquid crystal display device in accordance with Embodiment Mode 7.

FIGS. 11 and 12 show a phase where a gate electrode, a gate insulating layer, and a semiconductor layer are formed. Note that FIG. 11 is a plane view, and FIG. 12 shows a cross-sectional structure taken along a line A-B shown in FIG. 11. The following explanation will be made with reference to both the figures.

As a substrate 600, a plastic substrate having heat resistance that can withstand a processing temperature of a manufacturing process, or the like can be used in addition to a non-alkaline glass substrate manufactured by a fusion method or a float method such as barium borosilicate glass, an alumino borosilicate glass, or an aluminosilicate glass, or a ceramic substrate. Alternatively, a metal substrate such as a stainless alloy, of which surface is provided with an insulating layer, may also be applied.

A gate wiring 602 is formed with a metal such as titanium, molybdenum, chromium, tantalum, tungsten, or aluminum. Aluminum is preferably used to reduce the resistance of the gate wiring 602; however, in this case, an aluminum layer is preferably sandwiched between an upper layer thereof and a lower layer thereof which are formed with a refractory metal such as titanium, molybdenum, or tantalum. This is to prevent corrosion of aluminum and improve heat resistance thereof. Note that the gate wiring 602 serves as a so-called gate electrode in a position where the gate wiring 602 overlaps with a semiconductor layer. Specifically, the gate wiring 602 serves as an electrode that applies a gate voltage in a TFT which is one kind of field-effect transistors. Here, the reference numeral 602 refers to a gate wiring for the convenience of explanation in the following explanation; however, the gate wiring 602 is provided with a structural element as a gate electrode. Moreover, a capacitor wiring 604 is formed using the same layer. The capacitor wiring 604 is one of electrodes of a storage capacitor which is provided to hold a voltage applied to a pixel.

A first insulating layer 606 is formed over the gate wiring 602 and the capacitor wiring 604. Silicon nitride or the stack of silicon nitride and silicon oxide is preferably used to form the first insulating layer 606. The first insulating layer 606 is used as a gate insulating layer. The first insulating layer 606 is formed by a sputtering method or a plasma CVD method. In order to form a dense insulating film having less gate leak current at a low film formation temperature, a rare gas element such as argon may be contained into a reactive gas to be mixed into an insulating film.

Next, a semiconductor layer 608 is formed. The semiconductor layer 608 is preferably formed with hydrogenated amorphous silicon or hydrogenated microcrystalline silicon. A film of hydrogenated amorphous silicon or hydrogenated microcrystalline silicon is formed with a thickness of 100 to 250 nm by a plasma CVD method, using silane or disilane as a semiconductor material gas. Alternatively, a sputtering method may also be used. The semiconductor layer 608 is formed to overlap with the gate wiring 602 with the first insulating layer 606 interposed therebetween. Further, a film of n-type hydrogenated amorphous silicon or microcrystalline silicon is formed with a thickness of 20 to 50 nm as an n-type semiconductor layer 610 over the semiconductor layer 608 in order to form source and drain regions of a TFT.

In addition, an organic semiconductor can be applied as the semiconductor layer 608. As the organic semiconductor, a π-electron conjugated high-molecular material in which the skeleton includes conjugated double bonds is preferably used. Typically, a high-molecular material that is soluble in a solvent such as polythiophene, polyfluorene, poly(3-alkylthiophene), or a polythiophene derivative can be used.

Figure 13:
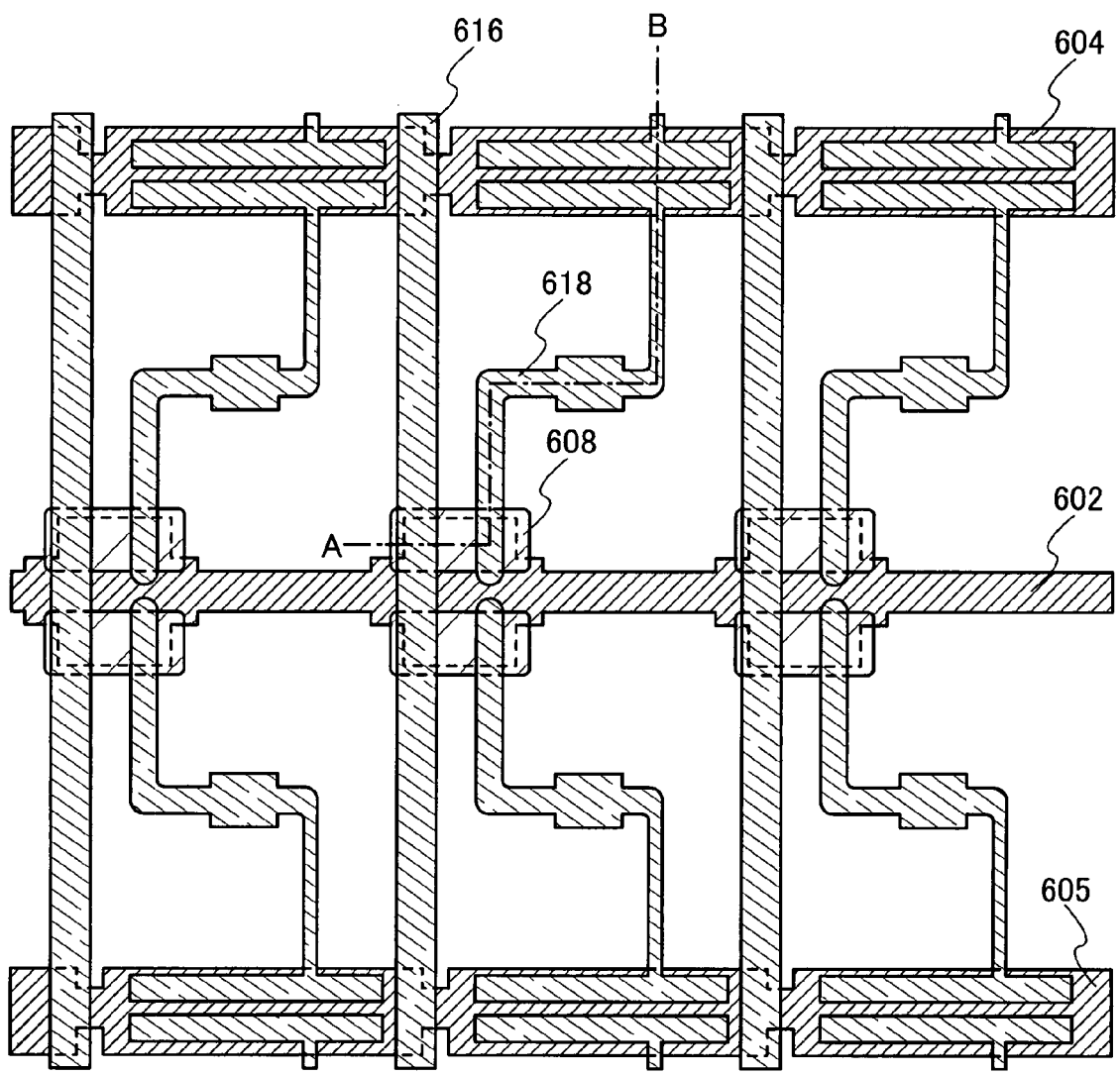
FIG. 13 illustrates a liquid crystal display device in accordance with Embodiment Mode 7.
Figure 14:
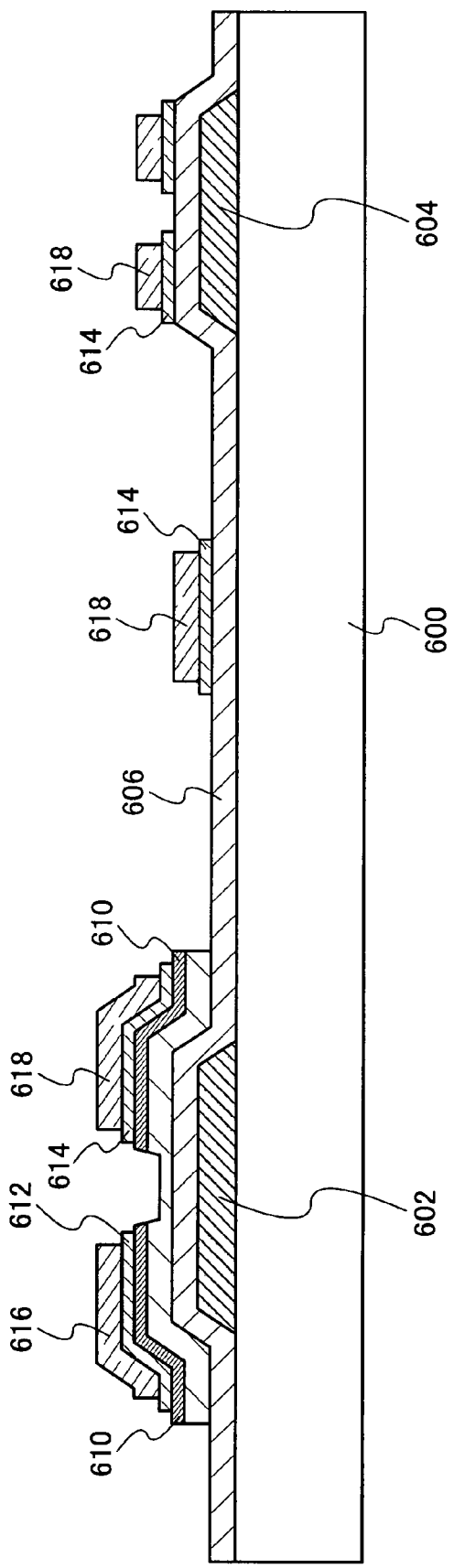
FIG. 14 illustrates a liquid crystal display device in accordance with Embodiment Mode 7.

FIGS. 13 and 14 show a phase where a wiring is formed. Note that FIG. 13 is a plane view, and FIG. 14 shows a cross-sectional structure taken along a line A-B shown in FIG. 13. The following explanation will be made with reference to both the figures.

Wirings 616 and 618 are preferably formed using aluminum; an element for improving heat resistance such as copper, silicon, titanium, neodymium, or scandium; or aluminum added with an element for preventing a hillock. As the wirings 616 and 618, an aluminum film is formed by a sputtering method or a vapor deposition method, and a predetermined pattern is formed using a photolithography technique. Alternatively, the wirings 616 and 618 may also be formed using a conductive nanopaste such as silver or copper by a screen-printing method, an ink-jet method, or a nano-imprinting method. Wirings 612 and 614 each serving as a barrier metal which improves adhesiveness of the wirings 616 and 618 and prevents diffusion to a base may be formed between the wirings 616 and 618, and the n-type semiconductor layer 610. The wiring 616 stacked over the wiring 612 and the wiring 618 stacked over the wiring 614 collectively serve as a wiring, substantially. Note that the wiring 616 is a data line for forming a matrix of a pixel portion and the wiring 618 is a wiring for connecting a TFT 628 and a pixel electrode 624.

The wirings 614 and 618 have a region that overlaps with the capacitor wiring 604 with the first insulating layer 606 interposed therebetween. This overlapping region becomes a storage capacitor portion in a pixel of this liquid crystal panel.

After the wirings 616 and 618 are formed, the n-type semiconductor layer 610 is etched using the wirings as etching masks. The wirings 616 and 618 are formed separately over the semiconductor layer 608. The n-type semiconductor layer 610 between the wirings 616 and 618 is etched and removed, whereby a channel formation region of the TFT is formed.

Figure 15:
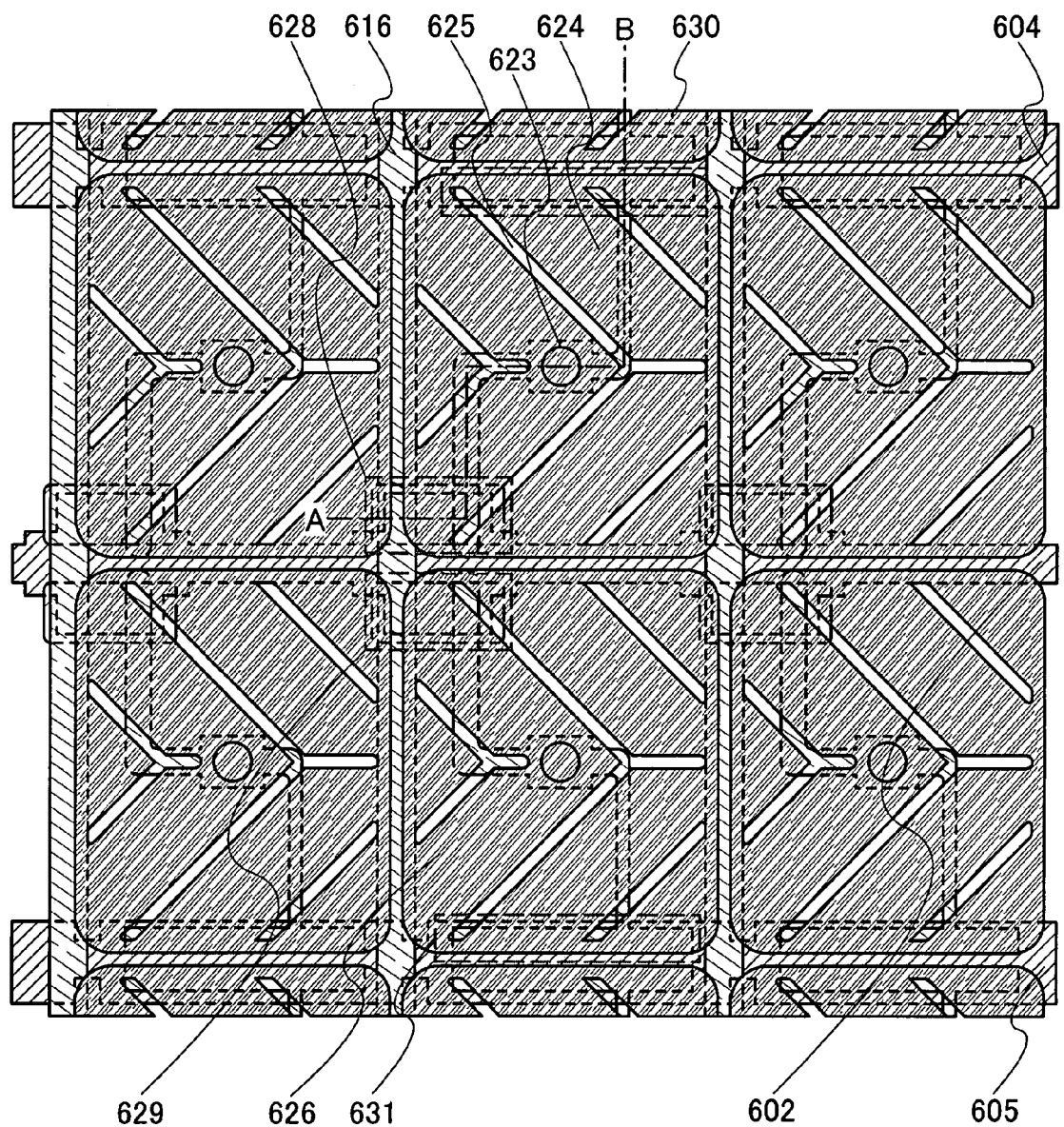
FIG. 15 illustrates a liquid crystal display device in accordance with Embodiment Mode 7.
Figure 16:
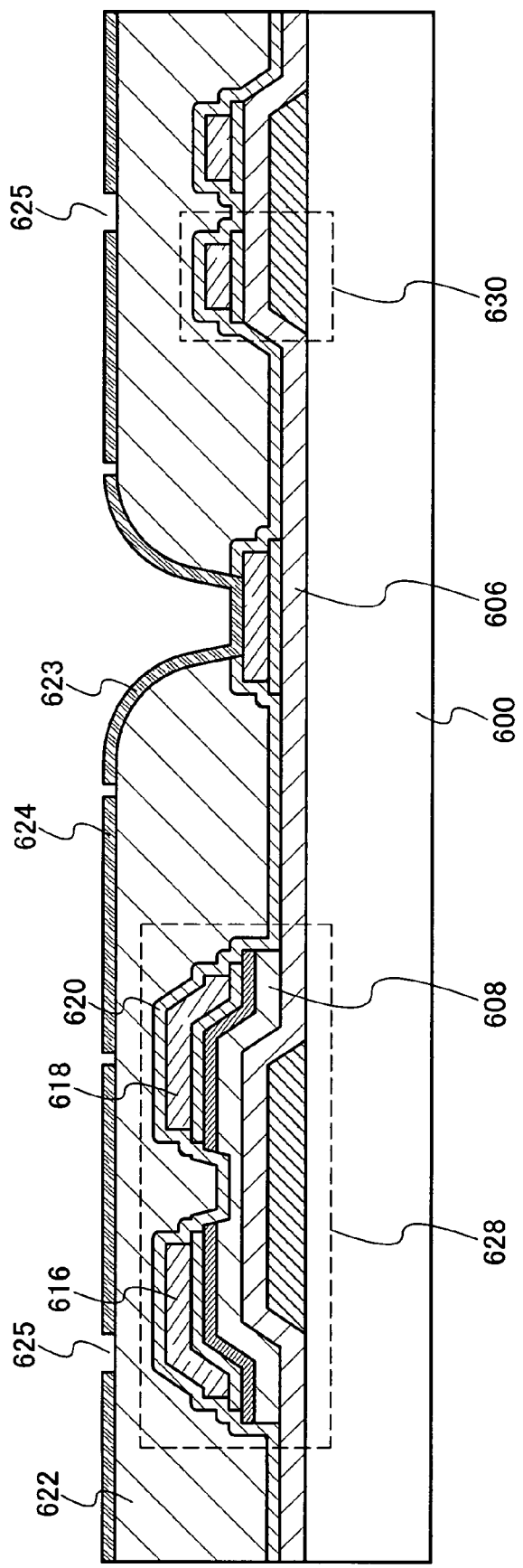
FIG. 16 illustrates a liquid crystal display device in accordance with Embodiment Mode 7.

FIGS. 15 and 16 show a phase where the pixel electrode is formed. Note that FIG. 15 is a plane view, and FIG. 16 shows a cross-sectional structure taken along a line A-B shown in FIG. 15. The following explanation will be made with reference to both the figures.

A second insulating layer 620 is formed over the wirings 616 and 618. The second insulating layer 620 is preferably formed with silicon nitride or silicon nitride oxide. The second insulating layer 620 is formed as a protective film that prevents contamination of the semiconductor layer 608. In addition, the second insulating layer 620 also serve as an interlayer insulating film that separates the wirings 616 and 618 from the pixel electrode. A third insulating layer 622 is preferably formed over the second insulating layer 620 in order to planarize the surface. The third insulating layer 622 is preferably formed with an organic resin material typified by polyimide, acrylic, or the like. The area of the pixel electrode 624 can be increased by formation of the third insulating layer 622 as a planarizing film between the wirings 616 and 618, and the pixel electrode 624; therefore, aperture ratio can be improved.

The pixel electrode 624 is formed over the third insulating layer 622. The pixel electrode 624 is connected to the wiring 618 through a contact hole 623 that penetrates the second insulating layer 620 and the third insulating layer 622. The pixel electrode 624 is formed using the composite material shown in Embodiment Mode 1. The composite material can form an ohmic contact with the wiring 618 formed with a metal material such as aluminum. In addition, by selection of the kind of the organic compound contained in the composite material, a composite material that does not have an absorption peak in a wavelength region of 450 to 800 nm can be obtained. The pixel electrode 624 can be formed with a thickness of 50 to 100 nm. Accordingly, illumination light of a backlight can effectively be used when the pixel electrode 624 is used as a pixel electrode of the liquid crystal panel.

The pixel electrode 624 is provided with a slit 625. The slit 625 is provided to control orientation of liquid crystals.

In such a manner, the TFT 628, the pixel electrode 624 connected to the TFT 628, and a storage capacitor portion 630 are formed over the substrate 600. The same can be said for a TFT 629, a pixel electrode 626 connected to the TFT 629, and a storage capacitor portion 631 shown in FIG. 15. Both the TFTs 628 and 629 are connected to the wiring 616. Each pixel of this liquid crystal panel includes the pixel electrodes 624 and 626. The pixel electrodes 614 and 626 are a sub-pixel.

Figure 19:
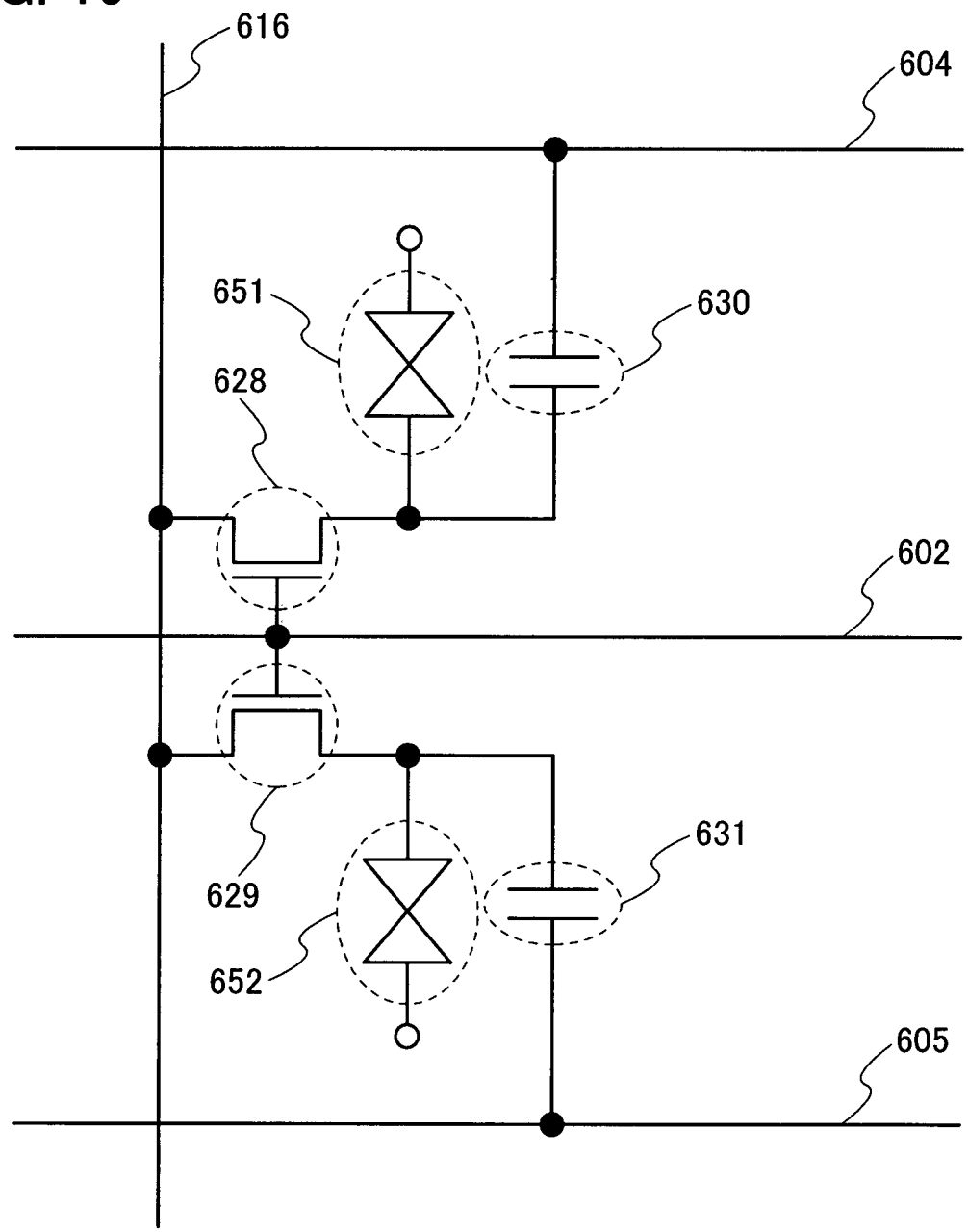
FIG. 19 illustrates a liquid crystal display device in accordance with Embodiment Mode 7.

FIG. 19 shows an equivalent circuit of this pixel structure. Both the TFTs 628 and 629 are connected to the gate wiring 602 and the wiring 616. In this case, the potential of the capacitor wiring 604 is made different from that of the capacitor wiring 604, whereby an operation of a liquid crystal element 651 can be made different from that of a liquid crystal element 652. Specifically, each potential of the capacitor wirings 604 and 605 is individually controlled, whereby orientation of liquid crystals is precisely controlled to expand a viewing angle.

Figure 17:
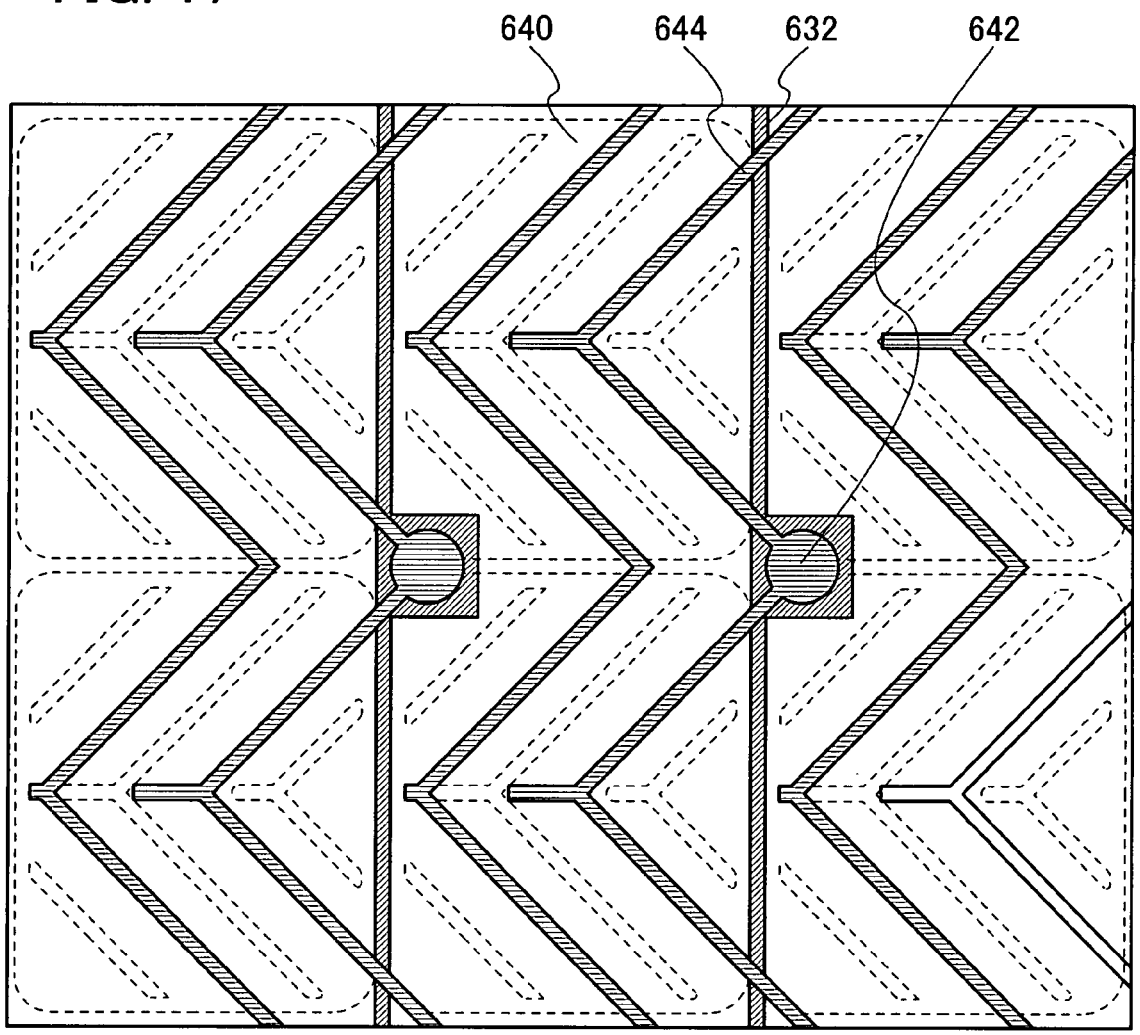
FIG. 17 illustrates a liquid crystal display device in accordance with Embodiment Mode 7.

FIG. 17 shows a structure of an opposite substrate side. A light-shielding layer 632 is provided with an opposite electrode 640. The opposite electrode 640 is preferably formed using the composite material shown in Embodiment Mode 1 similarly to the pixel electrode 624. Alternatively, the opposite electrode 640 may also be formed with a light-transmitting conductive film such as indium oxide, indium tin oxide, or zinc oxide. A projection 644 that controls orientation of liquid crystals is formed over the opposite electrode 640. Moreover, a spacer 642 is formed in accordance with the position of the light-shielding layer 632.

Figure 18:
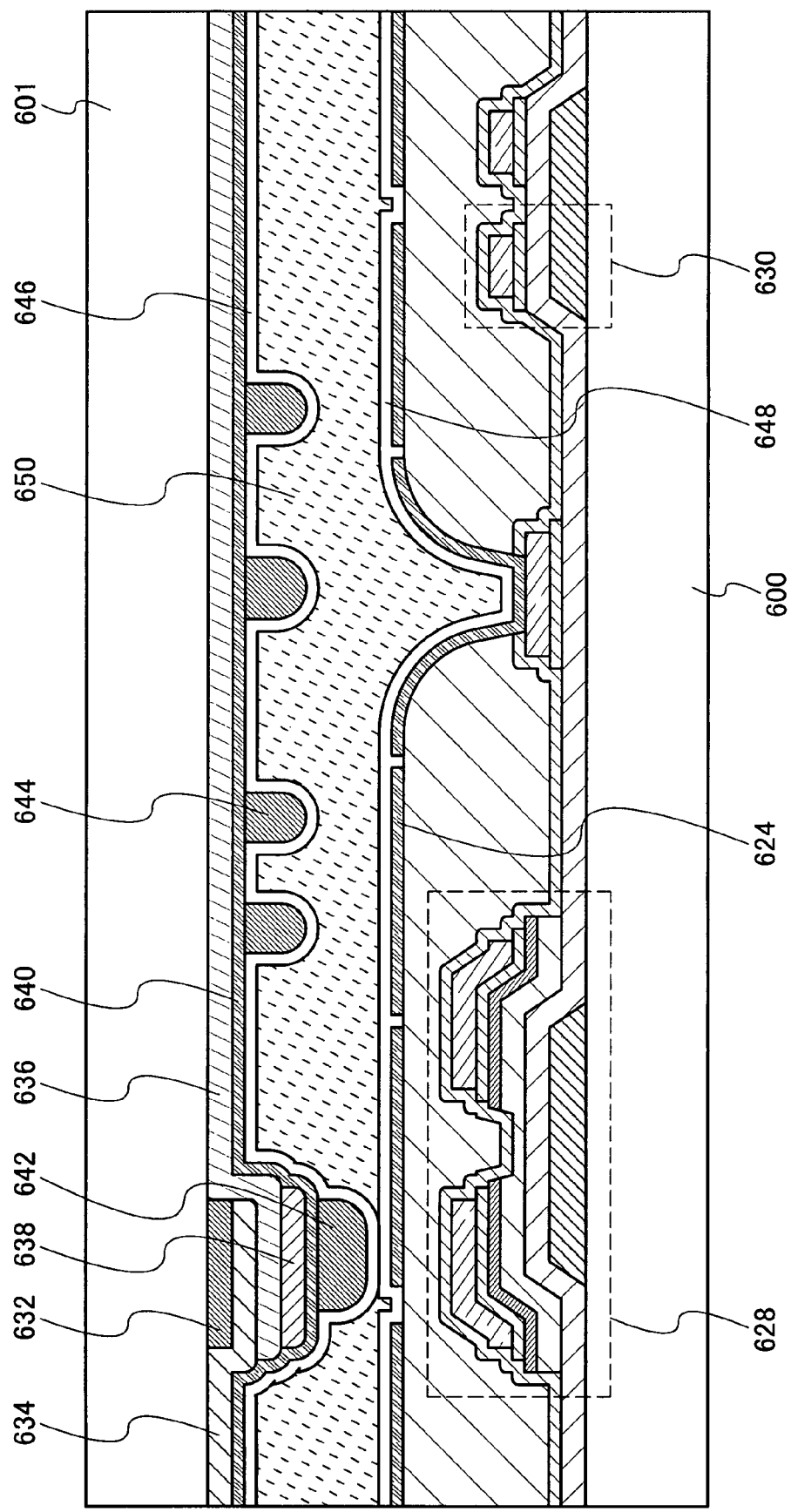
FIG. 18 illustrates a liquid crystal display device in accordance with Embodiment Mode 7.

FIG. 18 shows a state where the substrate 600, over which the TFT 628, the pixel electrode 624 connected to the TFT 628, and the storage capacitor portion 630 are formed, is overlapped with an opposite substrate 601 provided with the opposite electrode 640 and the like, and liquid crystals are injected therebetween. In the position of the opposite substrate 601 where the spacer 642 is formed, the light-shielding layer 632, a first coloring layer 634, a second coloring layer 636, a third coloring layer 638, and the opposite electrode 640 are formed. With this structure, the height of the projection 644 for controlling orientation of liquid crystals is made different from that of the spacer 642. An orientation film 648 is formed over the pixel electrode 624, and the opposite electrode 640 is similarly provided with an orientation film 646. A liquid crystal layer 650 is formed between the orientation films 648 and 646.

Figure 20:
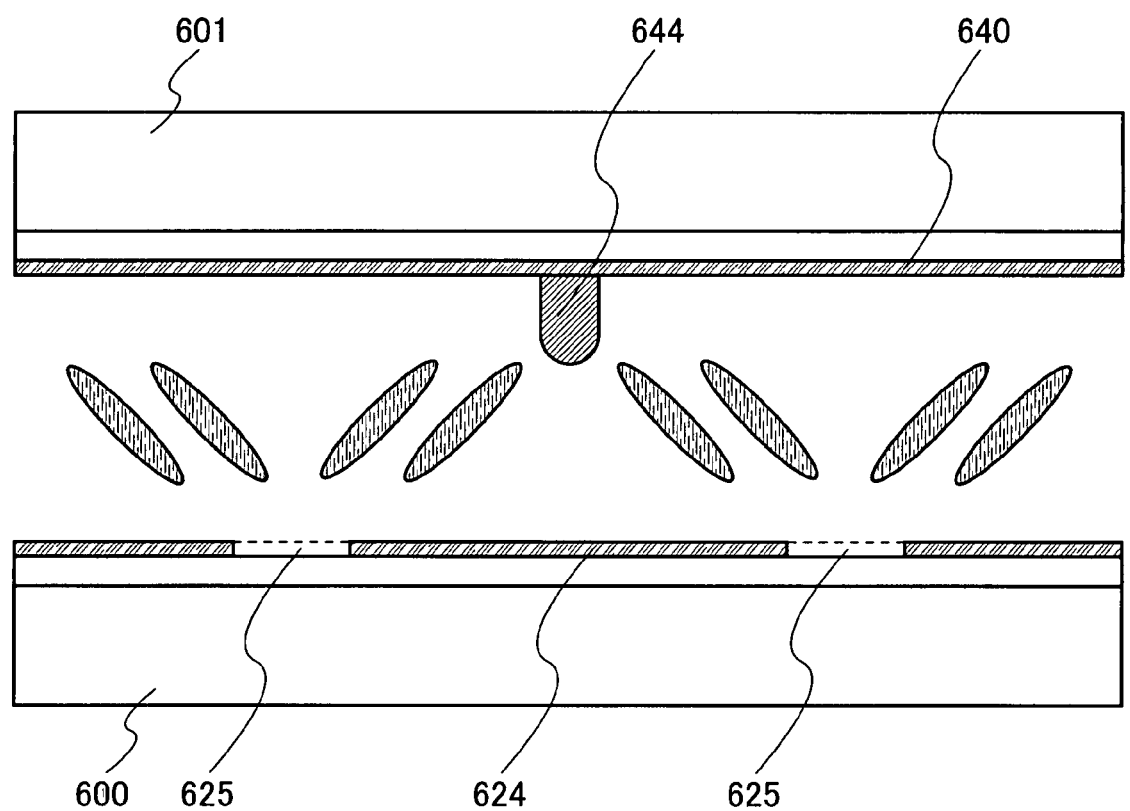
FIG. 20 illustrates a liquid crystal display device in accordance with Embodiment Mode 7.

FIG. 20 illustrates an operation of a liquid crystal panel having such a pixel structure. When a voltage is applied to the pixel electrode 624 provided with the slit 625, distortion of an electric field (an oblique electric field) is generated in the vicinity of the slit 625. This slit 625 is disposed so as to alternately mesh with the projection 644 on the side of the opposite substrate 601 and an oblique electric field is generated effectively to control orientation of liquid crystals, whereby the direction in which liquid crystals are oriented is made different depending on a place. Specifically, a viewing angle of liquid crystal panel is expanded by multi-domain.

In such a manner, the liquid crystal panel can be manufactured using the composite material, in which an organic compound and an inorganic compound are composed, for the pixel electrode. With the use of such a pixel electrode, there is no need to use a light-transmitting conductive film containing indium as its main component; thus, a bottleneck in raw material can be resolved.

Embodiment Mode 8

In this embodiment mode, an example of a liquid crystal display device in which a pixel electrode is formed with the composite material explained in Embodiment Mode 1 will be explained with reference to drawings. In this embodiment mode, another mode of the VA-type liquid crystal will be shown.

Figure 21:
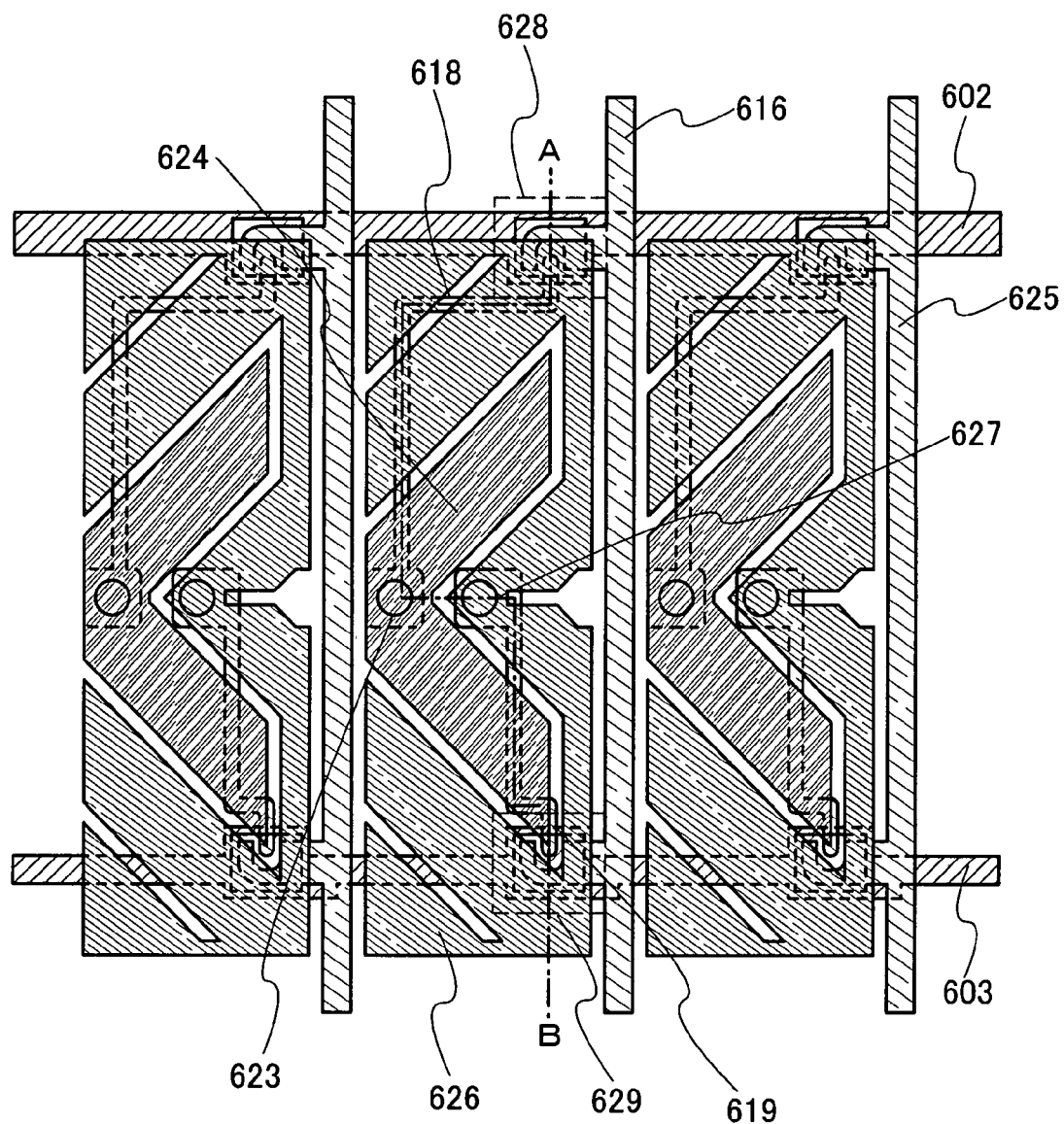
FIG. 21 illustrates a liquid crystal display device in accordance with Embodiment Mode 8.
Figure 22:
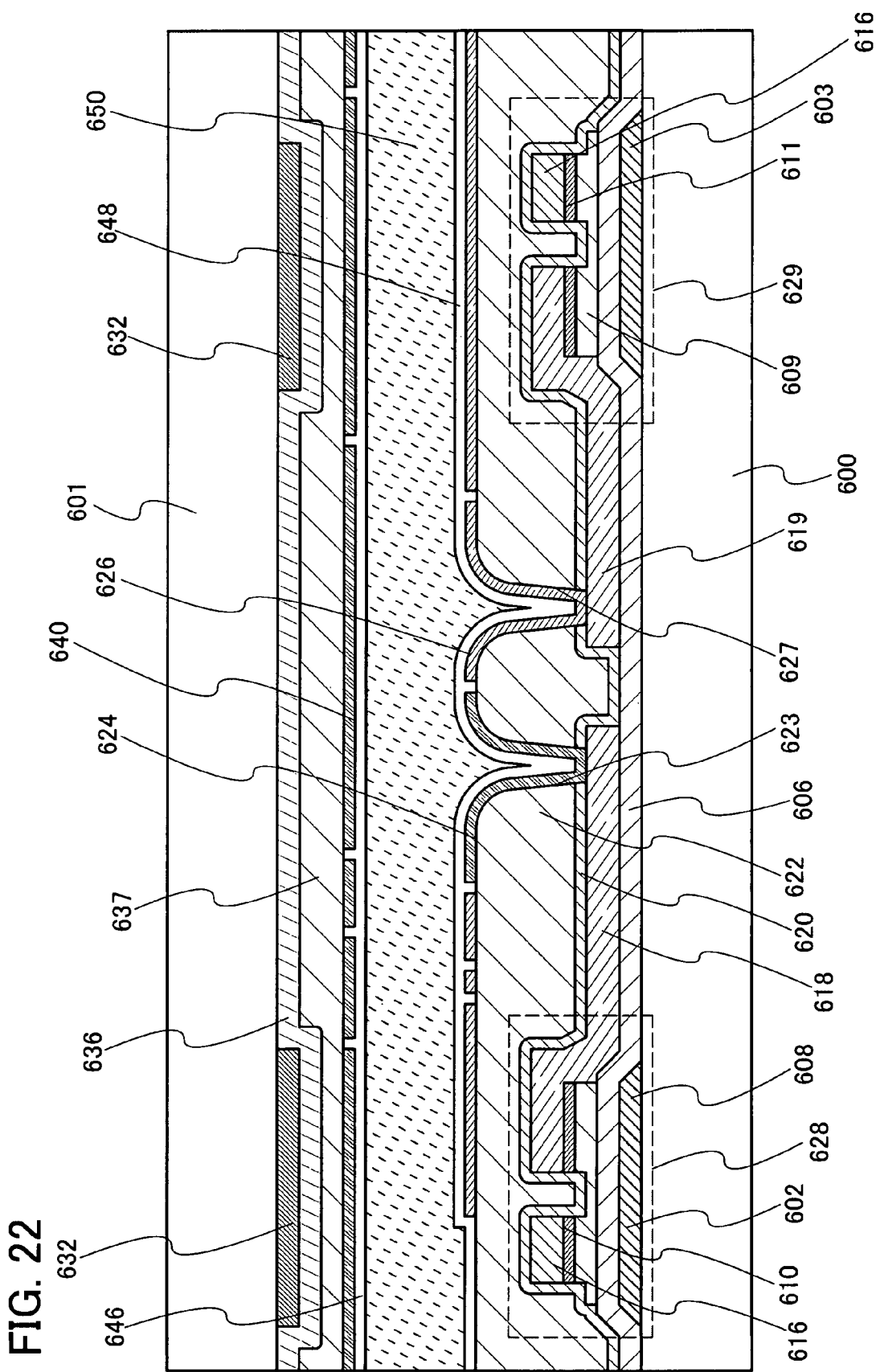
FIG. 22 illustrates a liquid crystal display device in accordance with Embodiment Mode 8.

FIGS. 21 and 22 show a pixel structure of a VA-type liquid crystal panel. FIG. 21 is a plane view, and FIG. 22 shows a cross-sectional structure taken along a line A-B shown in FIG. 21. The following explanation will be made with reference to both the figures. In addition, elements the same as those in Embodiment Mode 7 will be denoted by the same reference numerals and detailed explanation thereof will be omitted.

In this pixel structure, one pixel has a plurality of pixel electrodes, and a TFT is connected to each pixel electrode. Each TFT is formed so as to be driven with a different gate signal. Specifically, a pixel of multi-domain design has a structure in which a signal applied to each pixel electrode is independently controlled.

A pixel electrode 624 is connected to a TFT 628 through a wiring 618 by a contact hole 623. In addition, a pixel electrode 626 is connected to a TFT 629 through a wiring 619 by a contact hole 627. A gate wiring 602 of the TFT 628 is separated from a gate wiring 603 of the TFT 629 so that different gate signals can be supplied. On the other hand, a wiring 616 serving as a data line is shared by the TFTs 628 and 629.

Figure 24:
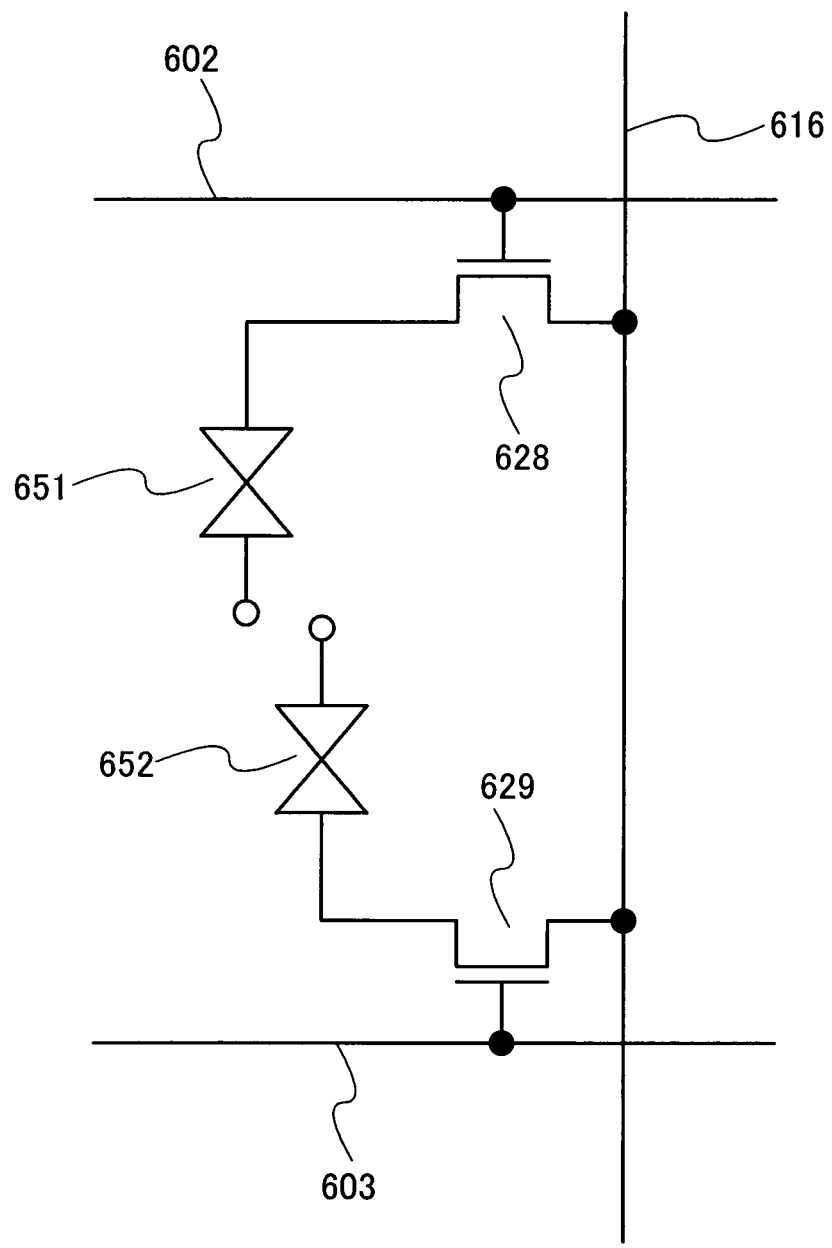
FIG. 24 illustrates a liquid crystal display device in accordance with Embodiment Mode 8.

In a similar manner to Embodiment Mode 7, the pixel electrodes 624 and 626 are formed using the composite material shown in Embodiment Mode 1. The shape of the pixel electrode 624 is different from that of the pixel electrode 626, and the pixel electrodes are separated by a slit 625. The pixel electrode 626 is formed so as to surround the outside of the pixel electrode 624 which is expanded in a V-shape. The timing of voltages applied to the pixel electrodes 624 and 626 is made different by the TFTs 628 and 629, whereby orientation of liquid crystals is controlled. FIG. 24 shows an equivalent circuit of this pixel structure. The TFT 628 is connected to the gate wiring 602, and the TFT 629 is connected to the gate wiring 603. The gate wirings 602 and 603 are each given a different gate signal, whereby operation timing of the TFTs 628 and 629 can be made different.

Figure 23:
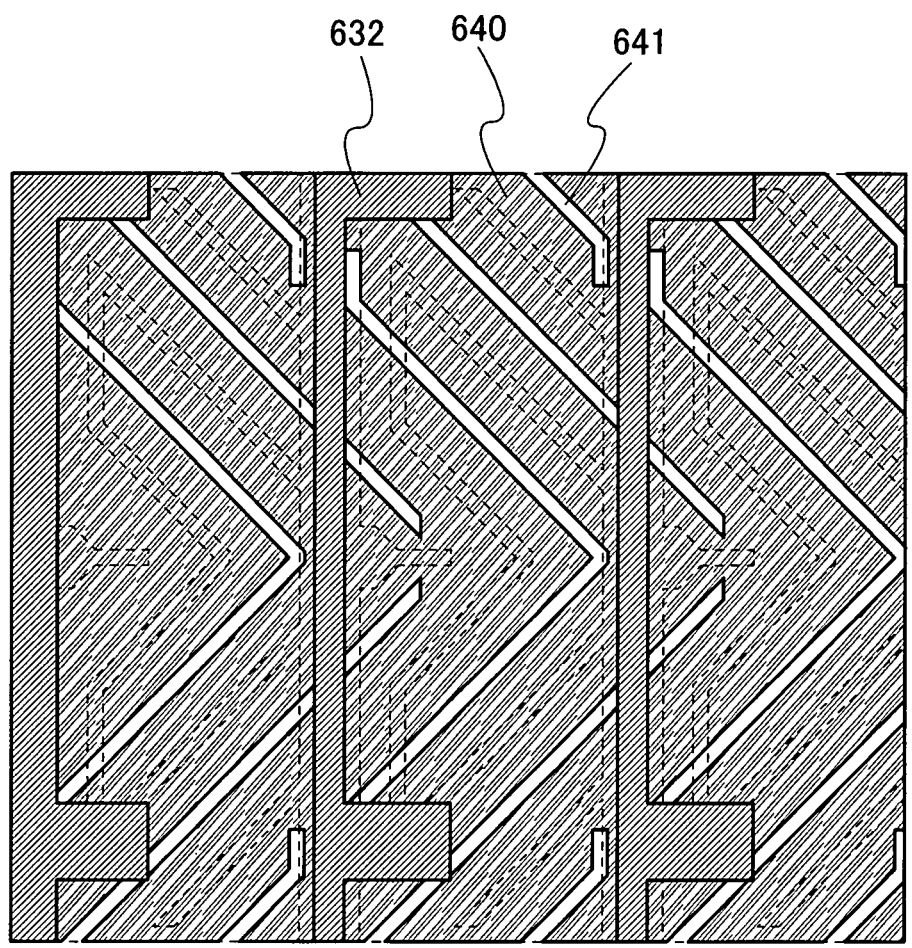
FIG. 23 illustrates a liquid crystal display device in accordance with Embodiment Mode 8.

An opposite substrate 601 is provided with a light-shielding layer 632, a second coloring layer 636, and an opposite electrode 640. In addition, a planarizing film 637 is formed between the second coloring layer 636 and the opposite electrode 640 so that orientation disorder of liquid crystals is prevented. FIG. 23 shows a structure of the opposite substrate side. Although the opposite electrode 640 is an electrode shared by different pixels, a slit 641 is formed. This slit 641 is disposed so as to alternately mesh with the slit 625 on the sides of the pixel electrodes 624 and 626, whereby an oblique electric field is generated effectively to control orientation of liquid crystals. Accordingly, the direction in which liquid crystals are oriented is made different depending on a place, and a viewing angle of the liquid crystal panel is expanded.

In such a manner, the liquid crystal panel can be manufactured using the composite material, in which an organic compound and an inorganic compound are composed, for the pixel electrode. With the use of such a pixel electrode, there is no need to use a light-transmitting conductive film containing indium as its main component; thus, a bottleneck in raw material can be resolved.

Embodiment Mode 9

In this embodiment mode, an example of a liquid crystal display device in which a pixel electrode is formed with the composite material explained in Embodiment Mode 1 will be explained with reference to drawings. In this embodiment mode, an example of a liquid crystal display device in which a transversal electric field method is employed will be shown. The transversal electric field method is a method in which an electric field is applied to liquid crystal molecules in a cell in a horizontal direction, whereby liquid crystals are driven to express gray scales. In accordance with this method, a viewing angle can be expanded up to approximately 180° C. In the following explanation, pixels of a liquid crystal panel in which the transversal electric field method is employed will be explained in accordance with a manufacturing process. Note that elements the same or similar to those in Embodiment Modes 7 and 8 will be denoted by the same reference numerals and detailed explanations thereof will be omitted.

Figure 25:
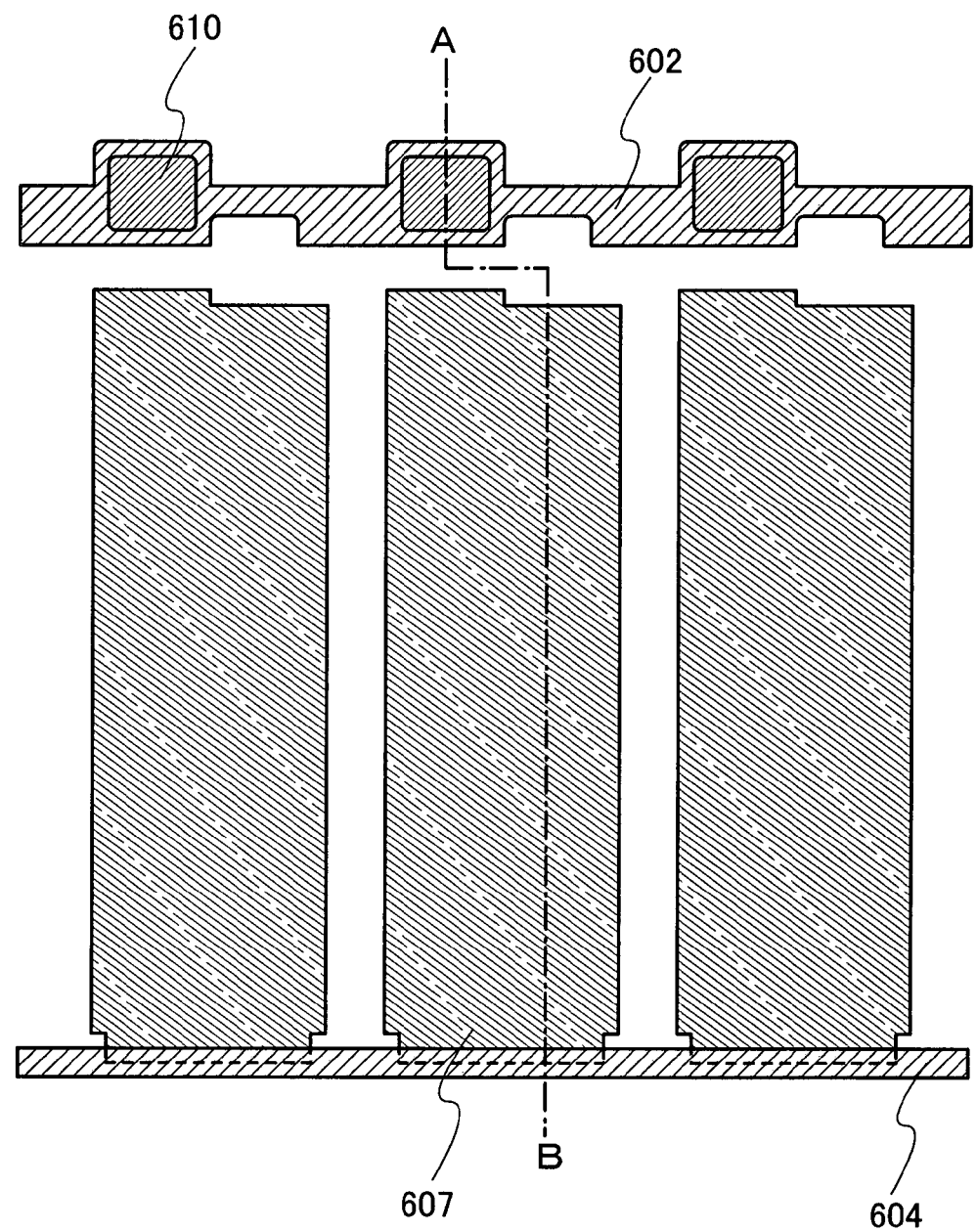
FIG. 25 illustrates a liquid crystal display device in accordance with Embodiment Mode 9.
Figure 26:
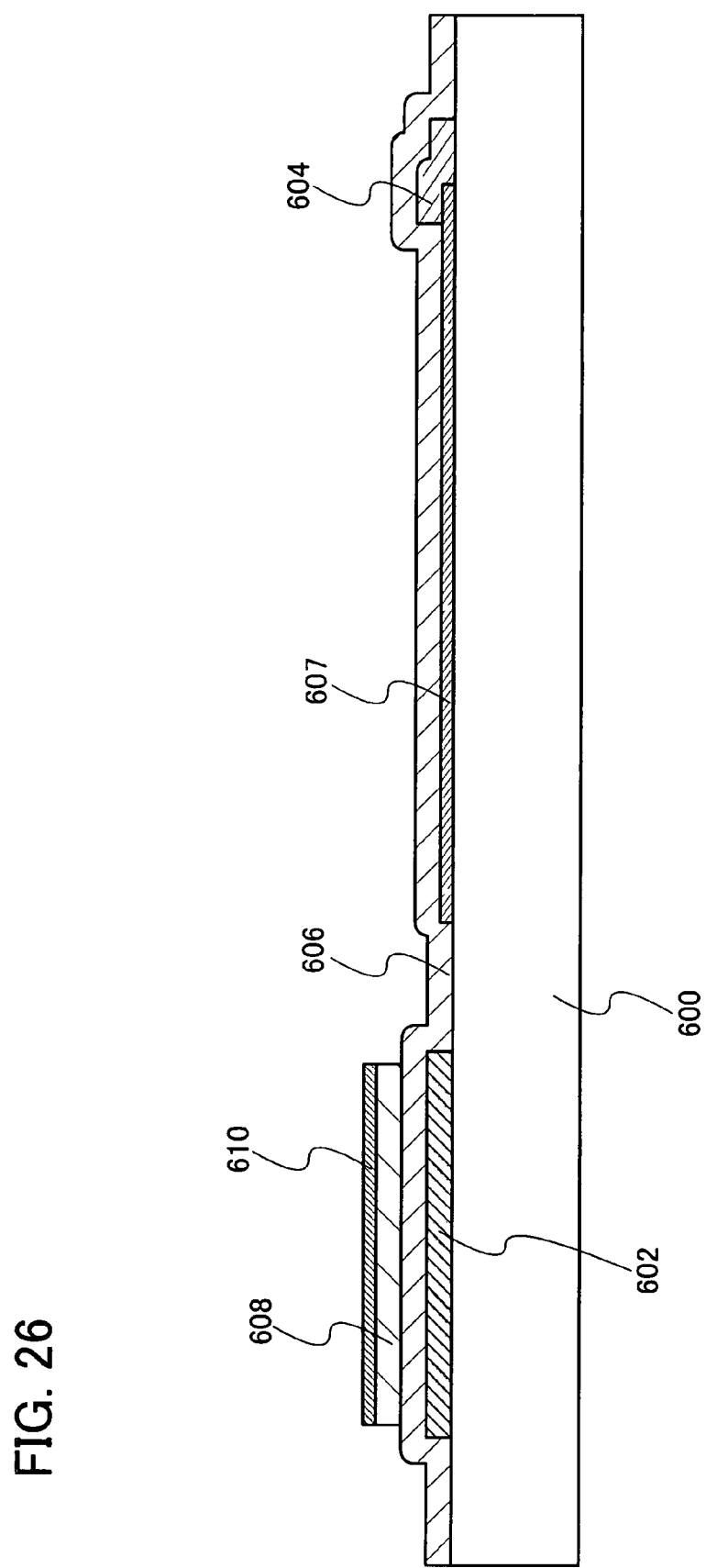
FIG. 26 illustrates a liquid crystal display device in accordance with Embodiment Mode 9.

FIGS. 25 and 26 show a phase where a gate electrode, a gate insulating layer, and a semiconductor layer are formed. Note that FIG. 25 is a plane view, and FIG. 26 shows a cross-sectional structure taken along a line A-B shown in FIG. 25. The following explanation will be made with reference to both the figures.

A first pixel electrode 607 is formed over a substrate 600. The first pixel electrode 607 is formed using the composite material shown in Embodiment Mode 1. The first pixel electrode 607 is formed in a shape which is compartmentalized almost in a pixel. Thereafter, a gate wiring 602 and a capacitor wiring 604 are formed. The capacitor wiring 604 is formed so as to overlap with the first pixel electrode 607.

A first insulating layer 606 is formed so as to cover the entire surfaces of the first pixel electrode 607, the gate wiring 602, and the capacitor wiring 604. Further, a semiconductor layer 608 and an n-type semiconductor layer 610 are formed. The semiconductor layer 608 and the n-type semiconductor layer 610 are formed so that at least part thereof overlaps with the gate wiring 602.

Figure 27:
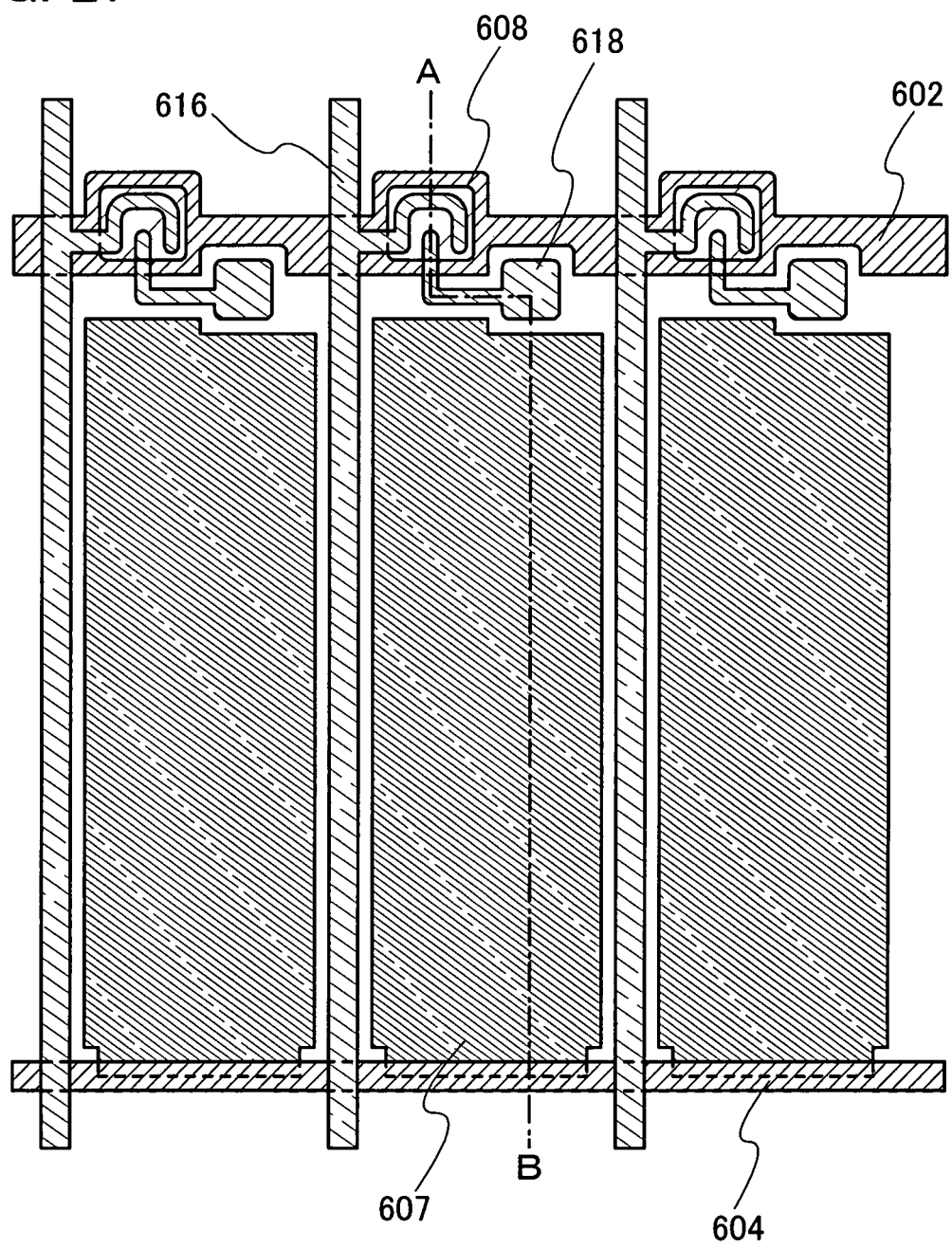
FIG. 27 illustrates a liquid crystal display device in accordance with Embodiment Mode 9.
Figure 28:
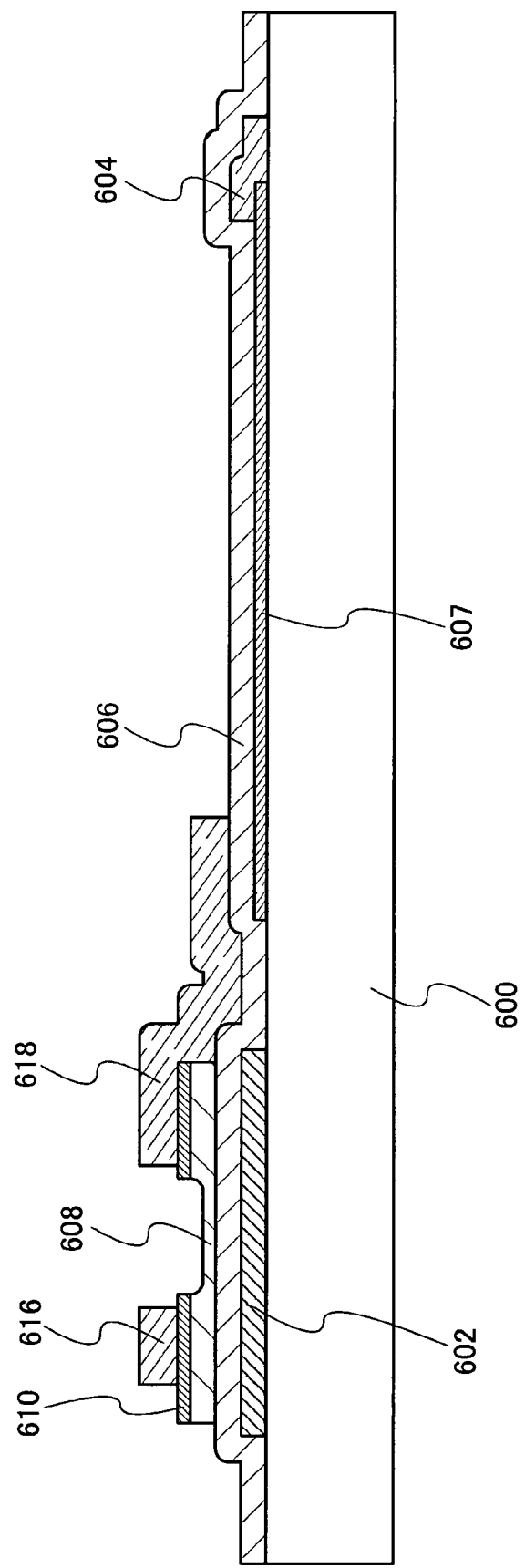
FIG. 28 illustrates a liquid crystal display device in accordance with Embodiment Mode 9.

FIGS. 27 and 28 show a phase where wirings are formed. Note that FIG. 27 is a plane view, and FIG. 28 shows a cross-sectional structure taken along a line A-B shown in FIG. 27. The following explanation will be made with reference to both the figures.

Next, wirings 616 and 618 are formed. The wiring 616, which is a data line that superpose a video signal in the liquid crystal panel, is a wiring that extends in one direction. Simultaneously, the wiring 616 forms contact with the n-type semiconductor layer 610 to be one of source and drain electrodes. The wiring 618, which becomes the other electrode of the source and drain electrodes, is a wiring that forms contact with the pixel electrode.

After the wirings 616 and 618 are formed, the n-type semiconductor layer 610 is etched using the wirings as etching masks. The wirings 616 and 618 are formed separately over the semiconductor layer 608. The n-type semiconductor layer 610 between the wirings 616 and 618 is etched and removed, whereby a channel formation region of a TFT is formed.

Figure 29:
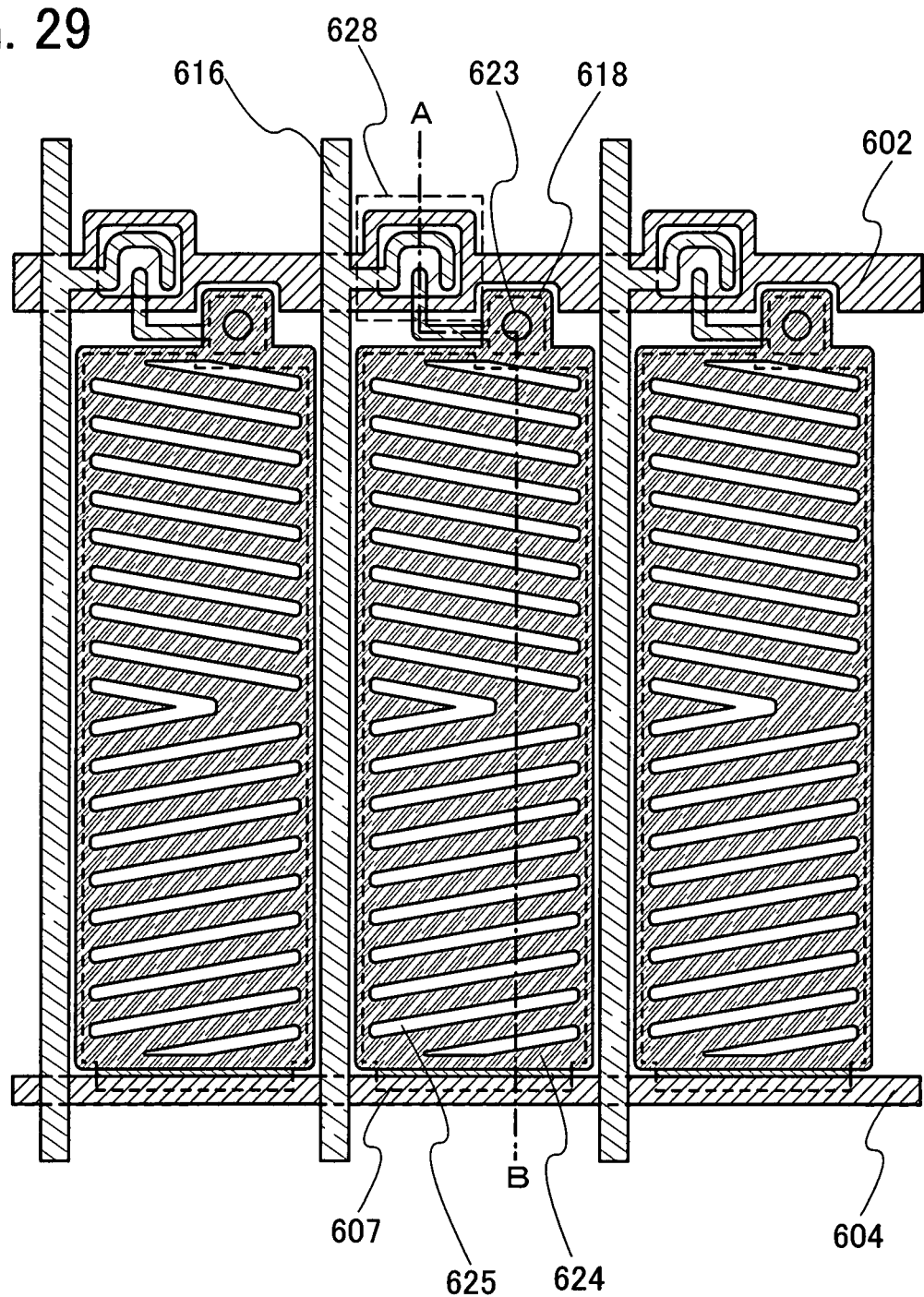
FIG. 29 illustrates a liquid crystal display device in accordance with Embodiment Mode 9.
Figure 30:
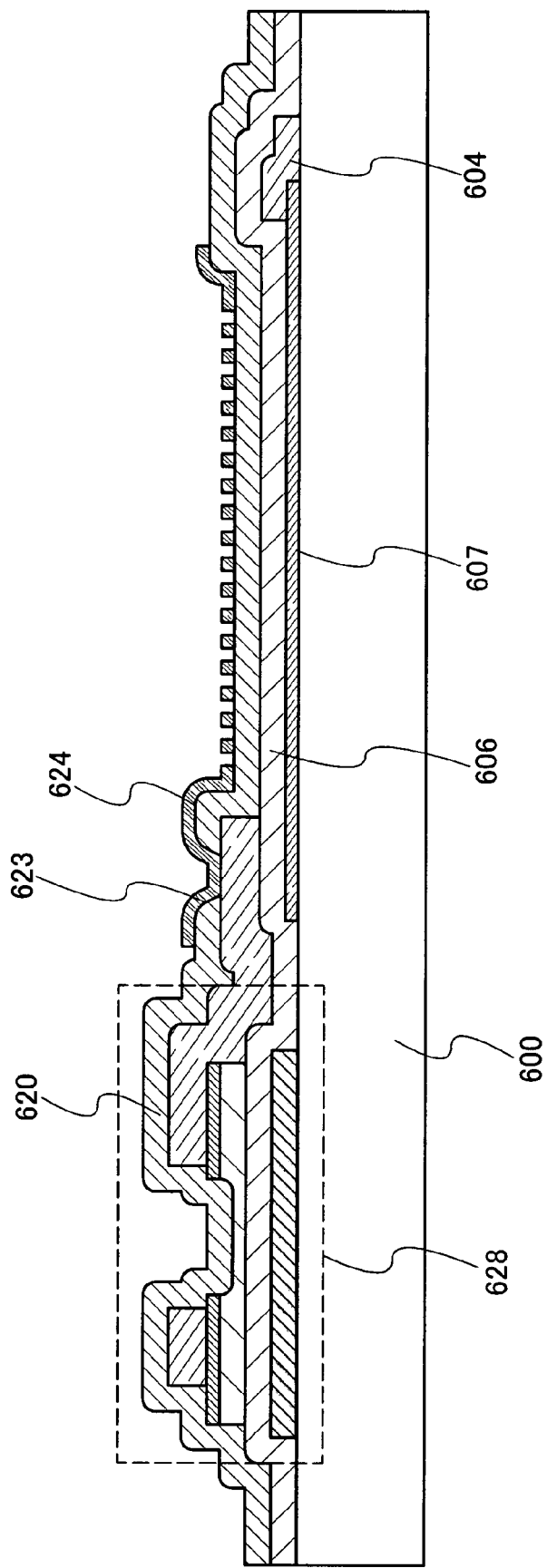
FIG. 30 illustrates a liquid crystal display device in accordance with Embodiment Mode 9.

FIGS. 29 and 30 show a phase where a pixel electrode is formed. Note that FIG. 29 is a plane view, and FIG. 30 shows a cross-sectional structure taken along a line A-B shown in FIG. 29. The following explanation will be made with reference to both the figures.

A second insulating layer 620 is formed over the wirings 616 and 618. The second insulating layer 620 is preferably formed with silicon nitride or silicon nitride oxide. A contact hole 623 is formed in the second insulating layer 620 to form a second pixel electrode 624. The pixel electrode 624 is connected to the wiring 618 through the contact hole 623 that penetrates the second insulating layer 620. The pixel electrode 624 is formed using the composite material shown in Embodiment Mode 1. The composite material can form an ohmic contact with the wiring 618 formed with a metal material such as aluminum. In addition, by selection of the kind of the organic compound contained in the composite material, a composite material that does not have an absorption peak in a wavelength region of 450 to 800 nm can be obtained. This pixel electrode 624 can be formed with a thickness of 50 to 100 nm. Accordingly, illumination light of a backlight can effectively be used when the pixel electrode 624 is used as a pixel electrode of the liquid crystal panel.

The pixel electrode 624 is provided with a slit 625. The slit 625 is provided to control orientation of liquid crystals. In this case, an electric field is generated between the first pixel electrode 607 and the second pixel electrode 624. The first insulating layer 606 is formed between the first pixel electrode 607 and the second pixel electrode 624; however, the first insulating layer 606 is formed with a thickness of 50 to 200 nm, which is thin enough as compared with that of a liquid crystal layer which has a thickness of 2 to 10 μm. Therefore, an electric field is substantially generated in a direction parallel to the substrate 600 (a horizontal direction). The orientation of liquid crystals is controlled by this electric field. Liquid crystal molecules are horizontally rotated with the utilization of an electric field in a direction almost parallel to this substrate. In this case, since the liquid crystal molecules are horizontally oriented in any state, there are a few influences of contrast or the like depending on the angle of viewing; thus, the viewing angle is expanded. In addition, since both the first pixel electrode 607 and the second pixel electrode 624 are light-transmitting electrodes, aperture ratio can be improved.

In such a manner, a TFT 628 and the pixel electrode 624 connected to the TFT 628 are formed over the substrate 600. A storage capacitor is formed between the first pixel electrode 607 and the second pixel electrode 624.

Figure 31:
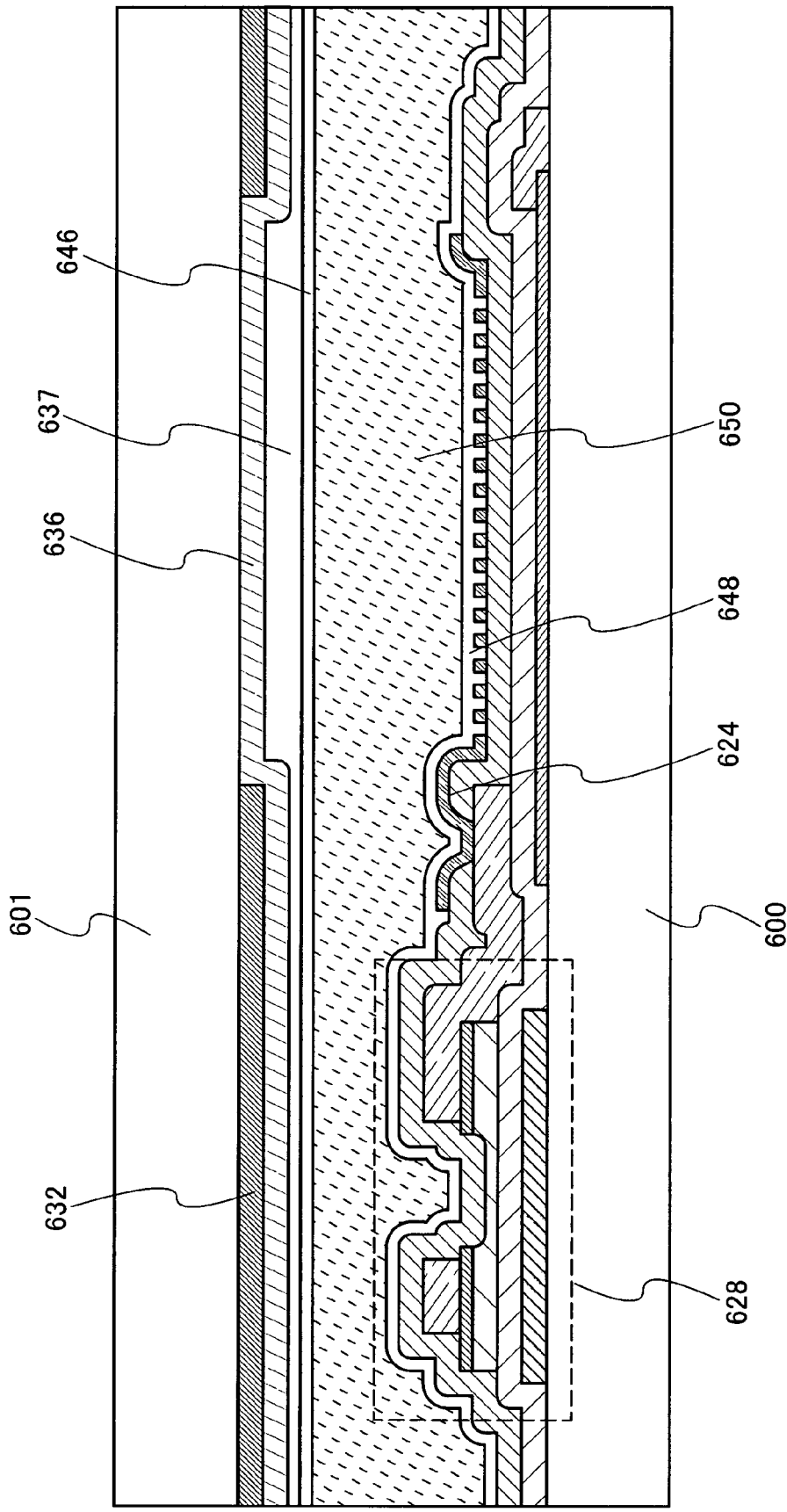
FIG. 31 illustrates a liquid crystal display device in accordance with Embodiment Mode 9.

FIG. 31 shows a state where the substrate 600, over which the TFT 628 and the pixel electrode 624 connected to the TFT 628 are formed, is overlapped with an opposite substrate 601, and liquid crystals are injected therebetween. The opposite substrate 601 is provided with a light-shielding layer 632, a second coloring layer 636, a planarizing film 637, and the like. Since a pixel electrode is formed on the side of the substrate 600, no pixel electrode is provided on the side of the opposite substrate 601. A liquid crystal layer 650 is formed between the substrate 600 and the opposite substrate 601.

In such a manner, the liquid crystal panel can be manufactured using the composite material, in which an organic compound and an inorganic compound are composed, for the pixel electrode. With the use of such a pixel electrode, there is no need to use a light-transmitting conductive film containing indium as its main component; thus, a bottleneck in raw material can be resolved.

Embodiment Mode 10

In this embodiment mode, an example of a liquid crystal display device in which a pixel electrode is formed with the composite material explained in Embodiment Mode 1 will be explained with reference to drawings. In this embodiment mode, another example of a liquid crystal display device in which a transversal electric field method is employed will be shown. In the following explanation, pixels of a liquid crystal panel in which the transversal electric field method is employed will be explained in accordance with a manufacturing process. Note that elements the same or similar to those in Embodiment Mode 9 will be denoted by the same reference numerals and detailed explanations thereof will be omitted.

Figure 32:
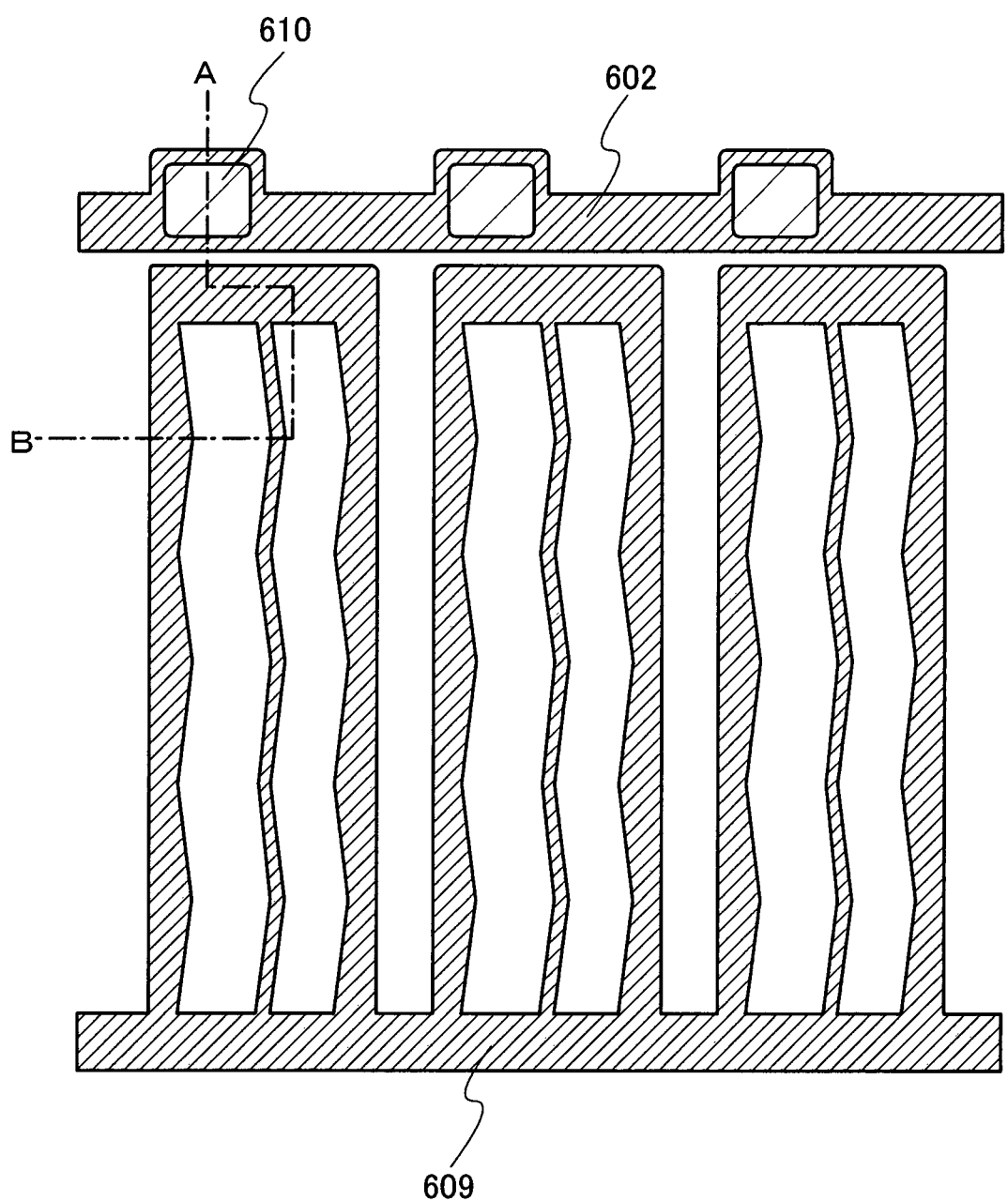
FIG. 32 illustrates a liquid crystal display device in accordance with Embodiment Mode 10.
Figure 33:
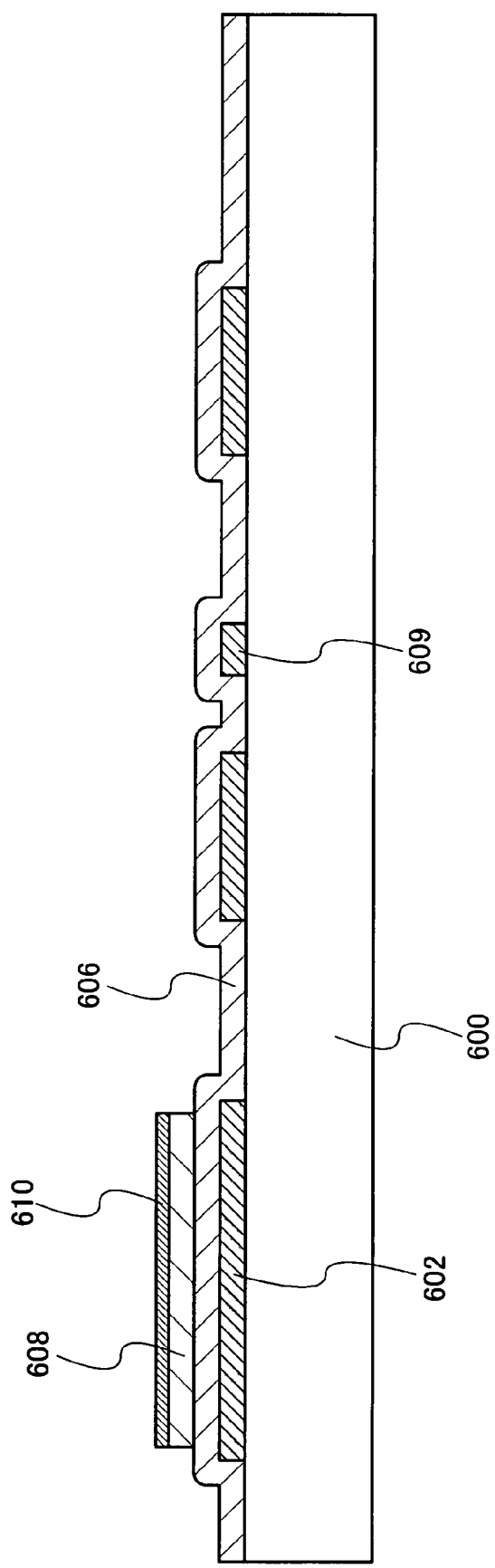
FIG. 33 illustrates a liquid crystal display device in accordance with Embodiment Mode 10.

FIGS. 32 and 33 show a phase where a gate electrode, a gate insulating layer, and a semiconductor layer are formed. Note that FIG. 32 is a plane view, and FIG. 33 shows a cross-sectional structure taken along a line A-B shown in FIG. 32. The following explanation will be made with reference to both the figures.

A gate wiring 602 and a common potential line 609 are formed over a substrate 600. The common potential line 609 is arranged parallel to the gate wiring 602 and formed in a comb shape so as to be one of electrodes that generate a transversal electric field in a pixel.

A first insulating layer 606 is formed so as to cover the entire surfaces of the gate wiring 602 and the common potential line 609. Further, a semiconductor layer 608 and an n-type semiconductor layer 610 are formed. The semiconductor layer 608 and the n-type semiconductor layer 610 are formed so that at least part thereof overlaps with the gate wiring 602.

Figure 34:
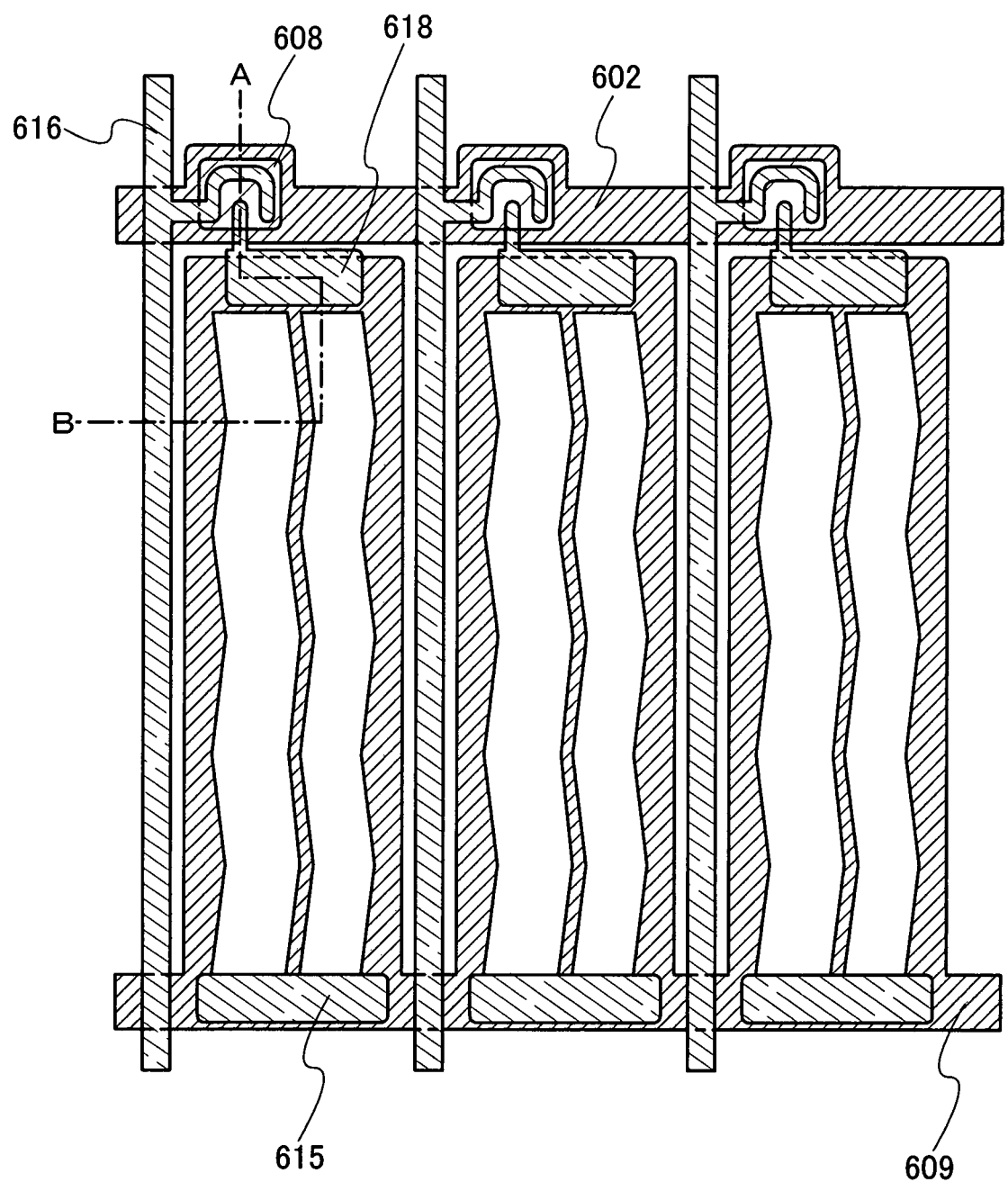
FIG. 34 illustrates a liquid crystal display device in accordance with Embodiment Mode 10.
Figure 35:
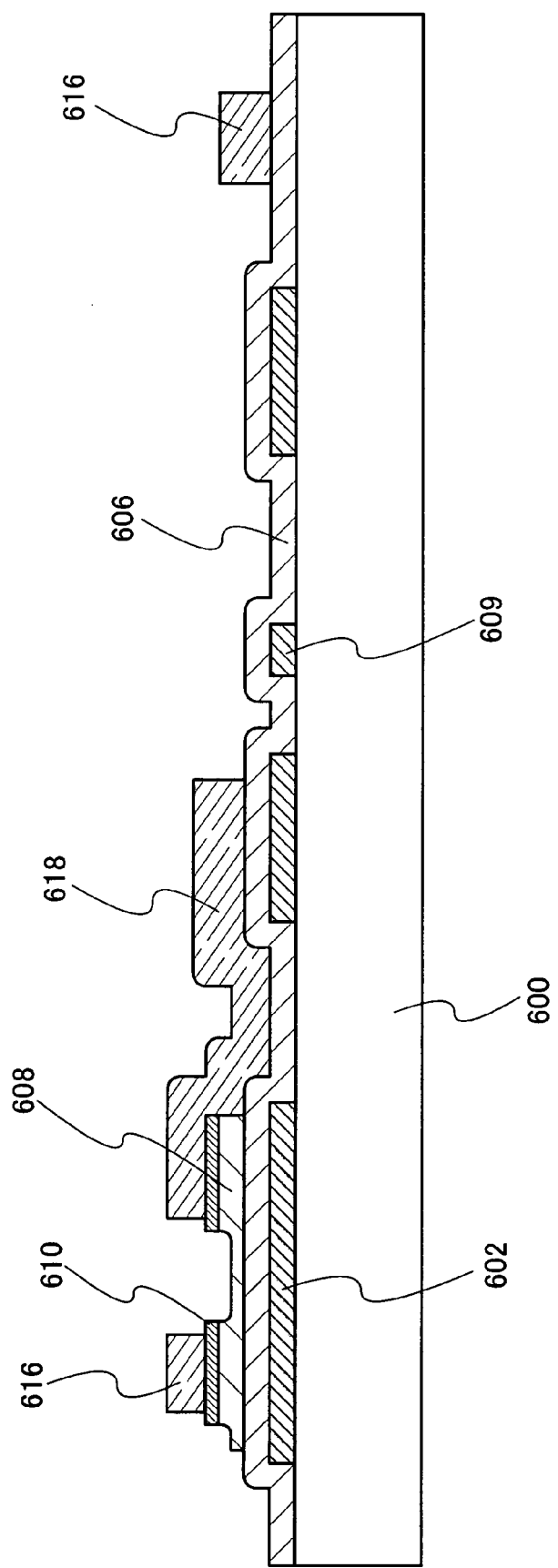
FIG. 35 illustrates a liquid crystal display device in accordance with Embodiment Mode 10.

FIGS. 34 and 35 show a phase where wirings are formed. Note that FIG. 34 is a plane view, and FIG. 35 shows a cross-sectional structure taken along a line A-B shown in FIG. 34. The following explanation will be made with reference to both the figures.

Next, wirings 616 and 618 are formed. The wiring 616, which is a data line that superpose a video signal in the liquid crystal panel, is a wiring that extends in one direction. Simultaneously, the wiring 616 forms contact with the n-type semiconductor layer 610 to be one of source and drain electrodes. The wiring 618, which becomes the other electrode of the source and drain electrodes, is a wiring that forms contact with the pixel electrode. In addition, a capacitor electrode 615 is formed so as to overlap with the common potential line 609.

After the wirings 616 and 618 are formed, the n-type semiconductor layer 610 is etched using the wirings as etching masks. The wirings 616 and 618 are formed separately over the semiconductor layer 608. The n-type semiconductor layer 610 between the wirings 616 and 618 is etched and removed, whereby a channel formation region of a TFT is formed.

Figure 36:
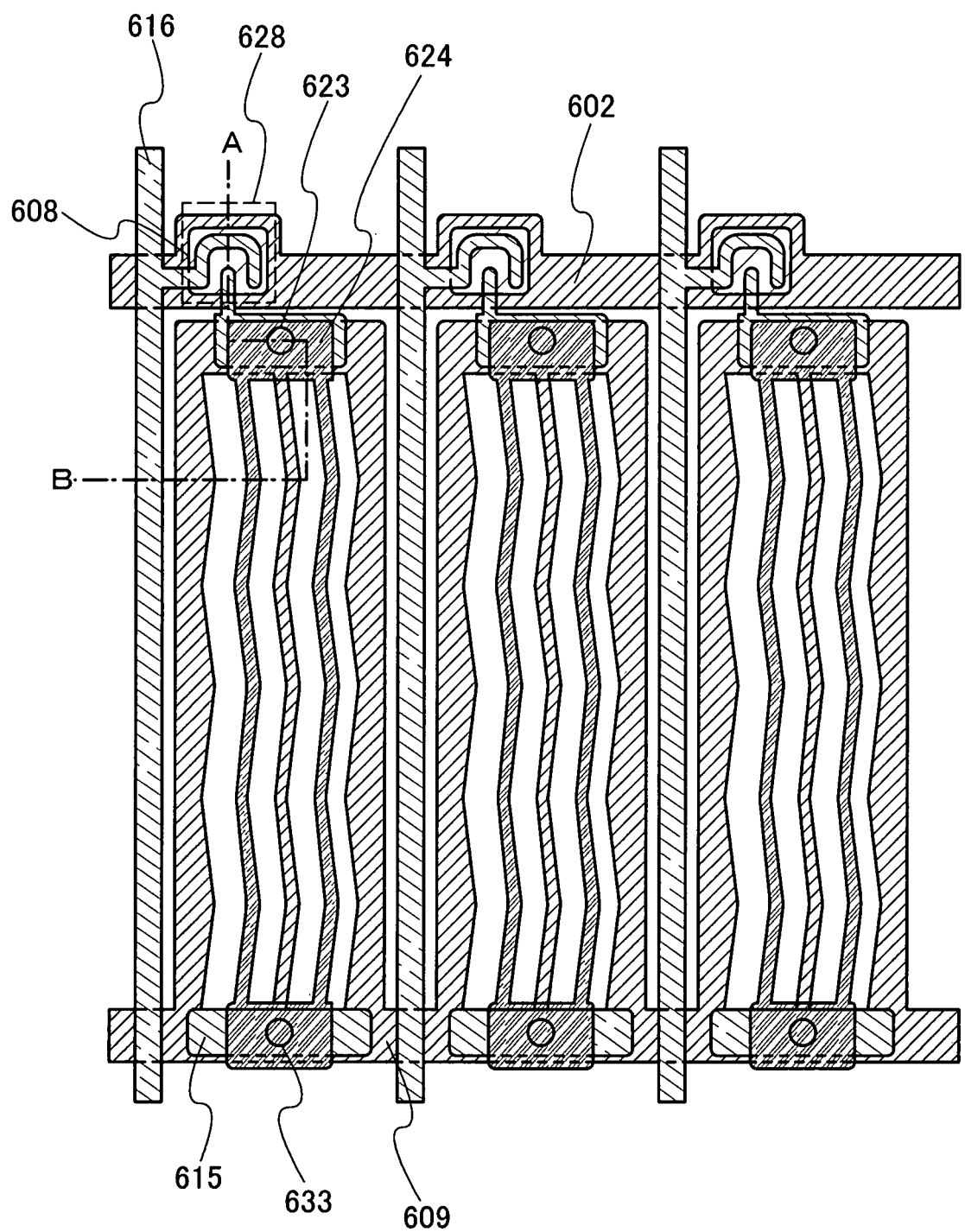
FIG. 36 illustrates a liquid crystal display device in accordance with Embodiment Mode 10.
Figure 37:
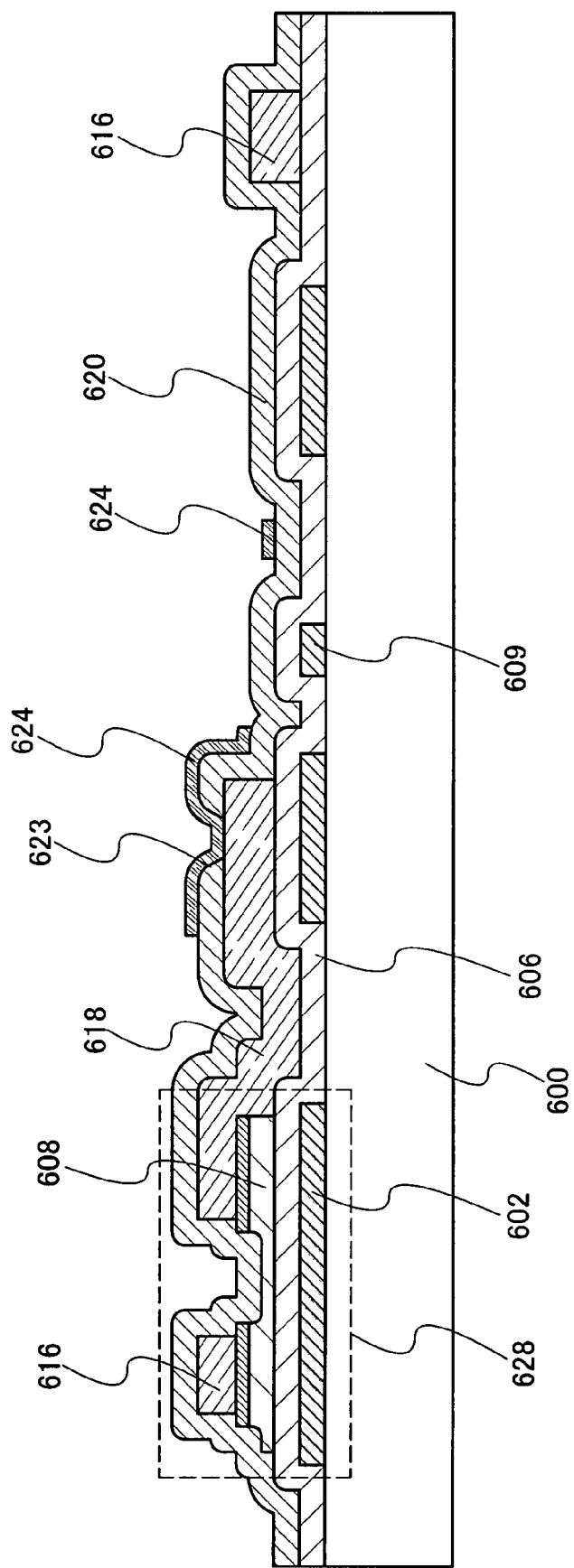
FIG. 37 illustrates a liquid crystal display device in accordance with Embodiment Mode 10.

FIGS. 36 and 37 show a phase where a pixel electrode is formed. Note that FIG. 36 is a plane view, and FIG. 37 shows a cross-sectional structure taken along a line A-B shown in FIG. 36. The following explanation will be made with reference to both the figures.

A second insulating layer 620 is formed over the wirings 616 and 618. The second insulating layer 620 is preferably formed with silicon nitride or silicon nitride oxide. A contact hole 623 is formed in the second insulating layer 620 to form a pixel electrode 624. The pixel electrode 624 is connected to the wiring 618 through the contact hole 623 that penetrates the second insulating layer 620. The pixel electrode 624 is formed using the composite material shown in Embodiment Mode 1. The pixel electrode 624 is provided with a slit 625. The slit 625 is provided to control orientation of liquid crystals. The pixel electrode 624 is formed so as to generate a transversal electric field with a comb-shaped electrode which is formed simultaneously with the common potential line 609. The comb-shaped portion of the pixel electrode 624 is formed so as to alternately mesh with the comb-shaped electrode which is simultaneously formed with the common potential line 609. By selection of the kind of the organic compound contained in the composite material, a composite material that does not have an absorption peak in a wavelength region of 450 to 800 nm can be obtained in the pixel electrode 624. This pixel electrode 624 can be formed with a thickness of 50 to 100 nm. Accordingly, illumination light of a backlight can effectively be used when the pixel electrode 624 is used as a pixel electrode of the liquid crystal panel.

When an electric field is generated between the potential applied to the pixel electrode 624 and the potential of the common potential line 609, the orientation of liquid crystals is controlled by this electric field. Liquid crystal molecules are horizontally rotated with the utilization of an electric field in a direction almost parallel to this substrate. In this case, since the liquid crystal molecules are horizontally oriented in any state, there are a few influences of contrast or the like depending on the angle in viewing; thus, the viewing angle is expanded.

In such a manner, a TFT 628 and the pixel electrode 624 connected to the TFT 628 are formed over the substrate 600. The first insulating layer 606 is provided between the common potential line 609 and the capacitor electrode 615 to form a storage capacitor. The capacitor electrode 615 and the pixel electrode 624 are connected to each other through the contact hole 633.

Figure 38:
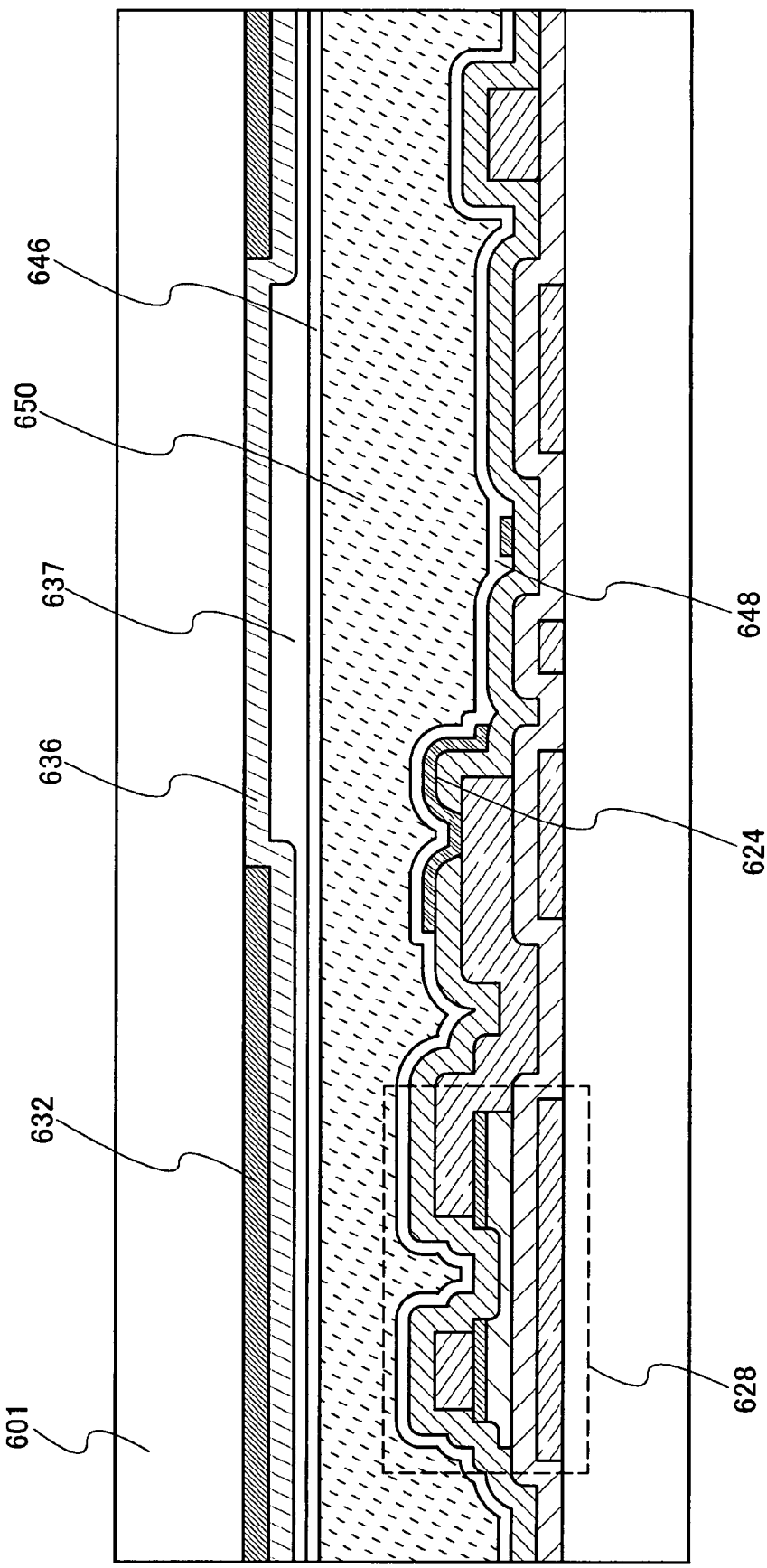
FIG. 38 illustrates a liquid crystal display device in accordance with Embodiment Mode 10.

FIG. 38 shows a state where the substrate 600, over which the TFT 628 and the pixel electrode 624 connected to the TFT 628 are formed, is overlapped with an opposite substrate 601, and liquid crystals are injected therebetween. The opposite substrate 601 is provided with a light-shielding layer 632, a second coloring layer 636, a planarizing film 637, and the like. Since a pixel electrode is formed on the side of the substrate 600, no pixel electrode is provided on the side of the opposite substrate 601. A liquid crystal layer 650 is formed between the substrate 600 and the opposite substrate 601.

In such a manner, the liquid crystal panel can be manufactured using the composite material, in which an organic compound and an inorganic compound are composed, for the pixel electrode. With the use of such a pixel electrode, there is no need to use a light-transmitting conductive film containing indium as its main component; thus, a bottleneck in raw material can be resolved.

Embodiment Mode 11

In this embodiment mode, an example of a liquid crystal display device in which a pixel electrode is formed with the composite material explained in Embodiment Mode 1 will be explained with reference to drawings. In this embodiment mode, an example of a TN-type liquid crystal will be shown.

Figure 39:
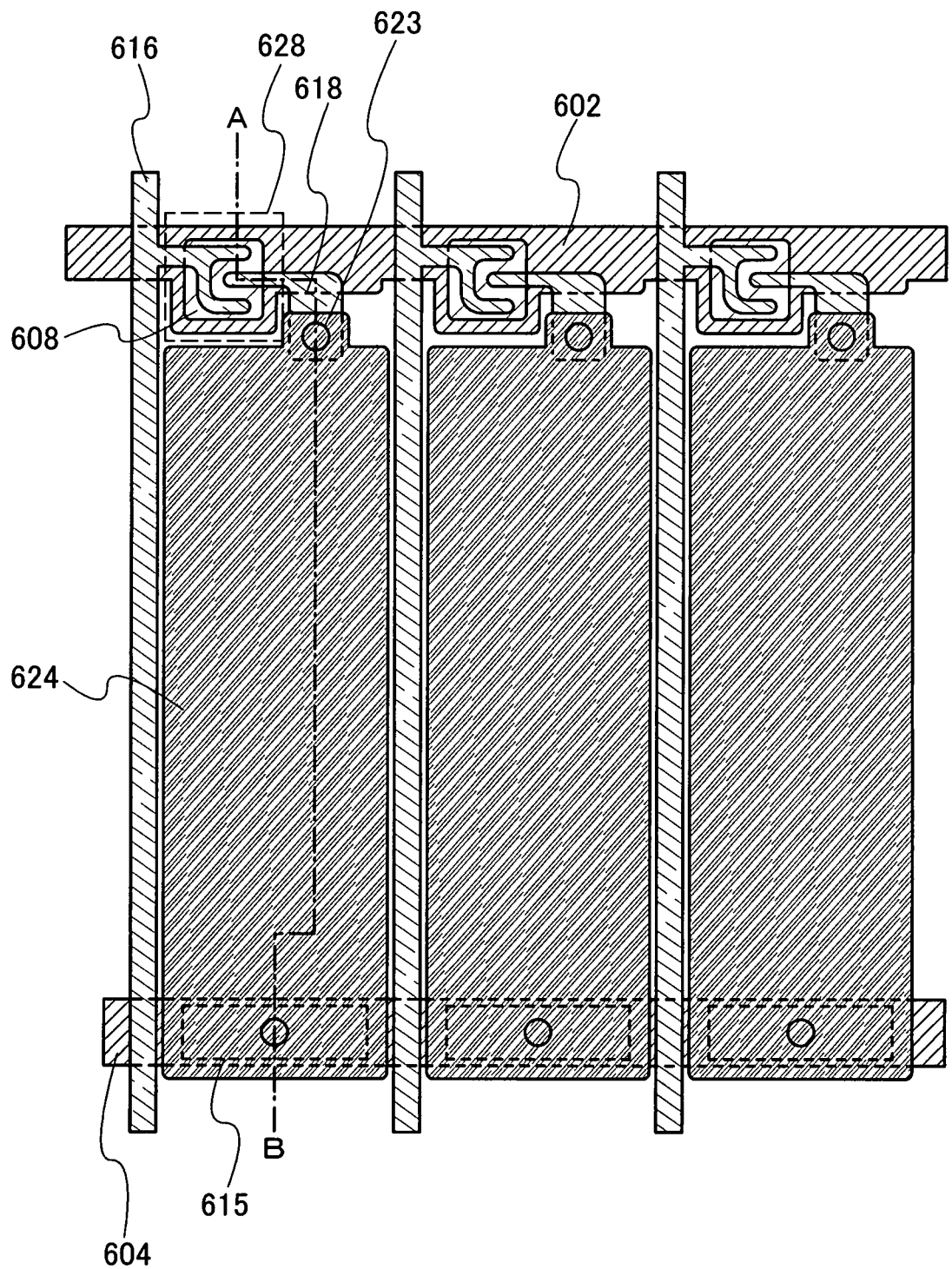
FIG. 39 illustrates a liquid crystal display device in accordance with Embodiment Mode 11.
Figure 40:
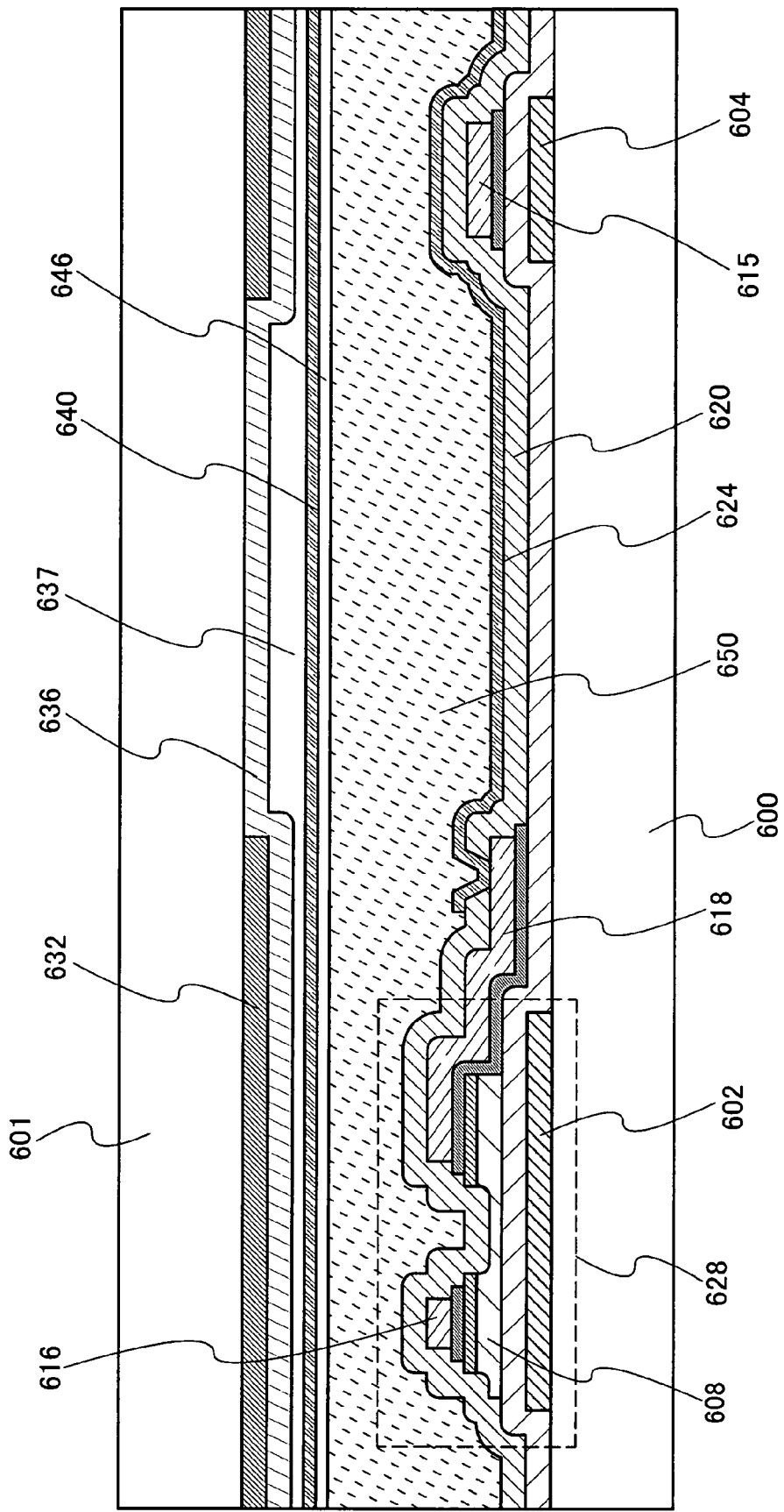
FIG. 40 illustrates a liquid crystal display device in accordance with Embodiment Mode 11.

FIGS. 39 and 40 show a pixel structure of a TN-type liquid crystal panel. FIG. 39 is a plane view, and FIG. 40 shows a cross-sectional structure taken along a line A-B shown in FIG. 39. The following explanation will be made with reference to both the figures. In addition, elements the same as those in Embodiment Mode 10 will be denoted by the same reference numerals and detailed explanation thereof will be omitted.

A pixel electrode 624 is connected to a TFT 628 through a wiring 618 by a contact hole 623. A wiring 616 serving as a data line is connected to the TFT 628.

The pixel electrode 624 is formed using the composite material shown in Embodiment Mode 1 in a similar manner to Embodiment Mode 7.

An opposite substrate 601 is provided with a light-shielding layer 632, a second coloring layer 636, and an opposite electrode 640. In addition, a planarizing film 637 is formed between the second coloring layer 636 and the opposite electrode 640 to prevent orientation disorder of liquid crystals. A liquid crystal layer 650 is formed between the pixel electrode 624 and the opposite electrode 640.

In such a manner, the liquid crystal panel can be manufactured using the composite material, in which an organic compound and an inorganic compound are composed, for the pixel electrode. With the use of such a pixel electrode, there is no need to use a light-transmitting conductive film containing indium as its main component; thus, a bottleneck in raw material can be resolved.

Embodiment Mode 12

Figure 41:
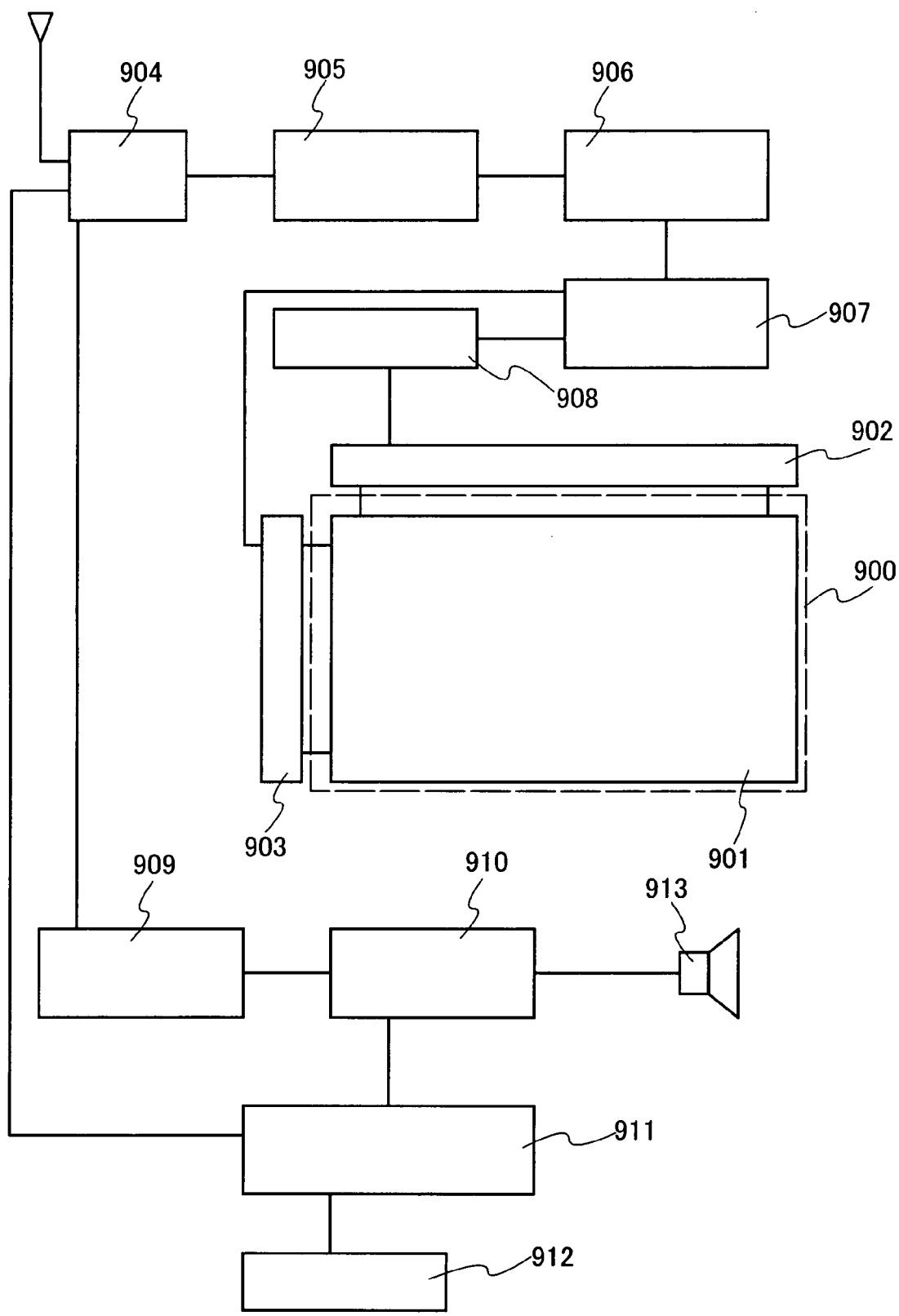
FIG. 41 illustrates a structure of a television unit in accordance with Embodiment Mode 12.

A television unit can be completed by a display panel manufactured by Embodiment Modes 1 to 11. FIG. 41 shows a block diagram showing a main structure of the television unit. A pixel portion 901 is formed over a display panel 900. A signal line driver circuit 902 and a scanning line driver circuit 903 may be mounted on the display panel 900 by a COG method.

As another external circuit, a video signal amplifier circuit 905 which amplifies a video signal among signals received by a tuner 904, a video signal processing circuit 906 which converts the signals outputted from the video signal amplifier circuit 905 into chrominance signals corresponding to respective colors of red, green, and blue, a control circuit 907 which converts the video signal into an input specification of the driver IC, and the like are provided on an input side of the video signal. The control circuit 907 outputs signals to both a scanning line side and a signal line side. In a case of digital driving, a signal dividing circuit 908 may be provided on the signal line side and an input digital signal may be divided into m pieces to be supplied.

An audio signal among signals received by the tuner 904 is sent to an audio signal amplifier circuit 909 and is supplied to a speaker 913 through an audio signal processing circuit 910. A control circuit 911 receives control information of a receiving station (reception frequency) or sound volume from an input portion 912 and transmits signals to the tuner 904 and the audio signal processing circuit 910.

Figure 42:
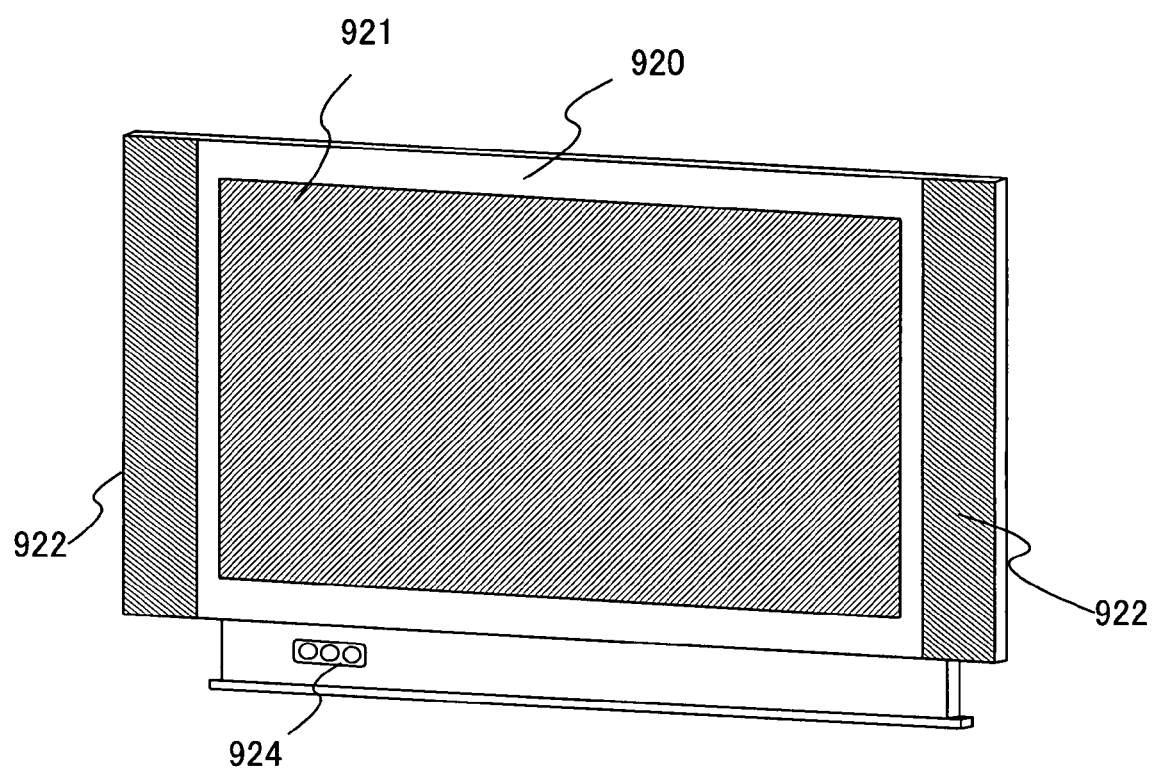
FIG. 42 illustrates a structure of a television unit in accordance with Embodiment Mode 12.

FIG. 42 shows the television unit manufactured by mounting of such an external circuit. The display panel 900 and the like are incorporated into a housing 920 so as to complete the television unit. A display screen 921 is formed using the display panel 900, and a speaker 922, operation switches 924, and the like are provided as other attachment systems. In such a manner, the television unit can be completed by the present invention.

It is needless to say that the present invention is not limited to the television unit, and can be applied to various uses as a large-area display medium such as an information display board at a train station, an airport, or the like, or an advertisement display board on the street, as well as a monitor of a personal computer. In accordance with this embodiment mode, the display panel can be manufactured using the composite material, in which an organic compound and an inorganic compound are composed, for the pixel electrode. With the use of such a pixel electrode, there is no need to use a light-transmitting conductive film containing indium as its main component; thus, a bottleneck in raw material can be resolved. Accordingly, the present invention can manufacture the television unit depending on demand for the display panel.

Embodiment Mode 13

In this embodiment mode, an example of a cellular phone using the display modules manufactured by Embodiment Modes 1 to 11 will be explained with reference to FIGS. 43 and 44.

Figure 43:
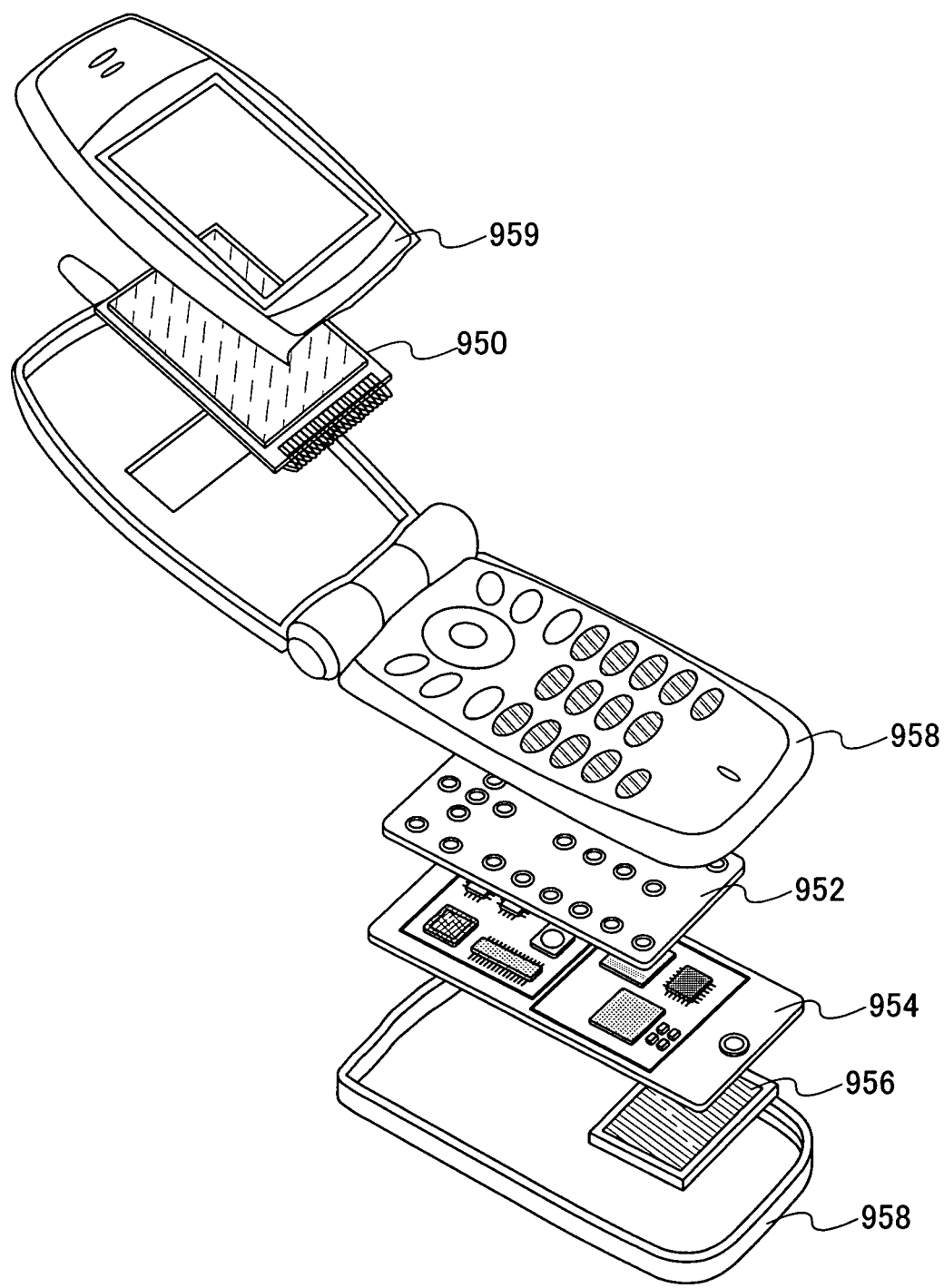
FIG. 43 illustrates a structure of a cellular phone device in accordance with Embodiment Mode 13.

FIG. 43 is a view showing an assembly of a cellular phone. The cellular phone has a module 950, a key input switch 952, a circuit substrate 954, a secondary battery 956, and the like that are placed in a housing 958. As shown in FIG. 43, cutting is performed to a housing 959 in accordance with a position of a display portion in placing the module 950. In addition, an IC chip or a sensor chip is mounted on the module 950.

Figure 44:
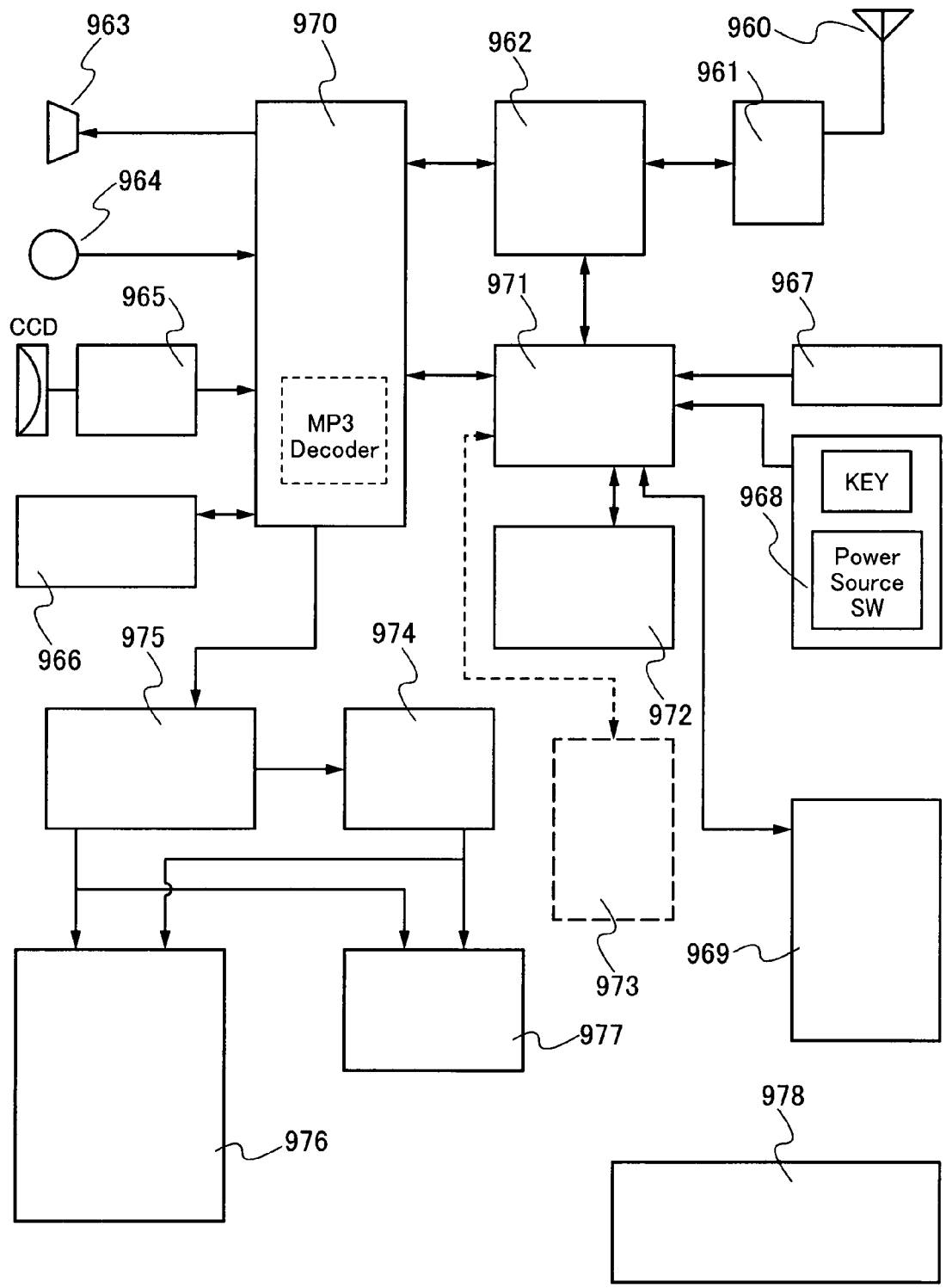
FIG. 44 illustrates a structure of a cellular phone device in accordance with Embodiment Mode 13.

An example of a structure of such a cellular phone is shown in FIG. 44. An antenna 960, a high frequency circuit 961, a base band processor 962, and the like include a communication circuit, a modulation circuit, a demodulation circuit, or the like for performing wireless communication of 700 to 900 MHz, and 1.7 to 2.5 GHz. An audio and image processing processor 970 communicates with a CPU 971 to transmit a video signal or the like to a controller 975, and in addition, controls a power supply circuit 974, outputs audio to a speaker 963, inputs audio from a microphone 964, processes image data transmitted from a CCD module 965, and the like. This image data may be stored in a memory card via an auxiliary memory input interface 966. The controller 975 transmits signals to a display panel 976 and a display panel 977 and also switches a display.

The CPU 971 receives a signal from a light sensor 967 which detects outside light intensity and a key input switch 968 and controls the audio and image processing processor 970. In addition, the CPU controls communication which uses a local area network via a communication interface 969. A memory 972 is provided to store information such as a phone number or sent/received e-mail. A memory medium 973 such as a hard disk may be added in order to further increase storage capacity. A power supply circuit 978 supplies power to these systems.

Note that FIG. 43 shows an example of an external appearance shape of the cellular phone, and the cellular phone relating to this embodiment mode can be modified in various modes in accordance with its function or use application.

Although a cellular phone device is exemplified in this embodiment mode as described above, the present invention is not limited thereto, and various electronic devices provided with a module such as a computer and a video camera can be realized. For example, an electronic book, a portable information terminal (such as PDA (personal digital assistant)), a portable video game machine, a home video game machine, a navigation system, and the like are given. In accordance with this embodiment mode, the display panel can be manufactured using the composite material, in which an organic compound and an inorganic compound are composed, for a pixel electrode. With the use of such a pixel electrode, there is no need to use a light-transmitting conductive film containing indium as its main component; thus, a bottleneck in raw material can be resolved. Accordingly, the television unit can be manufactured depending on demand for the display panel. (Addition)

As described above, the following structures are included in the present invention as explained in Embodiment Modes 1 to 13.

A display device in which a pixel is provided with a light-transmitting conductive film containing a hole-transporting organic compound and a metal oxide which shows an electron accepting property with respect to the hole-transporting organic compound.

A display device including a pixel electrode formed with a light-transmitting conductive film containing a hole-transporting organic compound and a metal oxide which shows an electron accepting property with respect to the hole-transporting organic compound.

A display device including a light-transmitting conductive film in contact with an insulating surface at an aperture of a pixel which transmits light. The light-transmitting conductive film contains a hole-transporting organic compound and a metal oxide which shows an electron accepting property with respect to the hole-transporting organic compound.

A display device including a transistor in which a gate is connected to a scanning line and a source or a drain is connected to a signal line, an insulating layer formed over the transistor, and a light-transmitting conductive film in contact with the insulating layer. The light-transmitting conductive film contains a hole-transporting organic compound and a metal oxide which shows an electron accepting property with respect to the hole-transporting organic compound.

A display device including a light-transmitting conductive film which contains a hole-transporting organic compound and a metal oxide which shows an electron accepting property with respect to the hole-transporting organic compound and which does not have an absorption peak in a wavelength region of 450 to 800 nm. The light-transmitting conductive film is provided for a pixel.

A display device including a pixel electrode formed with a light-transmitting conductive film which contains a hole-transporting organic compound and a metal oxide which shows an electron accepting property with respect to the hole-transporting organic compound and which does not have an absorption peak in a wavelength region of 450 to 800 nm.

A display device including a light-transmitting conductive film in contact with an insulating surface at an aperture of a pixel which transmits light. The light-transmitting conductive film is a composite material which contains a hole-transporting organic compound and a metal oxide which shows an electron accepting property with respect to the hole-transporting organic compound and which does not have an absorption peak in a wavelength region of 450 to 800 nm.

A display device including a transistor in which a gate is connected to a scanning line and a source or a drain is connected to a signal line, an insulating layer formed over the transistor, and a light-transmitting conductive film in contact with the insulating layer. The light-transmitting conductive film is a composite material which contains a hole-transporting organic compound and a metal oxide which shows an electron accepting property with respect to the hole-transporting organic compound and which does not have an absorption peak in a wavelength region of 450 to 800 nm.

A case is included where the hole-transporting organic compound has hole mobility of greater than or equal to $1 \times 10^{-6}$ cm$^2$/Vs. A case is included where the hole-transporting organic compound includes an aromatic amine compound, a carbazole derivative, aromatic hydrocarbon, or a high molecular compound.

The aromatic amine compound may be one or more kinds selected from N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N-(3-methylphenyl)-N-phenylamino]phenyl}-N-phenylamino)biphenyl (abbreviation: DNTPD); or 1,3,5-tris[N-(4-diphenylaminophenyl)-N-phenylamino]benzene (abbreviation: DPA3B).

The carbazole derivative may be one or more kinds selected from 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphtyl)-N-(9-phenylcarbazol-3-yl)amino]-9-phenylcarbazole (abbreviation: PCzPCN1); 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); or 2,3,5,6-triphenyl-1,4-bis[4-(N-carbazolyl)phenyl]benzene.

The aromatic hydrocarbon may be one or more kinds selected from 9,10-di(naphthalen-2-yl)-2-tert-butylanthracene (abbreviation: t-BuDNA); 9,10-di(naphthalen-1-yl)-2-tert-butylanthracene; 9,10-bis(3,5-diphenylphenyl)anthracene (abbreviation: DPPA); 9,10-di(4-phenylphenyl)-2-tert-butylanthracene (abbreviation: t-BuDBA); 9,10-di(naphthalen-2-yl)anthracene (abbreviation: DNA); 9,10-diphenylanthracene (abbreviation: DPAnth); 2-tert-butylanthracene (abbreviation: t-BuAnth); 9,10-di(4-methylnaphthalen-1-yl)anthracene (abbreviation: DMNA); 2-tert-butyl-9,10-bis[2-(naphthalen-1-yl)phenyl]anthracene; 9,10-bis[2-(naphthalen-1-yl)phenyl]anthracene; 2,3,6,7-tetramethyl-9,10-di(naphthalen-1-yl)anthracene; 2,3,6,7-tetramethyl-9,10-di(naphthalen-2-yl)anthracene; 9,9'-bianthryl; 10,10'-diphenyl-9,9'-bianthryl; 10,10'-di(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; 4,4'-bis(2,2-diphenylvinyl)biphenyl (abbreviation: DPVBi); or 9,10-bis[4-(2,2-diphenylvinyl)phenyl]anthracene (abbreviation: DPVPA).

The high molecular compound may be one or more kinds selected from poly{4-[N-(4-diphenylaminophenyl)-N-phenyl]aminostyrene} (abbreviation: PStDPA); poly{4-[N-(9-carbazol-3-yl)-N-phenylamino]styrene} (abbreviation: PStPCA); poly(N-vinylcarbazole) (abbreviation: PVK); or poly(4-vinyltriphenylamine) (abbreviation: PVTPA).

The inorganic compound may be a transition metal oxide. The inorganic compound is an oxide of a metal belonging to Groups 4 to 8 in the periodic table. A case is included where the inorganic compound is one or more kinds selected from vanadium oxide, niobium oxide, tantalum oxide, chromium oxide, molybdenum oxide, tungsten oxide, manganese oxide, or rhenium oxide.

The present application is based on Japanese Patent Application serial No. 2006-184495 filed on Jul. 4, 2006 in Japan Patent Office, the entire contents of which are hereby incorporated by reference.

What is claimed is:
1. A device comprising:
a partition layer directly over and in contact with an insulating surface, the partition layer has an opening portion in which part of the insulating surface is exposed;
an anode of a pixel comprising a light-transmitting conductive film, wherein the anode is directly over and in contact with a part of the partition layer and directly over and in contact with the part of the insulating surface; and an electroluminescence layer directly over and in contact with the anode, wherein an edge portion of the anode is covered by and directly in contact with the electroluminescence layer, wherein the light-transmitting conductive film contains a hole-transporting organic compound and molybdenum oxide which shows electron acceptability with respect to the hole-transporting organic compound, wherein the electroluminescence layer comprises at least a light-emitting layer, and wherein the hole-transporting organic compound and the molybdenum oxide are in a mixed state in the light-transmitting conductive film.

2. The device according to claim 1, wherein the light-transmitting conductive film does not have an absorption peak in a wavelength region of greater than or equal to 450 nm and less than or equal to 800 nm.

3. The device according to claim 1, wherein the hole-transporting organic compound has hole mobility of greater than or equal to $1 \times 10^{-6}$ cm$^2$/Vs.

4. The device according to claim 1, wherein the hole-transporting organic compound is an aromatic amine compound, a carbazole derivative, an aromatic hydrocarbon, or a high molecular compound.

5. The device according to claim 4, wherein the aromatic amine compound is one or more kinds selected from N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N-(3-methylphenyl)-N-phenylamino]phenyl}-N-phenylamino)biphenyl (abbreviation: DNTPD); or 1,3,5-tris[N-(4-diphenylaminophenyl)-N-phenylamino]benzene (abbreviation: DPA3B).

6. The device according to claim 4, wherein the carbazole derivative is one or more kinds selected from 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphtyl)-N-(9-phenylcarbazol-3-yl)amino]-9-phenylcarbazole (abbreviation: PCzPCN1); 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); or 2,3,5,6-triphenyl-1,4-bis[4-(N-carbazolyl)phenyl]benzene.

7. The device according to claim 4, wherein the aromatic hydrocarbon is one or more kinds selected from 9,10-di(naphthalen-2-yl)-2-tert-butylanthracene (abbreviation: t-BuDNA); 9,10-di(naphthalen-1-yl)-2-tert-butylanthracene; 9,10-bis(3,5-diphenylphenyl)anthracene (abbreviation: DPPA); 9,10-di(4-phenylphenyl)-2-tert-butylanthracene (abbreviation: t-BuDBA); 9,10-di(naphthalen-2-yl)anthracene (abbreviation: DNA); 9,10-diphenylanthracene (abbreviation: DPAnth); 2-tert-butylanthracene (abbreviation: t-BuAnth); 9,10-di(4-methylnaphthalen-1-yl)anthracene (abbreviation: DMNA); 2-tert-butyl-9,10-bis[2-(naphthalen-1-yl)phenyl]anthracene; 9,10-bis[2-(naphthalen-1-yl)phenyl]anthracene; 2,3,6,7-tetramethyl-9,10-di(naphthalen-1-yl)anthracene; 2,3,6,7-tetramethyl-9,10-di(naphthalen-2-yl)anthracene; 9,9'-bianthryl; 10,10'-diphenyl-9,9'-bianthryl; 10,10'-di(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; 4,4'-bis(2,2-diphenylvinyl)biphenyl (abbreviation: DPVBi); or 9,10-bis[4-(2,2-diphenylvinyl)phenyl]anthracene (abbreviation: DPVPA).

8. The device according to claim 4, wherein the high molecular compound is one or more kinds selected from poly{4-[N-(4-diphenylaminophenyl)-N-phenyl]aminostyrene} (abbreviation: PStDPA); poly{4-[N-(9-carbazol-3-yl)-N-phenylamino]styrene} (abbreviation: PStPCA); poly(N-vinylcarbazole) (abbreviation: PVK); or poly(4-vinyltriphenylamine) (abbreviation: PVTPA).

9. A device comprising:

a transistor having a gate electrode, a source region and a drain region;

a scanning line electrically connected to the gate electrode;

a signal line electrically connected to any one of the source region and the drain region;

an insulating film over the transistor;

a partition layer directly over and in contact with the insulating film, the partition layer has an opening portion in which part of the insulating film is exposed;

an anode of a pixel comprising a light-transmitting conductive film directly over and in contact with the part of the insulating film and directly over and in contact with a part of the partition layer; and an electroluminescence layer directly over and in contact with the anode, wherein an edge portion of the anode is covered by and directly in contact with the electroluminescence layer, wherein the light-transmitting conductive film contains a hole-transporting organic compound and molybdenum oxide which shows electron acceptability with respect to the hole-transporting organic compound, wherein the electroluminescence layer comprises at least a light-emitting layer, and wherein the hole-transporting organic compound and the molybdenum oxide are in a mixed state in the light-transmitting conductive film.

10. The device according to claim 9, wherein the light-transmitting conductive film does not have an absorption peak in a wavelength region of greater than or equal to 450 nm and less than or equal to 800 nm.

11. The device according to claim 9, wherein the hole-transporting organic compound has hole mobility of greater than or equal to $1 \times 10^{-6}$ cm$^2$/Vs.

12. The device according to claim 9, wherein the hole-transporting organic compound is an aromatic amine compound, a carbazole derivative, an aromatic hydrocarbon, or a high molecular compound.

13. The device according to claim 12, wherein the aromatic amine compound is one or more kinds selected from N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N-(3-methylphenyl)-N-phenylamino]phenyl}-N-phenylamino)biphenyl (abbreviation: DNTPD); or 1,3,5-tris[N-(4-diphenylaminophenyl)-N-phenylamino]benzene (abbreviation: DPA3B).

14. The device according to claim 12, wherein the carbazole derivative is one or more kinds selected from 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1- naphtyl)-N-(9-phenylcarbazol-3-yl)amino]-9-phenyl-carbazole (abbreviation: PCzPCN1); 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); or 2,3,5,6-triphenyl-1,4-bis[4-(N-carbazolyl)phenyl]benzene.

15. The device according to claim 12, wherein the aromatic hydrocarbon is one or more kinds selected from 9,10-di(naphthalen-2-yl)-2-tert-butylanthracene (abbreviation: t-BuDNA); 9,10-di(naphthalen-1-yl)-2-tert-butylanthracene; 9,10-bis(3,5-diphenylphenyl)anthracene (abbreviation: DPPA); 9,10-di(4-phenylphenyl)-2-tert-butylanthracene (abbreviation: t-BuDBA); 9,10-di(naphthalen-2-yl)anthracene (abbreviation: DNA); 9,10-diphenylanthracene (abbreviation: DPAnth); 2-tert-butylanthracene (abbreviation: t-BuAnth); 9,10-di(4-methylnaphthalen-1-yl)anthracene (abbreviation: DMNA); 2-tert-butyl-9,10-bis[2-(naphthalen-1-yl)phenyl]anthracene; 9,10-bis[2-(naphthalen-1-yl)phenyl]anthracene; 2,3,6,7-tetramethyl-9,10-di(naphthalen-1-yl)anthracene; 2,3,6,7-tetramethyl-9,10-di(naphthalen-2-yl)anthracene; 9,9'-bianthryl; 10,10'-diphenyl-9,9'-bianthryl; 10,10'-di(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; 4,4'-bis(2,2-diphenylvinyl)biphenyl (abbreviation: DPVBi); or 9,10-bis[4-(2,2-diphenylvinyl)phenyl]anthracene (abbreviation: DPVPA).

16. The device according to claim 12, wherein the high molecular compound is one or more kinds selected from poly{4-[N-(4-diphenylaminophenyl)-N-phenyl]aminostyrene} (abbreviation: PStDPA); poly{4-[N-(9-carbazol-3-yl)-N-phenylamino]styrene} (abbreviation: PStPCA); poly(N-vinylcarbazole) (abbreviation: PVK); or poly(4-vinyltriphenylamine) (abbreviation: PVTPA).

17. A device comprising:
a partition layer directly over and in contact with an insulating surface, the partition layer has an opening portion in which part of the insulating surface is exposed;
an anode of a pixel comprising a light-transmitting conductive film, wherein the anode is directly over and in contact with the part of the insulating surface and directly over and in contact with a part of the partition layer;
an electroluminescence layer comprising at least a light emitting layer over and in contact with the light-transmitting conductive film; and
an electrode over and in contact with the electroluminescence layer,
wherein an edge portion of the anode is covered by and directly in contact with the electroluminescence layer,
wherein the light-transmitting conductive film contains a hole-transporting organic compound and molybdenum oxide which shows electron acceptability with respect to the hole-transporting organic compound, and
wherein the hole-transporting organic compound and the molybdenum oxide are in a mixed state in the light-transmitting conductive film.

18. The device according to claim 17, wherein the light-transmitting conductive film does not have an absorption peak in a wavelength region of greater than or equal to 450 nm and less than or equal to 800 nm.

19. The device according to claim 17, wherein the hole-transporting organic compound has hole mobility of greater than or equal to $1\times10^{-6}$ cm$^2$/Vs.

20. The device according to claim 17, wherein the hole-transporting organic compound is an aromatic amine compound, a carbazole derivative, an aromatic hydrocarbon, or a high molecular compound.

21. The device according to claim 20, wherein the aromatic amine compound is one or more kinds selected from N,N'-di(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N-(3-methylphenyl)-N-phenylamino]phenyl}-N-phenylamino)biphenyl (abbreviation: DNTPD); or 1,3,5-tris[N-(4-diphenylaminophenyl)-N-phenylamino]benzene (abbreviation: DPA3B).

22. The device according to claim 20, wherein the carbazole derivative is one or more kinds selected from 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphtyl)-N-(9-phenylcarbazol-3-yl)amino]-9-phenylcarbazole (abbreviation: PCzPCN1); 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); or 2,3,5,6-triphenyl-1,4-bis[4-(N-carbazolyl)phenyl]benzene.

23. The device according to claim 20, wherein the aromatic hydrocarbon is one or more kinds selected from 9,10-di(naphthalen-2-yl)-2-tert-butylanthracene (abbreviation: t-BuDNA); 9,10-di(naphthalen-1-yl)-2-tert-butylanthracene; 9,10-bis(3,5-diphenylphenyl)anthracene (abbreviation: DPPA); 9,10-di(4-phenylphenyl)-2-tert-butylanthracene (abbreviation: t-BuDBA); 9,10-di(naphthalen-2-yl)anthracene (abbreviation: DNA); 9,10-diphenylanthracene (abbreviation: DPAnth); 2-tert-butylanthracene (abbreviation: t-BuAnth); 9,10-di(4-methylnaphthalen-1-yl)anthracene (abbreviation: DMNA); 2-tert-butyl-9,10-bis[2-(naphthalen-1-yl)phenyl]anthracene; 9,10-bis[2-(naphthalen-1-yl)phenyl]anthracene; 2,3,6,7-tetramethyl-9,10-di(naphthalen-1-yl)anthracene; 2,3,6,7-tetramethyl-9,10-di(naphthalen-2-yl)anthracene; 9,9'-bianthryl; 10,10'-diphenyl-9,9'-bianthryl; 10,10'-di(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; 4,4'-bis(2,2-diphenylvinyl)biphenyl (abbreviation: DPVBi); or 9,10-bis[4-(2,2-diphenylvinyl)phenyl]anthracene (abbreviation: DPVPA).

24. The device according to claim 20, wherein the high molecular compound is one or more kinds selected from poly{4-[N-(4-diphenylaminophenyl)-N-phenyl]aminostyrene} (abbreviation: PStDPA); poly{4-[N-(9-carbazol-3-yl)-N-phenylamino]styrene} (abbreviation: PStPCA); poly(N-vinylcarbazole) (abbreviation: PVK); or poly(4-vinyltriphenylamine) (abbreviation: PVTPA).

25. The device according to claim 17, wherein the electroluminescence layer further comprises:
a first carrier injecting layer between the light-transmitting conductive film and the light emitting layer;
a first carrier transporting layer between the first carrier injecting layer and the light emitting layer;

a second carrier injecting layer between the electrode and the light emitting layer; and a second carrier transporting layer between the second carrier injecting layer and the light emitting layer.

26. The device according to claim 25, wherein the first carrier injecting layer is a hole injecting layer, wherein the first carrier transporting layer is a hole transporting layer, wherein the second carrier injecting layer is an electron injecting layer, and wherein the second carrier transporting layer is an electron transporting layer.

27. The device according to claim 1, wherein the light-transmitting conductive film has a resistivity of $5\times10^4$ to $1\times10^6 \Omega\cdot cm$.

28. The device according to claim 9, wherein the light-transmitting conductive film has a resistivity of $5\times10^4$ to $1\times10^6 \Omega\cdot cm$.

29. The device according to claim 17, wherein the light-transmitting conductive film has a resistivity of $5\times10^4$ to $1\times10^6 \Omega\cdot cm$.

* * * * *